(12) United States Patent
King

(10) Patent No.: US 7,254,050 B2
(45) Date of Patent: *Aug. 7, 2007

(54) METHOD OF MAKING ADAPTIVE NEGATIVE DIFFERENTIAL RESISTANCE DEVICE

(75) Inventor: Tsu-Jae King, Fremont, CA (US)

(73) Assignee: Synopsys, Inc., Mountain View, CA (US)

( * ) Notice: Subject to any disclaimer, the term of this patent is extended or adjusted under 35 U.S.C. 154(b) by 379 days.

This patent is subject to a terminal disclaimer.

(21) Appl. No.: 10/979,469

(22) Filed: Nov. 1, 2004

(65) Prior Publication Data

US 2005/0064645 A1    Mar. 24, 2005

Related U.S. Application Data

(60) Division of application No. 10/321,090, filed on Dec. 17, 2002, now Pat. No. 6,812,084, which is a continuation-in-part of application No. 10/314,735, filed on Dec. 9, 2002, now Pat. No. 6,980,467, which is a continuation-in-part of application No. 10/314,785, filed on Dec. 9, 2002, now Pat. No. 6,979,580, which is a continuation-in-part of application No. 10/314,510, filed on Dec. 9, 2002, now Pat. No. 6,849,483.

(51) Int. Cl.
*G11C 5/06* (2006.01)
(52) U.S. Cl. ........................................ 365/71; 365/148
(58) Field of Classification Search ............ 365/71, 365/148, 175; 257/369, 133, 107
See application file for complete search history.

(56) References Cited

U.S. PATENT DOCUMENTS 3,588,736 A    6/1971    McGroddy 3,903,542 A    9/1975    Nathanson et al.
3,974,486 A    8/1976    Curtis et al.
4,047,974 A    9/1977    Harari (Continued)

FOREIGN PATENT DOCUMENTS

EP    0747940 A2    12/1996

(Continued)

OTHER PUBLICATIONS

Barlow, P. S. et al., "Negative differential output conductance of self-heated power MOSFETs," IEE Proceedings-I Solid-State and Electron Devices, vol. 133, Part I, No. 5, Oct. 1986, pp. 177-179.

(Continued)

*Primary Examiner*—Vu A. Te
(74) *Attorney, Agent, or Firm*—Bever, Hoffman & Harms, LLP; Jeanette S. Harms

(57) ABSTRACT

A method of controlling a negative differential resistance (NDR) element is disclosed, which includes altering various NDR characteristics during operation to effectuate different NDR modes. By changing biasing conditions applied to the NDR element (such as a silicon based NDR FET) a peak-to-valley ratio (PVR) (or some other characteristic) can be modified dynamically to accommodate a desired operational change in a circuit that uses the NDR element. In a memory or logic application, for example, a valley current can be reduced during quiescent periods to reduce operating power. Thus an adaptive NDR element can be utilized advantageously within a conventional semiconductor circuit.

12 Claims, 28 Drawing Sheets

U.S. PATENT DOCUMENTS

| | | | |
|---|---|---|---|
| 4,143,393 A | 3/1979 | DiMaria et al. | |
| 4,644,386 A | 2/1987 | Nishizawa et al. | |
| 4,806,998 A | 2/1989 | Vinter et al. | |
| 4,945,393 A | 7/1990 | Beltram et al. | |
| 5,021,841 A | 6/1991 | Leburton et al. | |
| 5,023,836 A | 6/1991 | Mori | |
| 5,032,891 A | 7/1991 | Takagi et al. | |
| 5,084,743 A | 1/1992 | Mishra et al. | |
| 5,093,699 A | 3/1992 | Weichold et al. | |
| 5,130,763 A | 7/1992 | Delhaye et al. | |
| 5,162,880 A | 11/1992 | Hazama et al. | |
| 5,189,499 A | 2/1993 | Izumi et al. | |
| 5,357,134 A | 10/1994 | Shimoji | |
| 5,390,145 A | 2/1995 | Nakasha et al. | |
| 5,442,194 A | 8/1995 | Moise | |
| 5,448,513 A | 9/1995 | Hu et al. | |
| 5,455,432 A | 10/1995 | Hartsell et al. | |
| 5,463,234 A | 10/1995 | Toriumi et al. | |
| 5,477,169 A | 12/1995 | Shen et al. | |
| 5,523,603 A | 6/1996 | Fishbein et al. | |
| 5,543,652 A | 8/1996 | Ikeda et al. | |
| 5,552,622 A | 9/1996 | Kimura | |
| 5,606,177 A | 2/1997 | Wallace et al. | |
| 5,633,178 A | 5/1997 | Kalnitsky | |
| 5,689,458 A | 11/1997 | Kuriyama | |
| 5,698,997 A | 12/1997 | Williamson, III et al. | |
| 5,705,827 A | 1/1998 | Baba et al. | |
| 5,732,014 A | 3/1998 | Forbes | |
| 5,761,114 A | 6/1998 | Bertin et al. | |
| 5,770,958 A | 6/1998 | Arai et al. | |
| 5,773,996 A | 6/1998 | Takao | |
| 5,798,965 A | 8/1998 | Jun | |
| 5,804,475 A | 9/1998 | Meyer et al. | |
| 5,843,812 A | 12/1998 | Hwang | |
| 5,869,845 A | 2/1999 | Van der Wagt et al. | |
| 5,883,549 A | 3/1999 | De Los Santos | |
| 5,883,829 A | 3/1999 | Van der Wagt | |
| 5,895,934 A | 4/1999 | Harvey et al. | |
| 5,903,170 A | 5/1999 | Kulkarni et al. | |
| 5,907,159 A | 5/1999 | Roh et al. | |
| 5,936,265 A | 8/1999 | Koga | |
| 5,945,706 A | 8/1999 | Jun | |
| 5,953,249 A | 9/1999 | Van der Wagt | |
| 5,959,328 A | 9/1999 | Krautschneider et al. | |
| 5,962,864 A | 10/1999 | Leadbeater et al. | |
| 6,015,739 A | 1/2000 | Gardner et al. | |
| 6,015,978 A | 1/2000 | Yuki et al. | |
| 6,075,265 A | 6/2000 | Goebel et al. | |
| 6,077,760 A | 6/2000 | Fang et al. | |
| 6,084,796 A | 7/2000 | Kozicki et al. | |
| 6,091,077 A | 7/2000 | Morita et al. | |
| 6,097,036 A | 8/2000 | Teshima et al. | |
| 6,104,631 A | 8/2000 | El-Sharawy et al. | |
| 6,128,216 A | 10/2000 | Noble, Jr. et al. | |
| 6,130,559 A | 10/2000 | Balsara et al. | |
| 6,150,242 A | 11/2000 | Van der Wagt et al. | |
| 6,184,539 B1 | 2/2001 | Wu et al. | |
| 6,205,054 B1 | 3/2001 | Inami | |
| 6,222,766 B1 | 4/2001 | Sasaki et al. | |
| 6,225,165 B1 | 5/2001 | Noble, Jr. et al. | |
| 6,246,606 B1 | 6/2001 | Forbes et al. | |
| 6,261,896 B1 | 7/2001 | Jun | |
| 6,294,412 B1 | 9/2001 | Krivokapic | |
| 6,301,147 B1 | 10/2001 | El-Sharawy et al. | |
| 6,303,942 B1 | 10/2001 | Farmer | |
| 6,310,799 B2 | 10/2001 | Duane et al. | |
| 6,353,251 B1 | 3/2002 | Kimura | |
| 6,396,731 B1 | 5/2002 | Chou | |
| 6,404,018 B1 | 6/2002 | Wu et al. | |
| 6,424,174 B1 | 7/2002 | Nowak et al. | |
| 6,448,161 B1 | 9/2002 | Krivokapic | |
| 6,490,193 B1 | 12/2002 | van der Wagt et al. | |
| 6,777,982 B2 * | 8/2004 | Goldstein et al. | 326/134 |
| 6,812,084 B2 | 11/2004 | King | |
| 2001/0005327 A1 | 6/2001 | Duane et al. | |
| 2001/0013621 A1 | 8/2001 | Nakazato | |
| 2001/0019137 A1 | 9/2001 | Koga et al. | |
| 2001/0024841 A1 | 9/2001 | Noble, Jr. et al. | |
| 2001/0053568 A1 | 12/2001 | Deboy et al. | |
| 2002/0017681 A1 | 2/2002 | Inoue et al. | |
| 2002/0048190 A1 | 4/2002 | King | |
| 2002/0054502 A1 | 5/2002 | King | |
| 2002/0057123 A1 | 5/2002 | King | |
| 2002/0063277 A1 | 5/2002 | Ramsbey et al. | |
| 2002/0066933 A1 | 6/2002 | King | |
| 2002/0067651 A1 | 6/2002 | King | |
| 2002/0076850 A1 | 6/2002 | Sadd et al. | |
| 2002/0093030 A1 | 7/2002 | Hsu et al. | |
| 2002/0096723 A1 | 7/2002 | Awaka | |
| 2002/0100918 A1 | 8/2002 | Hsu et al. | |
| 2002/0109150 A1 | 8/2002 | Kajiyama | |

FOREIGN PATENT DOCUMENTS

| | | |
|---|---|---|
| EP | 0747961 A2 | 12/1996 |
| EP | 0655788 B1 | 1/1998 |
| EP | 1050964 A2 | 11/2000 |
| EP | 1085656 A2 | 3/2001 |
| EP | 1107317 A1 | 6/2001 |
| EP | 0526897 B1 | 11/2001 |
| EP | 1168456 A2 | 1/2002 |
| EP | 1204146 A1 | 5/2002 |
| EP | 1251562 A1 | 10/2002 |
| JP | 8018033 A2 | 1/1996 |
| JP | 2001 01015757 A2 | 1/2001 |
| WO | WO 90/03646 A1 | 4/1990 |
| WO | WO 99/63598 A1 | 4/1999 |
| WO | WO 00/41309 A1 | 7/2000 |
| WO | WO 01/65597 A1 | 9/2001 |
| WO | WO 01/69607 A2 | 9/2001 |
| WO | WO 01/88977 A2 | 11/2001 |
| WO | WO 01/991153 A2 | 12/2001 |

OTHER PUBLICATIONS

Neel, O. L., et al., "Electrical Translent Study of Negative Resistance in SOi MOS Transistors," Electronics Letters, vol. 26, No. 1, pp. 73-74, Jan. 1990.

Mohan, S. et al., "Ultrafast Pipelined Adders Using Resonant Tunneling Transistors," IEE Electronics Letters, vol. 27, No. 10, May 1991, pp. 830-831.

Zhang, J.F. et al., "Electron trap generation in thermally grown SIO2 under Fowler-Nordheim stress," J. Appl. Phys. 71 (2), Jan. 15, 1992, pp. 725-734.

Zhang, J.F. et al., "A quantitative investigation of electron detrapping in SIO2 under Fowler-Nordheim stress," J. Appl. Phys. 71 (12), Jun. 15, 1992, pp. 5989-5996.

Zhang, J.F. et al., "A comparative study of the electron trapping and thermal detrapping in SiO2 prepared by plasma and thermal oxidation," J. Appl. Phys. 72 (4), Aug. 15, 1992, pp. 1429-1435.

Luryi, S. et al., "Collector-Controlled States in Charge Injection Transistors," SPIE-92 Symposium, pp. 1-12, 1992.

Luryi, S. et al., "Collector-Controlled States and the Formation of Hot Electron Domains in Real-Space Transfer Transistors," AT&T Bell Laboratories, pp. 1-7, 1992.

Luryi, S. et al., "Light-emitting Logic Devices based on Real Space Transfer in Complementary InGaAs/InAlAs Heterostructures", In "Negative Differential Resistance and Instabilities in 2D Semiconductors", ed. by N. Balkan, B. K. Ridley, and A. J. Vickers, NATO ASI Series [Physics] B 307, pp. 53-82, Plenum Press (New York 1993).

Mohan, S, et al., "Logic Design Based on Negative Differential Resistance Characteristics of Quantum Electronic Devices," IEE Proceedings-G: Electronic Devices, vol. 140, No. 6, Dec. 1993, pp. 383-391.

Mohan, S. et al., "Ultrafast Pipelined Arithmetic Using Quantum Electronic Devices," IEE Proceedings-E: Computers and Digital Techniques, vol. 141, No. 2, Mar. 1994, pp. 104-110.

Chan, E. et al., "Compact Multiple-Valued Multiplexers Using Negative Differential Resistance Devices," IEEE Journal of Solid-State Circuits, vol. 31, No. 8, Aug. 1996, pp. 1151-1156.

Chan, E. et al., "Mask Programmable Multi-Valued Logic Gate Using Resonant Tunnelling Diodes," IEE Proceedings-Circuits Devices Syst., vol. 143, No. 5, Oct. 1996, pp. 289-294.

Shao, Z. et al., "Transmission Zero Engineering in Lateral Double-Barrier Resonant Tunneling Devices," Dept. Of Electrical Engineering, University of Notre Dame, pp. 1-7 (1996).

Goldhaber-Gordon, David et al., "Overview of nanoelectronic devices," Proc. IEEE, 85(4), Apr. 1997, pp. 521-540.

Koester, S. J. et al., "Negative Differential Conductance in Lateral Double-Barrier Transistors Fabricated In Strained SI Quantum Wells," Applied Physics Letters, vol. 70, No. 18, May 1997, pp. 2422-2424.

Dozsa, L. et al., "A transient method for measuring current-voltage characteristics with negative differential resistance regions," Research Institute for Technical Physics, P. O. Box 76, H-1325 Budapest, Hungary, (Received Jul. 24, 1997; accepted Aug. 1, 1997), 2 pages.

Pacha, C. et al., "Design of Arithmetic Circuits using Resonant Tunneling Diodes and Threshold Logic," Lehrstuhl Bauelemente der Elektrotchnik, Universitat Dortmund, pp. 1-11, Sep. 1997.

Hansch, W. et al., "The planar-doped-barrier-FET: MOSFET overcomes conventional limitations," ESSDERC'97 27th European Solid-State Device Research Conference, Stuttgart, Sep. 22-24, 1997, 4 pages.

Wirth, G. et al., "Periodic transconductance oscillations in sub-100nm MOSFETs," ESSDERC '97 27th European Solid-State Device Research Conference, Stuttgart, Sep. 22-24, 1997, 4 pages.

Haddad, G. I. et al., "Tunneling Devices and Application in High Functionality/Speed Digital Circuits," Solid State Electronics, vol. 41, No. 10, Oct. 1997, pp. 1515-1524.

Gardner, C. et al., "Smooth Quantum Hydrodynamic Model Simulation of the Resonant Tunneling Diode," Dept. Of Mathematics Arizona State University, pp. 1-5, (1998).

Jungel, A. et al., "Numerical Simulation of Semiconductor Devices: Energy-Transport and Quantum Hydrodynamic Modeling," Fechbereich Math., Tech. Univ. Berlin, Germany, pp. 1-9, 1998.

Nimour, S. M. A. et al., "Effect of Spatially Disordered Barriers on the Band Structure of Finite Superlattices," phys. stat. sol. (b) 1998, 209, No. 2, 311-318.

Rommel, S. L. et al., "Room Temperature Operation of Epitaxially Grown SI/SI0.5Ge0.5/SI Resonant Interband Tunneling Diodes," Applied Physics Letters, vol. 73, No. 15, pp. 2191-2193, 1998.

Van Der Wagt, J. P. A. et al., "RTD/HFET Low Standby Power SRAM Gain Cell," Source: Corporate Research Laboratories, Texas Instruments, 1998, 4 pages.

Sun, J. P. et al., "Resonant Tunneling Diodes: Models and Properties," Proceedings of the IEEE, ol. 86, No. 4, Apr. 1998, pp. 641-661.

Mazumder, P. et al., "Digital Circuit Applications of Resonant Tunneling Devices," Proceedings of the IEEE, vol. 86, No. 4, pp. 664-686, Apr. 1998.

News Release from www.eurekalert.org/releases/udel-udcnflb.html, "UD Computer News: Future Looks Bright for Tunnel Diodes, Promising Faster, More Efficient Circuits," Oct. 1, 1998, 4 pages.

Seabaugh A. et al., "Resonant Tunneling Mixed Signal Circuit Technology," Solid-State Electronics 43:1355-1365, 1999.

Wirth, G. et al., "Negative Differential Resistance in Ultrashort Bulk MOSFETs," IECON'99 Conference Proceedings, vol. 1, San Jose, 1999, pp. 29-34

Mathews, R. H. et al., "A New RTD-FET Logic Family," Proceedings of the IEEE, vol. 87, No. 4, pp. 596-605, 1999.

Van Der Wagt, J. P. A., "Tunneling-Based SRAM," Proceedings of the IEEE, vol. 87, No. 4, pp. 571-595, 1999.

Heij, C. P. et al., "Negative Differential Resistance Due to Single-Electron Switching," Applied Physics Letters, vol. 74, No. 7, Feb. 15, 1999, 5 pages.

Pacha, C. et al., "Resonant Tunneling Device Logic Circuits," Microelectronics Advanced Research Initiative (MEL-ARI,) Jul. 1998-Jul. 1999, pp. 1-22.

Hong, J.W. et al., "Local charge trapping and detection of trapped charge by scanning capacitance microscope in SiO2/SI system," Appl. Phys. Lett., 75 (12), Sep. 20, 1999, pp. 1760-1762.

Haddab, Y. et al., "Quantized current jumps in silicon photoconductors at room temperature," J. Appl. Phys, 66(7), Oct. 1, 1999, pp. 3787-3791.

Seabaugh, A., "Promise of Tunnel Diode Integrated Circuits," Tunnel Diode and CMOS/HBT Integration Workshop, Dec. 9, 1999, Naval Research Laboratory, Washington DC., 13 Pages.

Zhang, J., "Traps: Detrapping," Wiley Encyclopedia of Electrical and Electronics Engineering Online, Article Posting Date: Dec. 27, 1999, John Wiley & Sons, Inc., 4 Pages.

Zhang, J., "Traps: Effects of Traps and Trapped Charges on Device Performance," Wiley Encyclopedia of Electrical and Electronics Engineering Online, Article Posting Date: Dec. 27, 1999, John Wiley & Sons, Inc., 2 Pages.

Zhang, J., "Traps: Measurement Techniques," Wiley Encyclopedia of Electrical and Electronics Engineering Online, Article Posting Date: Dec. 27, 1999, John Wiley & Sons, Inc., 5 Pages.

Zhang, J., "Traps," Wiley Encyclopedia of Electrical and Electronics Engineering Online, Article Posting Date: Dec. 27, 1999, John Wiley & Sons, Inc., 2 Pages.

Zhang, J., "Traps: Trapping Kinetics," Wiley Encyclopedia of Electrical and Electronics Engineering Online, Article Posting Date: Dec. 27, 1999, John Wiley & Sons, Inc., 2 Pages.

Zhang, J., "Traps: Origin of Traps," Wiley Encyclopedia of Electrical and Electronics Engineering Online, Article Posting Date: Dec. 27, 1999, John Wiley & Sons, Inc., 4 pages.

Gonzalez, A. et al., "Standard CMOS Implementation of Multiple-Valued Logic Signed-Digit Adder Based on Negative Differential-Resistance Devices," Proceedings of the 30th IEEE International Symposium on Multiple-Valued Logic (ISMVL 2000), 6 pages.

Karna, Shashl P. et al., "Point defects in SI-SIO2 systems: current understanding,"Published in G. Pacchioni et al. (eds.), "Defects in SIO2 and related dielectrics: science and technology," Kluwer Academic Publishers, (2000), 19 pages.

King, Tsu-Jae et al., U.S. Appl. No. 09/602,658, entitled "CMOS Compatible Process for Making a Tunable Negative Differential Resistance (NDR) Device," filed Jun. 22, 2000, 33 pages.

King, Tsu-Jae et al., U.S. Appl. No. 09/603,101, entitled "CMOS-Process Compatible, Tunable NDR (Negative Differential Resistance) Device and Method of Operating Same," filed Jun. 22, 2000, 34 pages.

King, Tsu-Jae et al., U.S. Appl. No. 09/603,102, entitled "Charge Trapping Device and Method for Implementing a Transistor haivng a Negative Differential Resistance Mode," filed Jun. 22, 2000, 39 pages.

Geppert, Linda, "Quantum transistors: toward nanoelectronics," IEEE Spectrum, Sep. 2000, pp. 46-51.

Seabaugh, A. et al., "Tunnel-Diode IC," Minneapolis, Oct. 2, 2001, 23 pages.

Believed to be published In: Deen, Jamal (editor) et al., excerpt from "CMOS RF modeling, characterization and applications," World Scientific, Apr. 2002, 34 pages.

Scoffield, John H. et al., "Reconciliation of different gate-voltage dependencies of 1/f noise in n-Mos and p-MOS transistors," IEEE Trans. Electron. Dev. 41 (11), 11 pages.

Final Report: Smile MEL-ARI Project n°28741—Chapter V, pp. 184-194.

Villa, S. et al. "Application of 1/f noise measurements to the characterization of near-interface oxide states in ULSI n-MOSFET's," Dipartimento di Elettronica e Informazione, Politecnico di Milano (Italy), 7 pages.

Nemati, F. et al., "A Novel High Density, Low Voltage SRAM Cell With a Vertical NDR Device," Center for Integrated Systems, Stanford University, CA, (2 pages).

Nemati, F. et al., "A Novel Thyrisor-based SRAM Cell (T-RAM) for High-Speed, Low-Voltage, Giga-scale Memories," Center for Integrated Systems, Stanford University, CA, (4 pages).

Shoucair F. et al., "Analysis and Simulation of Simple Transistor Structures Exhibiting Negative Differential Resistance," EECS Department, UC Berkeley, Berkeley CA, (4 pages).

Oberhuber, R. et al., "Tunnel-Devices with Negative Differential Resistivity Based on Silicon?," Source: Deutsche Forachungsgemelnschaft and Siemens AG, date unknown, 2 pages.

* cited by examiner

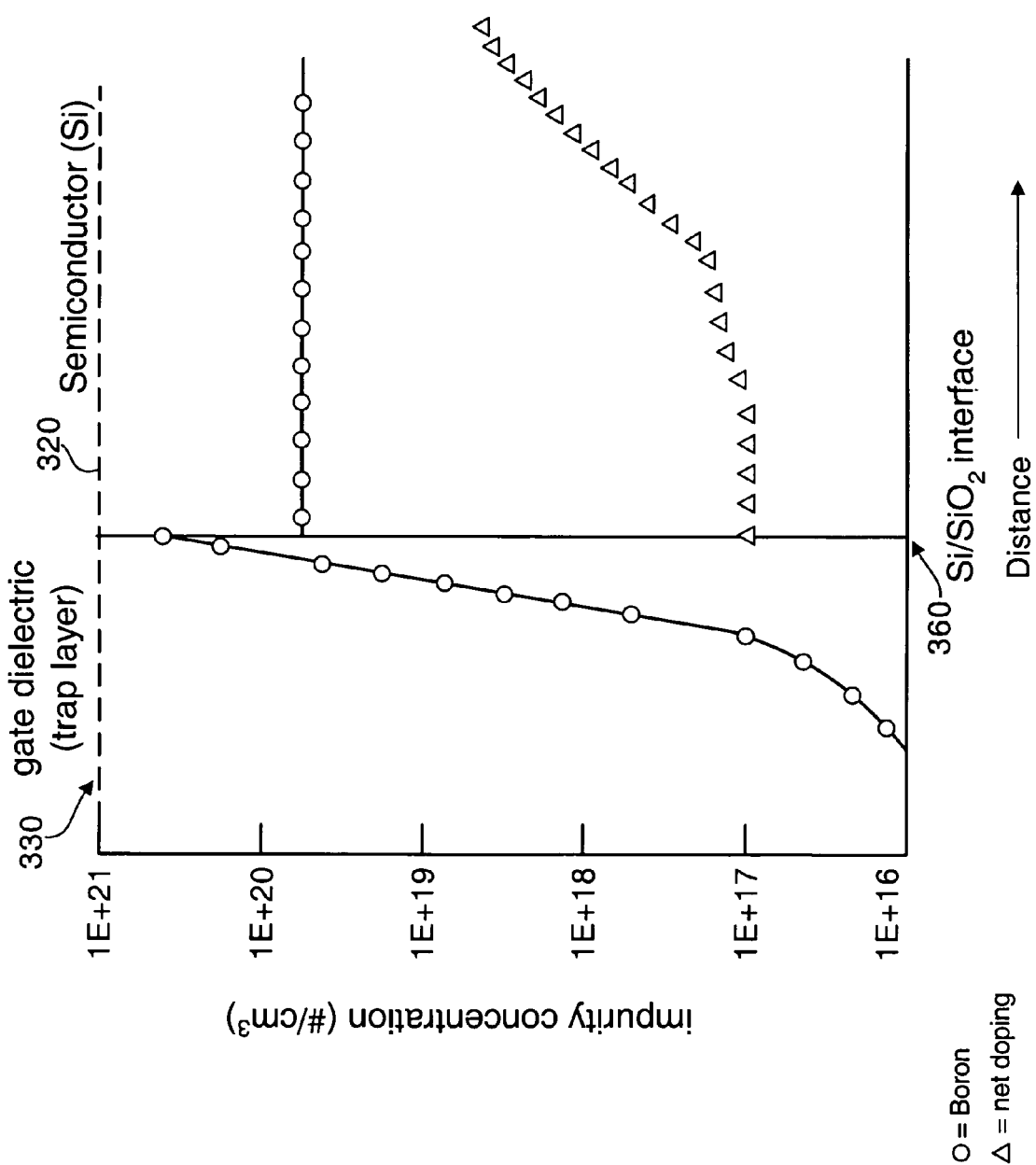

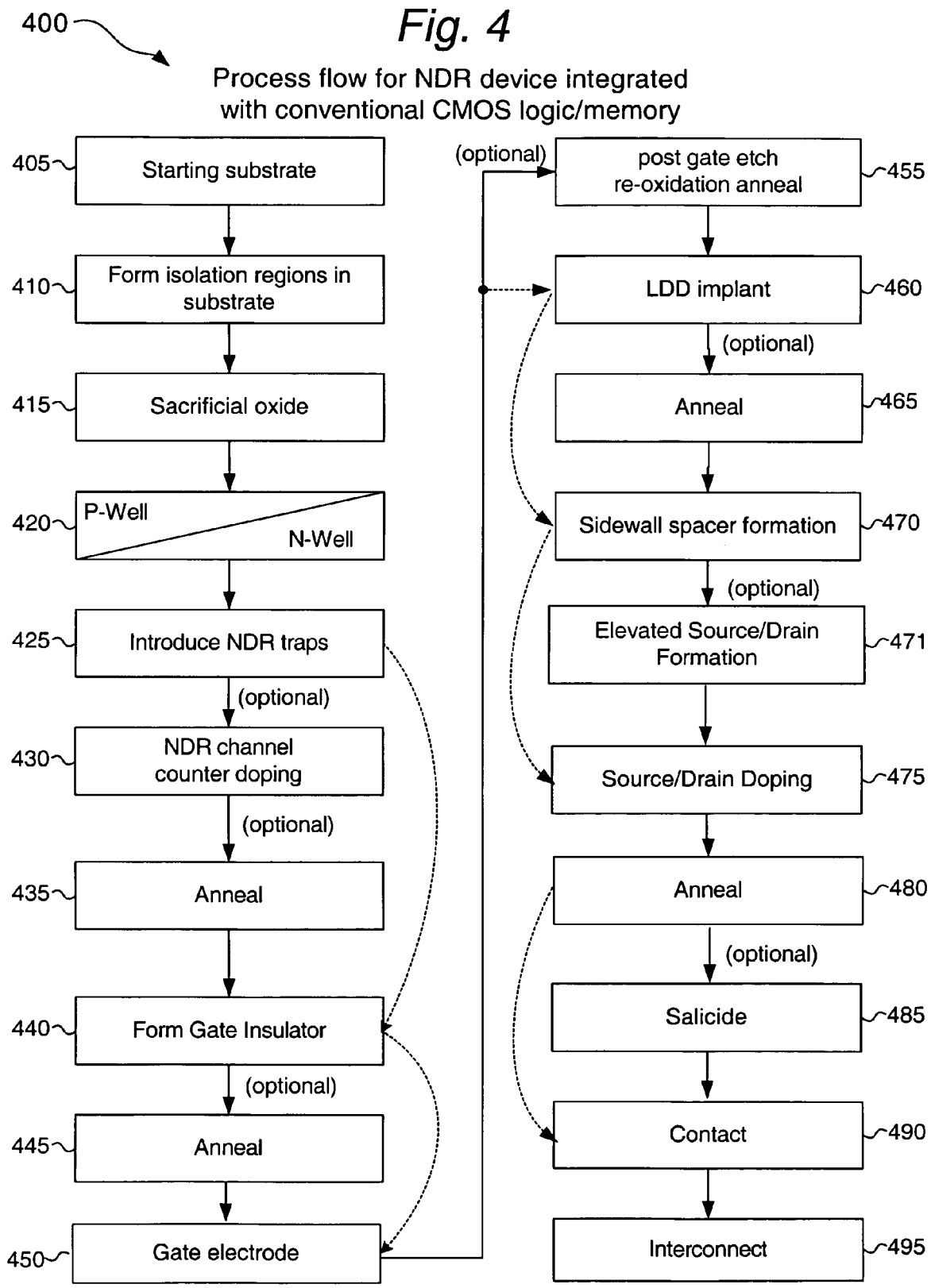

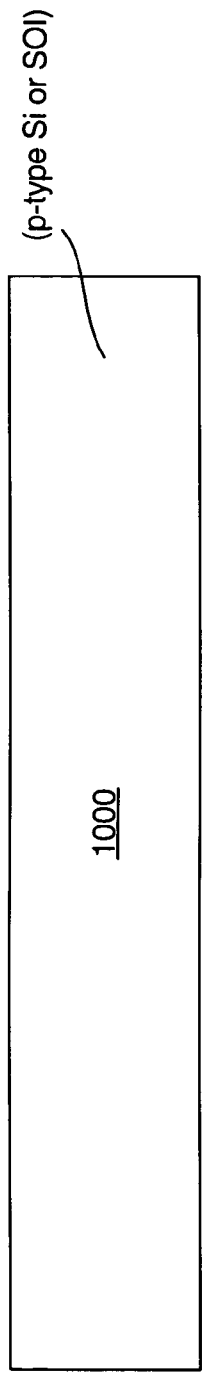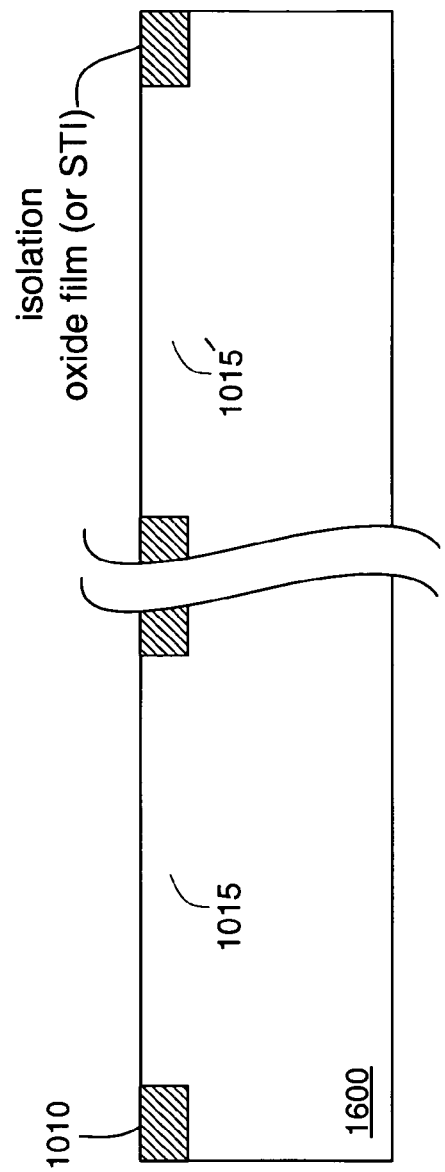

Boron implant

Arsenic implant

METHOD OF MAKING ADAPTIVE NEGATIVE DIFFERENTIAL RESISTANCE DEVICE

CROSS REFERENCE TO RELATED APPLICATIONS

The present application claims priority to and is a divisional of application Ser. No. 10/321,090 filed Dec. 17, 2002, now U.S. Pat. No. 6,812,084 which is incorporated by reference herein. The present application is also a continuation-in-part of the following applications which are hereby incorporated by reference as if fully set forth herein:
1. Method of Forming a Negative Differential Resistance Device; Ser. No. 10/314,735 filed Dec. 9, 2002 now U.S. Pat. No. 6,980,467;
2. Process for Controlling Performance Characteristics of a Negative Differential Resistance (NDR) Device; Ser. No. 10/314,785 filed Dec. 9, 2002 now U.S. Pat. No. 6,979,580;
3. Charge Trapping Device & Method of Forming the Same; Ser. No. 10/314,510 filed Dec. 9, 2002 now U.S. Pat. No. 6,849,483.

The above application Ser. No. 10/321,090 is related to the following applications, all of which are hereby incorporated by reference as if fully set forth herein:
4. Integrated Circuit Having Negative Differential Resistance (NDR) Devices With Varied Peak-to-Valley Ratios (PVRs); Ser. No. 10/321,031
5. Method of Testing/Stressing a Charge Trapping Device; Ser. No. 10/322,080.

FIELD OF THE INVENTION

This invention is directed to methods of controlling operating characteristics of semiconductor devices, particularly NDR field-effect transistor devices which can be configured to operate adaptively in response to changing operational requirements.

BACKGROUND OF THE INVENTION

Silicon based devices that exhibit a negative differential resistance (NDR) characteristic have long been sought after in the history of semiconductor devices. A new type of CMOS compatible, NDR capable FET is disclosed in the following King et al. applications:

Ser. No. 09/603,101 entitled "A CMOS-PROCESS COMPATIBLE, TUNABLE NDR (NEGATIVE DIFFERENTIAL RESISTANCE) DEVICE AND METHOD OF OPERATING SAME"; and Ser. No. 09/603,102 entitled "CHARGE TRAPPING DEVICE AND METHOD FOR IMPLEMENTING A TRANSISTOR HAVING A NEGATIVE DIFFERENTIAL RESISTANCE MODE" now issued as U.S. Pat. No. 6,479,862 on Nov. 12, 2002; and Ser. No. 09/602,658 entitled "CMOS COMPATIBLE PROCESS FOR MAKING A TUNABLE NEGATIVE DIFFERENTIAL RESISTANCE (NDR) DEVICE;

all of which were filed Jun. 22, 2000 and which are hereby incorporated by reference as if fully set forth herein. The advantages of such device are well set out in such materials, and are not repeated here.

As also explained in such references, NDR devices can be used in a number of circuit applications, including multiple-valued logic circuits, static memory (SRAM) cells, latches, and oscillators to name a few. The aforementioned King et al. applications describe a break-through advancement that allows NDR devices to be implemented in silicon-based IC technology, using conventional planar processing techniques as for complementary metal-oxide-semiconductor (CMOS) FET devices. The integration of NDR devices with CMOS devices provides a number of benefits for high-density logic and memory circuits.

It is clear, from the advantages presented by the above-described NDR device, that overall improvements in manufacturing, testing and operation of the same are desirable to refine and proliferate such technologies.

In addition, enhancements in trap location control, trap energy level control, and trap formation, are also useful for these types of NDR devices, and could be beneficial to other types of trap-based devices as well.

Furthermore, the prior art to date has been limited generally to devices in which the peak-to-valley ratio (PVR) is not easily adjustable. It would be useful, for example, to be able to control the PVR directly during manufacture, so as to permit a wide variety of NDR behaviors for different circuits on a single die/wafer. Alternatively, the ability to control PVR during normal operation of a device would also be useful, but is generally not possible with current NDR technologies.

SUMMARY OF THE INVENTION

The object of the present invention, therefore, is to address the aforementioned limitations in the prior art, and to provide additional embodiments of trapping devices, NDR devices, and methods of making, operating and testing the same. These and other objects are accomplished by various embodiments of the present invention as described in detail below, it being understood by those skilled in the art that many embodiments of the invention will not use or require all aspects of the invention as described herein.

A first aspect of the invention, therefore, concerns a method of forming a silicon based negative differential resistance (NDR) field effect transistor (FET) comprising the preferred steps of: providing a substrate; forming a first NDR region for the NDR FET over a first portion of the substrate using a first impurity, the first NDR region being adapted for imparting an NDR characteristic to the NDR FET; placing a second impurity in the first portion of the substrate to adjust a threshold voltage characteristic of the NDR FET; performing a first thermal treatment operation for the NDR FET after the above are completed; forming a gate insulating layer for the NDR FET over the first portion of the substrate; performing a second thermal treatment operation for the NDR FET; forming a gate electrode for the NDR FET; forming a source region and a separate drain region for the NDR FET adjacent to the gate electrode, the source region and drain region being coupled through an NDR FET channel located in the first portion of the substrate.

In this manner, an NDR FET preferably operates with a negative differential resistance characteristic when sufficient charge carriers from the channel are temporarily trapped in the first NDR region. The first impurity is preferably a first type dopant, and the second impurity is preferably a second type dopant which is opposite to the first type dopant. The first thermal treatment operation is preferably performed with a furnace, while the second thermal treatment operation is preferably performed with a rapid thermal anneal lamp in a pulsed heated chamber. Furthermore, in addition to the above, a third thermal treatment operation is preferably performed after the gate electrode is formed.

In later steps, a silicide contact to the gate electrode and/or one or both of the source region and the drain region can be formed.

Some embodiments of the invention, therefore, are silicon based negative differential resistance (NDR) field effect transistor (FET) which have a peak-to-valley current ratio (PVR) that exceeds ten (10) over a temperature range of 50° C. In some instances, a PVR can exceed one thousand (1000) over a temperature range of 100° C.

In other embodiments, a silicon on insulator (SOI) substrate is used; a variety of substrates ate suitable for the present invention, including strained Si or silicon carbide (SiC).

The impurities added to the FET are used to create charge trapping sites which preferably have an energy characteristic that is higher than a conduction band edge of the substrate.

In other embodiments, an NDR FET and a non-NDR FET are made at the same time using common manufacturing operations. For example, isolation regions, LDD implants, gate insulators, gate electrodes, contacts, source/drain implants, etc., can be done using a shared processing step. In such instances, an NDR region for an NDR device is preferably constructed from a gate insulator region for an NDR FET.

In still other embodiments, two different types of NDR devices can be formed in a common substrate. Thus, a second NDR region for another NDR element is formed over a second region of the semiconductor substrate, the second NDR region being adapted for imparting a second NDR characteristic different from an NDR characteristic for a first NDR FET.

A related aspect of the invention, therefore, pertains to a charge-trap based negative differential resistance (NDR) element which operates with an NDR characteristic defined by a peak current and a valley current. By appropriate distribution of charge traps in a trapping region of the NDR element, including controlling a concentration and energy of the same, a peak-to-valley current ratio (PVR) for the NDR element can be imparted which exceeds ten (10) over a temperature range spanning 50° C.

In other embodiments the PVR can be constructed to vary by less than a factor of five in an operating temperature spanning 25° C. and 125° C. In still other embodiments, the PVR exceeds 1000 in an operating temperature spanning 25° and 125°. The trapping region preferably forms an interface with a channel of a field effect transistor associated with the NDR element.

Other embodiments of charge trapping devices can be similarly constructed to achieve similar performance.

Another aspect of the invention concerns a method of forming a negative differential resistance (NDR) device comprising the steps of: forming a gated silicon-based NDR element; and setting a peak-to-valley ratio (PVR) characteristic of the gated silicon-based NDR element during manufacture of the silicon-based semiconductor transistor to a target PVR value located in a range between a first PVR value and a second PVR value. Thus, a target PVR value can be varied during manufacturing of the NDR device within a semiconductor process such that the NDR device can be configured to have a PVR value ranging between a first usable PVR value and a second usable PVR value, where the first usable PVR value and the second PVR value vary by at least a factor of ten (10).

In some instances, a desired PVR value can be set using a single processing operation, such as an implant.

A preferred approach uses only metal oxide semiconductor (MOS) compatible processing operations. The inventive process is flexible enough so that within a particular manufacturing facility, a first semiconductor substrate on a first wafer and a second separate semiconductor substrate on a second wafer can have different target PVR values imparted at different times. The different PVR values can be programmed into a semiconductor processing apparatus such as an implanter, a furnace, an anneal chamber, a deposition system, etc. An NDR voltage onset point (VNDR) is also preferably set during manufacture.

In still other more specific embodiments, a PVR (and/or a VNDR) value can be set during manufacture by controlling one or more general process parameters.

For example, in some embodiments, a PVR and/or VNDR can be set during manufacture by controlling a thickness of a gate insulator grown for the NDR device. In particular, a PVR characteristic can be increased simply by increasing a thickness of the gate insulator. The gate insulator is preferably at least 5 nm thick, and can be a single layer, or a composite of two different materials. In some applications the gate will include both a thermal oxide and a deposited oxide based material. Thus, it is possible in some applications to have a common substrate that includes a silicon based NDR device with a first PVR characteristic using a first gate insulator thickness and a second silicon based NDR device with a second PVR characteristic using a second gate insulator thickness.

In another embodiment, a PVR and/or VNDR can be set during manufacture by controlling a channel length used for a silicon based NDR FET. Because the present invention scales very well, a PVR characteristic tracks a channel length, so that a higher PVR can be achieved by using a smaller channel, and a lower PVR can be achieved by using a longer channel. Accordingly, PVR characteristics can be established through conventional masking operations which define a channel length, and/or which define a source/drain region implant. The channel can also have a size that is defined by a variable sized spacers deposited on the sidewalls of a gate electrode. Thus, a PVR value can be increased significantly through even small reductions in channel lengths.

In still another embodiment, a PVR and/or VNDR can be set during manufacture by controlling an impurity species and/or impurity dose introduced into a charge trapping layer associated with the NDR element to match a target charge trap profile. In a a preferred approach Boron is selected as the impurity at a dose ranging from $1*10^{14}/cm^2$ to $3*10^{14}$ atoms/$cm^2$. This results in a target charge trap profile in which a concentration of charge traps is greater than about $1*10^{19}$ atoms/$cm^3$ at a trapping region of the charge trapping layer, and less than about $1*10^{18}$ atoms/$cm^3$ at a bulk region of the charge trapping layer. A PVR can thus be altered merely by selecting another impurity, another dosage, etc. For example, increasing an impurity dose of Boron by 50% can result in an increase of greater than 100% in a PVR characteristic. As with the other PVR processing embodiments, an NDR voltage onset point (VNDR) can also be controlled in this fashion.

In still another embodiment, a PVR and/or VNDR can be set during manufacture by controlling an overall trap distribution, such as a target location of the charge traps and a target concentration of the charge traps. In a preferred embodiment, the charge traps are distributed within a target location is a region that is less than about 0.5 nm thick. Furthermore, a concentration of traps is arranged so that an interface concentration is least an order of magnitude greater than in bulk areas of the charge trapping layer.

In other embodiments, a PVR and/or VNDR can be set during manufacture by controlling a rapid thermal anneal (RTA) operation. A preferred approach is to use a cycle at a temperature that exceeds 1000° C. for at least part of the cycle in a conventional lamp based chamber. This type of operation serves to focus and concentrate charge traps at a channel interface region, as opposed to bulk regions.

In still other embodiments, a PVR and/or VNDR can be set during manufacture by controlling a lightly doped drain operation, including an implant species and/or dosage. performed during formation of a lightly doped drain region operation. In a preferred embodiment, arsenic is used as the dopant species at a dosage in excess of $1*10^{15}$ atoms/cm$^2$ to effectuate the implant operation. In other embodiments, phosphorus is used as the dopant species at a dosage in excess of $1*10^{15}$ atoms/cm$^2$ to effectuate the implant operation. Since Arsenic achieves a PVR that is at least 2 times greater than Phosphorus, it is preferred for those applications where PVR is more critical to the operation of a circuit.

Related aspects of the invention concern a semiconductor processing apparatus for manufacturing a negative differential resistance (NDR) device on a silicon wafer which can be programmed to tailor a specific PVR value on a wafer by wafer basis (or even die by die). The apparatus is preferably located in a conventional semiconductor fab, and includes a programmable controller responsive to a negative differential resistance (NDR) related process recipe associated with making the NDR device. An NDR related process recipe includes one or more processing steps associated with effectuating a target peak-to-valley current ratio (PVR) for an NDR device. The processing chamber coupled to the programmable controller is configured to perform at least one semiconductor processing operation on the silicon wafer based on the NDR related process recipe. The semiconductor processing operation can be varied within the processing chamber to achieve a PVR value that varies between a first value, and a second value that is at least twice the first value.

In other embodiments, the PVR value can be varied between 10 and 100 in the semiconductor processing apparatus. The process chamber can be an implanter, an RTA chamber, a deposition reactor, a deposition chamber, etc.

Other aspects of the invention concern different types of optimizations for charge trap profiling for charge trap devices, including NDR devices.

In an NDR FET embodiment, counter-doping is performed to improve a threshold voltage. Thus, a semiconductor device having a control gate, a source region, and a drain region is formed using the steps of: providing a substrate having a first type of conductivity; forming a channel between the source and drain region for carrying the charge carriers between the source and drain regions; the channel is doped in two separate operations such that: during a first channel doping operation the channel is doped with first channel impurities that also have the first type of conductivity; during a second channel doping operation the channel is counter-doped with second channel impurities that have a second type of conductivity. The second type of conductivity is opposite to the first type of conductivity. As a result of the first channel doping operation and the second channel doping operation the channel region as formed has a net first type of conductivity. A charge trapping region that has an interface with the channel is also formed. The charge trapping region has charge trapping sites which temporarily trap charge carriers along the interface and permit the device to operate with a negative differential resistance characteristic. The charge trapping sites are derived at least in part from the first channel impurities forming a charge trap distribution that is substantially concentrated at the interface.

In a preferred embodiment, Arsenic is used for the second channel doping operation, while Boron is used for the first channel doping operation. While silicon is used as a preferred substrate, other substrates could be used, such as SOI, strained Si, SiC, etc. Moreover, different crystal orientation variants of silicon (111, 100, 110) may result in different charge trapping characteristics.

The charge trapping region is typically formed as part of gate insulator for the semiconductor device. In other variations, the charge traps can be directly implanted through a gate insulator after the latter is completed. In still further variants, the charge traps can be formed as part of a two layer trapping region, such as would be derived from a combined thermal oxide and deposited oxide.

In other variations, the charge trapping region can be engineered to not extend throughout an entire length of the interface with the channel. In other instances, the charge trapping region extends from a source region to enhance source side trapping. In still other embodiments, trapping sites are distributed unevenly along the interface to effectuate a variable trapping rate for the energetic carries along the interface. A trapping rate can also be controlled in some instances, so that it varies substantially proportional to a distance along the interface, and/or is preferentially greater in one region over another—i.e., such that in a source region it is greater than that near a drain region.

In other embodiments, the charge trapping sites are formed in two distinct operations. For example, an implant operation is used for forming a first set of charge trapping sites, and a heat treatment operation (such as in an steam ambient) forms a second set of charge trapping sites. In still other embodiments, different implants could be used of the same species, or different atomic species to create different types of charge traps (i.e., such as Boron and silicon or metal nanoparticles).

A further related aspect of the invention concerns using annealing operations to help ensure that impurities are preferentially concentrated at an interface, where they can form appropriate trap sites. This is achieved by forming a silicon based negative differential resistance (NDR) semiconductor device with the steps of providing a substrate; and forming a channel region for carrying a current of charge carriers for the silicon based NDR semiconductor device; and implanting first impurities into the channel region; and forming a first dielectric layer that has an interface with the channel; and annealing the channel region to reduce implantation defects and distribute the first impurities so as to concentrate them along the interface with the channel. The first impurities as distributed along the interface form charge trapping sites with an energy level adapted for temporarily trapping the charge carriers to effectuate an NDR characteristic.

In a preferred embodiment, the first impurities have a first conductivity (p) type that is the same as the substrate. The silicon based NDR semiconductor device is typically a field effect transistor (FET), but can include other charge trap based NDR devices.

In still another variant, additional annealing operations can be performed to further enhance a trap distribution. Thus, this implementation involves performing a plurality of separate annealing operations on the semiconductor structure, wherein at least a first one of the separate annealing operations is adapted so as to distribute and concentrate the carrier trapping sites along an interface with the transistor channel region and with a reduced concentration in a bulk region of the trapping layer. Later separate annealing operations are adapted to alter a concentration and/or arrangement of the charge trapping sites along the interface.

A further related aspect, therefore, concerns a silicon based field effect transistor (FET) comprising a trapping layer proximate to a transistor channel region for the FET, the trapping layer including a carrier trapping sites configured for trapping and de-trapping carriers from the channel region. The carrier trapping sites are distributed such that a concentration of the carrier trapping sites in a bulk region of the trapping layer is at least one order of magnitude less than it is along an interface with the transistor channel region. In this fashion, the FET can exhibit negative differential resistance as a result of the trapping and de-trapping of carriers.

In a preferred embodiment, a concentration of the carrier trapping sites at the interface per cubic centimeter is at least two orders of magnitude greater than a concentration of the carrier trapping sites within the bulk region of the trapping layer. Furthermore, the concentration of an impurity per cubic centimeter used for the carrier trapping sites is at least two times higher at a trapping layer-channel interface than in the channel region.

Another aspect of the invention concerns forming different types of NDR devices on the same substrate. This basically includes the steps of forming a first silicon-based NDR device having a first NDR characteristic on a first portion of the substrate; and forming a second silicon-based NDR device having a second NDR characteristic on a second portion of the substrate. To accommodate different types of circuits, the first NDR characteristic and the second NDR characteristic are substantially different and are used in a first silicon based processing circuit and a separate second silicon based processing circuit respectively.

The first NDR characteristic includes a first peak-to-valley ratio (PVR) and/or a first onset voltage, and the second NDR characteristic includes a second PVR, and/or a second onset voltage. By varying these features, different performances can be achieved for different NDR based circuits.

In one embodiment, PVR/VNDR values are different because a first silicon based processing circuit corresponds to a logic circuit and the second silicon based processing circuit corresponds to a memory circuit.

In another embodiment, PVR/VNDR values are different because the first silicon based processing circuit operates at a first frequency and the second silicon based processing circuit operates at a second frequency greater than the first frequency.

In other embodiments, PVR/VNDR values are different because the first silicon based processing circuit corresponds to a first memory circuit operating with a first operating power requirement and the second silicon based processing circuit corresponds to a second memory circuit operating at a second operating power requirement that is greater than the first operating power requirement.

In still other embodiment, PVR/VNDR values are different because the first silicon-based NDR device is a first field effect transistor (FET) with a first voltage threshold and a first gate length, and the second silicon-based NDR device is a second FET with a second voltage threshold and a second gate length that are substantially different from the fist voltage threshold and the first gate length respectively.

The different PVR/VNDR values can be achieved using a first trap distribution and a second charge trap distribution formed for the first silicon-based NDR device and the second silicon-based NDR device respectively. To form such distributions, one approach is form the first trap distribution by a first mask and a first impurity implantation into a first NDR region, and the second charge trap distribution is then formed by a second mask and a second impurity implantation into a second NDR region.

A further related aspect concerns a method of forming multiple a negative differential resistance (NDR) device, including the steps of: forming a first gated silicon-based NDR element and a second gated silicon-based NDR element; setting a peak-to-valley ratio (PVR) characteristic of the first gated silicon-based NDR element to a first target PVR value; setting a PVR characteristic of the second gated silicon-based NDR element to a second target PVR value. The first PVR value and the second PVR value are set to different values during manufacturing of the NDR device to provide different NDR characteristics for the first gated silicon-based NDR element and the second gated silicon-based NDR element.

The first gated silicon-based NDR element and the second gated silicon-based NDR element are preferably formed using metal oxide semiconductor (MOS) compatible processing operations, and can include either NDR FETs, NDR diodes, or other NDR elements which include a tunable PVR characteristic. Using processes described herein, the PVR values can be easily made to vary by at least 50%, 100%, or even 1000%. In a typical application, the first NDR element is used in a memory circuit, and the second NDR element is used in a logic circuit, because different PVRs might be used in such applications.

A related aspect concerns a method of operating different types of negative differential resistance (NDR) devices in an integrated circuit, comprising the steps of: operating a first circuit in the integrated circuit using a first silicon-based NDR device having a first NDR characteristic; and operating a second circuit in the integrated circuit using a second silicon-based NDR device having a second NDR characteristic. Again, the first NDR characteristic and the second NDR characteristic are substantially different so that the first circuit and the second circuit are caused to operate with substantially different electrical characteristics.

To achieve different NDR characteristics, it is not necessary in such embodiments to pre-manufacture different nominal NDR values. Instead, the substantially different electrical characteristics can be achieved by using a first clock frequency and/or activity factor for the first circuit and a second clock frequency and/or activity factor used by the second circuit, and such that the first clock frequency and/or activity factor and the second clock frequency and/or activity factor ate substantially different. Alternatively, the substantially different electrical characteristics could include a first gate bias voltage used by the first circuit and a second gate bias voltage used by the second circuit, such that the first gate bias and the second gate bias are substantially different voltages. Another approach is to set the substantially different electrical characteristics to include a first current level used by the first circuit and a second current level used by the second circuit, such that the first current level and the second current level are substantially different currents.

A semiconductor based circuit including two different types of NDR circuits thus comprises a first silicon-based NDR device having a first NDR characteristic on a first portion of a substrate of the semiconductor based circuit; and a second silicon-based NDR device having a second NDR characteristic on a second portion of the substrate. Again, the first NDR characteristic and the second NDR characteristic are substantially different and are used in a first silicon based processing circuit and a separate second silicon based processing circuit respectively on the semiconductor based circuit.

In one preferred approach, the different NDR characteristics are achieved by tailoring a first charge trapping region associated with the first silicon-based NDR device and a second charge trapping region associated with the second silicon-based NDR device.

In some applications, at least one of the first silicon-based NDR device and the second silicon-based NDR device is an NDR FET. Another of such devices can include a silicon based tunnel diode.

Another aspect of the invention pertains to an adaptive NDR device. This is achieved by operating the adaptive silicon-based NDR device with a first current-voltage relationship during a first time period; and operating the adaptive silicon-based NDR device with a second current-voltage relationship during a second time period. The first current-voltage relationship and the second current-voltage relationship NDR characteristic are sufficiently different so as to permit the adaptive silicon based NDR device to have two distinct operational modes, including a first operational mode and a second operational mode respectively. The adaptive silicon-based NDR device is switched between the first operational mode and the second operational mode in response to a control signal generated by a control circuit on the integrated circuit.

Generally speaking, the operating characteristics of the device are exploited by virtue of the fact that in the first operational mode the adaptive silicon based NDR device switches between a first peak NDR current and a first valley NDR current faster than the adaptive silicon NDR device switches between a second peak NDR current and a second valley NDR current in the second operational mode.

Preferred embodiments of the invention are implemented so that the first current-voltage relationship and the second current-voltage relationship can be caused by a variety of operating parameters, such as by applying a first gate bias potential and a second gate bias potential respectively to a gate terminal of the silicon based NDR device; and/or applying a first gating signal at a first clocking frequency and a second gating signal at a second clocking frequency respectively to the adaptive silicon based NDR device.

In some embodiments, the control signal is based on a power consumption mode/speed mode used in the integrated circuit, such that during the first operational mode the adaptive silicon based NDR device consumes less power (or operates more slowly) than during the second operational mode.

In memory cell embodiments, the control signal is a read/write command such that the first operational mode is related to a read or write operation, and the second operational mode is related to a quiescent storage operation. In logic circuits, the first operational mode is related to a normal power mode operation, and the second operational mode is related to a low power mode operation.

Other related aspects pertain to specifically altering (adjusting) a PVR for a circuit, so that an adaptive circuit is implemented. This is done by operating an adaptive NDR element with a first peak-to-valley ratio (PVR) during a first period in which the circuit is performing a processing operation; and operating the adaptive NDR element with a second PVR during a second period in which the circuit is not performing a processing operation, so as to reduce a current consumed by the adaptive NDR element. The first PVR can be controlled to be at least 50% greater than the second PVR, so that a peak-to-valley ratio (PVR) characteristic of the adaptive NDR element is adaptable to an operational requirement of the circuit.

In some embodiments, the circuit is a logic circuit, and the processing operation is a BOOLEAN logic function, such as an AND, NAND, OR, NOR, XOR, XNOR or NOT operation. In other embodiments, the circuit is a memory cell, and the processing operation is an access operation for a data value stored in the memory cell.

A related aspect of this of course is a method of making an adaptive semiconductor circuit. This includes generally forming a silicon-based adaptive NDR device which can operate with a first current-voltage relationship during a first time period and a second current-voltage relationship during a second time period. The first current-voltage relationship and the second current-voltage relationship are defined to be sufficiently different (i.e., differentiable by other circuitry in the system in a usable fashion) so as to permit the silicon based adaptive NDR device to have two distinct operational modes, including a first operational mode and a second operational mode respectively. A control circuit is then formed for switching the silicon-based adaptive NDR device between the first operational mode and the second operational mode.

In a preferred embodiment, a nominal peak-to-valley current ratio (PVR) is set in the silicon-based adaptive NDR device during a manufacturing procedure. The nominal PVR can be adjusted by the control circuit, resulting in a dynamic, or adaptive PVR value.

In other variants, different adaptive NDR devices can be formed to have different adaptive PVR values. In some instances, of course, they may have a common nominal PVR value for simplifying manufacturing.

A semiconductor circuit that has adaptive behavior includes an adaptive silicon-based NDR device which is adapted to operate with a first current-voltage relationship during a first time period and a second current-voltage relationship during a second time period. As before, the first current-voltage relationship and the second current-voltage relationship NDR characteristic are sufficiently different so as to permit the adaptive silicon based NDR device to have two distinct operational modes, including a first operational mode and a second operational mode respectively. A control circuit for switching the adaptive silicon-based NDR device between the first operational mode and the second operational mode coordinates the PVR transitions. In some instances, different control circuits for different types of NDR devices can be employed.

Still other aspects of the invention pertain to testing and stressing NDR devices, either as a way to enhance their reliability, and/or as a technique for improving actual operational parameters, such as switching speed. This can be done during or after manufacturing operations are completed, and in some cases, even in the field.

Thus, a first method of making a semiconductor device according to this aspect of the invention comprises the steps of: forming a charge trapping region for the semiconductor device during a first manufacturing operation; forming charge traps in the charge trapping region during a sequence of second manufacturing operations, including introducing and distributing impurities within the charge trapping region in a first distribution and a first concentration; applying activation energy to the semiconductor device after the traps are completed to cause a stress current to flow in the semiconductor device, the stress current being adapted to permanently increase the first concentration of charge traps and/or permanently alter the first distribution charge traps in the charge trapping region. In this manner, an operational performance of a charge trap device can be improved in many instances, because new traps, or traps closer to an interface, can be exploited for operation of such devices.

In a preferred embodiment, the semiconductor transistor device is a negative differential resistance device, such as a field effect transistor adapted with a negative differential resistance characteristic. The activation energy is applied as an electrical bias to source, gate and drain regions of a field effect transistor (FET) to cause the stress current to flow in a channel of the FET. The stress current has a relatively high concentration of hot electrons. The hot electrons in turn create additional charge traps near an interface of the channel, and these traps are also engineered with an energy that is suited for only temporarily storing charge. The number of hot electrons, and their energy level, can be controlled precisely for any particular application.

In this fashion, an NDR PVR value, an onset voltage value, and/or a switching speed can be altered for an NDR device, even after manufacturing is completed. Given the nature of certain embodiments of the invention, it is even possible for certain NDR devices to improve in the field with use over time.

The embodiments can further take many other forms as concerns when the activation energy is applied. For example, in some cases, it is applied before an integrated circuit containing the semiconductor transistor device has completed all manufacturing operations. In other cases (or in addition) it can be applied at the end of manufacturing operations.

Further specifics of the testing process are also part of this aspect of the inventions, such as applying the activation energy based on a number of cycles and/or a period of time. Changes in electrical characteristics of the semiconductor device are then monitored. Depending on the results, the stress current is terminated or continued, in some instances with a higher activation energy. In fact, the stress current can be increased in a step-wise manner until a maximum stress current is imposed on the semiconductor device.

A related aspect therefore concerns a method of making a pre-stressed NDR devices as follows: forming a channel on a substrate for the NDR transistor device; and forming a charge trapping region proximate to the channel, the charge trapping region including a number of charge trapping sites distributed throughout the charge trapping region. Again, the charge trapping sites are configured with a trap concentration and trap distribution so that during normal operation of the semiconductor transistor device a first number of energetic carriers in the channel can be temporarily trapped to provide a negative differential resistance characteristic for the semiconductor transistor device. Thereafter, the semiconductor device is stressed before it is placed into normal operation so as to increase the first number of energetic carriers in the channel beyond that which would be present during the normal operation. This stressing step results in an increase to the trap concentration and/or an alteration to the trap distribution in the charge trapping region before the semiconductor transistor device has completed manufacturing operations.

In still other embodiments, the concentration of charge trapping sites occurs even during normal operation of the semiconductor transistor device in the field to alter an NDR characteristic. This can result in improved switching time for the semiconductor transistor device even after manufacturing is otherwise completed.

BRIEF DESCRIPTION OF THE DRAWINGS

FIG. 3B is a plot of the impurity concentration vs. depth in one embodiment of the NDR FET;

FIG. 4 depicts the overall steps used in a preferred process to make NDR devices, including an NDR FET of the present invention;

FIGS. 5 to 16 generally illustrate the steps used in a preferred embodiment of an NDR device manufacturing process of the present invention.

FIG. 5 shows a schematic cross-sectional view of a starting substrate used to manufacture an NDR element—including a preferred NDR FET embodiment of the present invention—as well as other conventional semiconductor elements and devices;

FIG. 6 is a schematic cross-sectional view showing the step of forming electrically isolated active areas in surface regions of the substrate;

FIG. 7 is a schematic cross-sectional view showing the step of forming a sacrificial insulating layer on the surface of the substrate in an area where an NDR FET of a preferred embodiment is to be formed;

FIG. 8 is a schematic cross-sectional view showing the step of selectively introducing a first type of impurities into the surface of the substrate in an area where an NDR-FET of a preferred embodiment is to be formed;

FIG. 9 is a schematic cross-sectional view showing the step of selectively introducing a second type of impurities into the surface of the substrate in an area where an NDR-FET of a preferred embodiment is to be formed, as part of a counter-doping step;

FIG. 10 is a schematic cross-sectional view showing the step of forming an additional insulating layer on various regions of the surface of the substrate where active devices, including NDR FET and other conventional FETs, are to be formed;

FIG. 11 is a schematic cross-sectional view showing the step of depositing a gate film for both NDR FETs and conventional FETs;

FIG. 12 is a schematic cross-sectional view showing the step of patterning the gate film into gate electrodes for both NDR FETs and conventional FETs;

FIG. 13 is a schematic cross-sectional view showing the effects of one or more post-gate oxidation anneal steps used to increase a density of charge traps at a channel interface of the NDR FET of a preferred embodiment;

FIG. 14 is a schematic cross-sectional view showing the step of forming source and drain extension regions with an Arsenic implant;

FIG. 15 is a schematic cross-sectional view showing the step of forming more heavily doped source/drain contact regions for an NDR FET and other conventional FETs;

FIG. 16 is a schematic cross-sectional view showing the final results of depositing an electrically insulating interlayer film, forming contact holes in the interlayer film, and depositing a metal layer and patterning the metal layer to form interconnections to the NDR-FET and conventional FETs.

FIGS. 17A-17K are charts, graphs and other depictions of experimental data obtained for various embodiments of an NDR FET device.

DETAILED DESCRIPTION OF THE INVENTION

A preferred embodiment of the invention is now described with reference to the Figures provided herein. It will be appreciated by those skilled in the art that the present examples are but one of many possible implementations of the present teachings, and therefore the present invention is not limited by such.

The present invention is expected to find substantial uses in the field of integrated circuit electronics as an additional fundamental "building block" for digital memory, digital logic, and analog circuits. Thus, it can be included within a memory cell, within a Boolean function unit, and similar such environments.

Brief Summary of Prior Art

Figure 1:
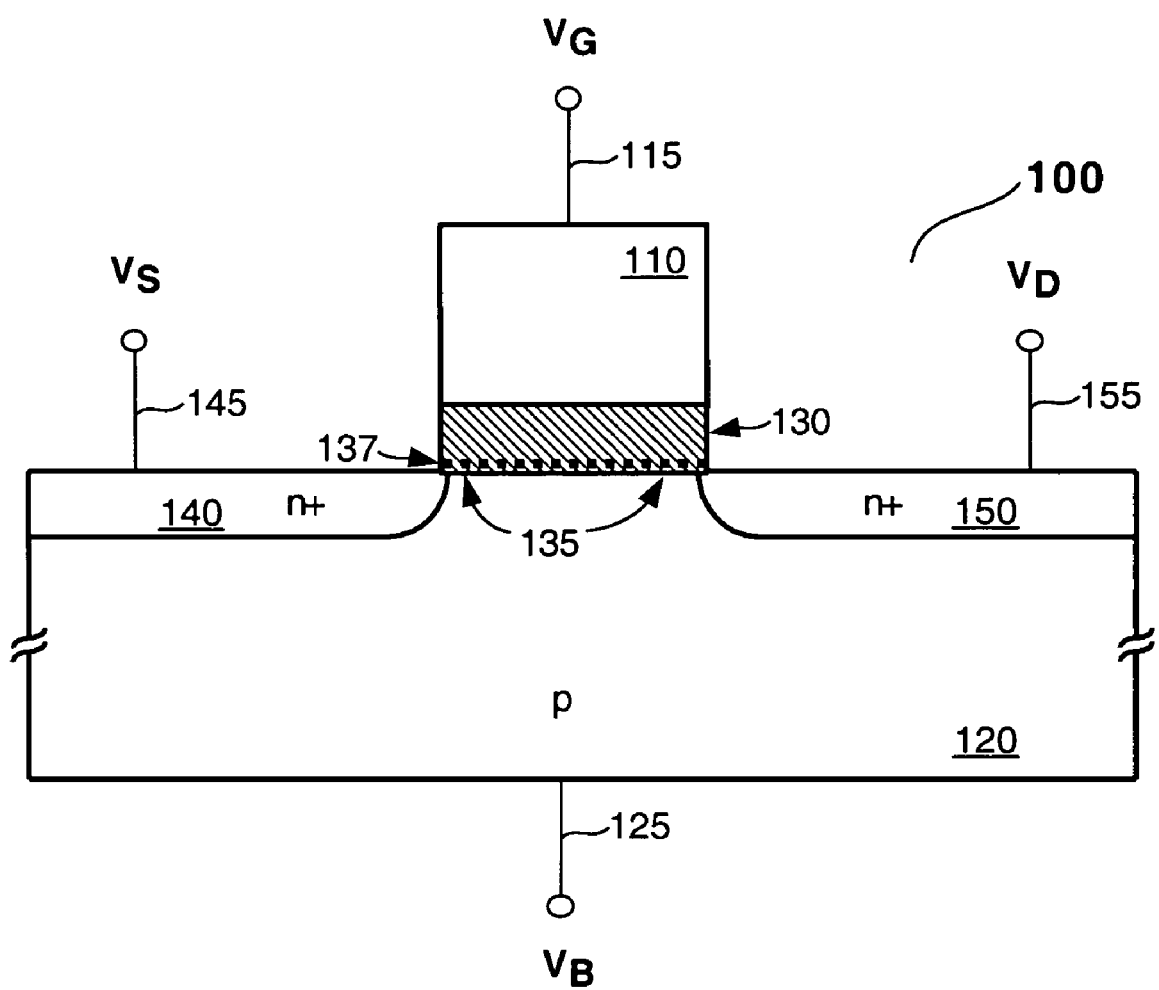
FIG. 1 is a cross-sectional view of a preferred embodiment of a negative differential resistance (NDR) field effect transistor (FET) of the present invention.

FIG. 1 shows a prior art NDR FET 100 of the type described in the King et al. applications noted earlier. This, device is essentially a silicon based MISFET that includes an NDR characteristic as well. Thus, the features of device 100 are created with conventional MOS based FET processing, modified where appropriate as to include operations for effectuating an NDR behavior.

Accordingly, in FIG. 1, a gate electrode 110 is coupled to a gate terminal 115 for receiving a gate select signal. The device 100 is formed within a substrate 120 (preferably p-type) and includes a well-known source 140 and drain region 150 coupled by a channel 135. A body contact terminal 125 provides a body bias to device 100, and source/drain voltages are provided through conventional source/drain terminals 145 and 155 respectively. A gate insulator layer 130 is situated between channel 135 and gate electrode 110. Again, these features are all common to most standard MISFETs; additional conventional features (such as retrograde substrate doping, "halo" or "pocket" doping, gate-sidewall spacers, shallow source and drain junctions) are not shown for purposes of better illustrating the nature of the invention.

The additional features in device 100 which are somewhat different from a conventional FET and which impart an NDR behavior include the following: (1) a slightly thicker gate electrode 130; (2) a lightly p-type doped channel surface region; and (3) a charge trapping region 137. These modifications cooperate to impart an NDR behavior to such FET for reasons set out in detail in the aforementioned King et al. applications.

Figure 2:
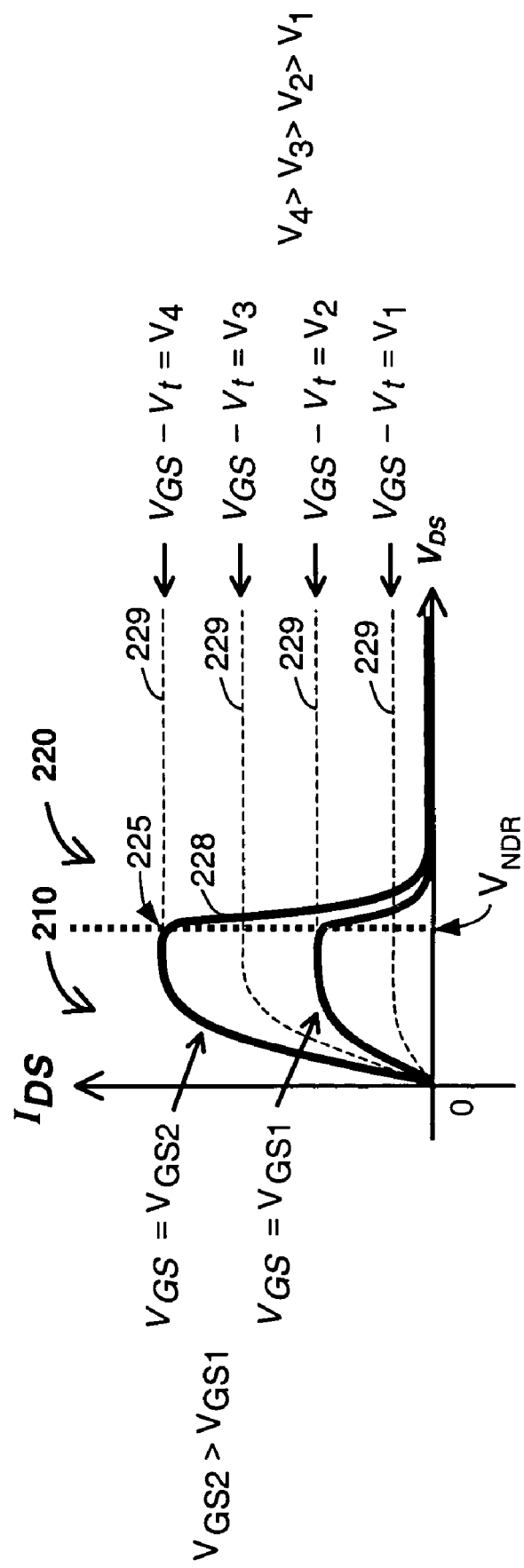
FIG. 2 is a representative plot of the current-vs.-voltage characteristic of the NDR FET of FIG. 1.

This behavior is illustrated in FIG. 2, where device drain current versus drain voltage is plotted for two different gate voltages to show how an NDR mode can be affected by a suitable selection of a gate voltage as well. It can be seen that for a fixed gate voltage $V_{GS}$ relative to the source, a drain current $I_{DS}$ firstly increases in a first region 210 with drain-to-source voltage $V_{DS}$, similarly to the behavior that is seen in drain current in a conventional n-channel MOS transistor. However, in region 220, beyond a certain drain voltage level, drain current decreases with further increases in voltage, i.e. the device exhibits an NDR mode with NDR characteristics. The drain voltage at which the drain current begins to decrease (i.e., point 225 where $V_{DS}=V_{NDR}$) is adjustable through suitable selections of impurity species, channel length, threshold voltage, etc.

As seen also in FIG. 2, the invention can be seen as exploiting the fact that, as the threshold voltage $V_t$ dynamically increases (because of the accumulation of trapped charges) with increasing drain-to-source voltage $V_{DS}$, a drain current $I_{DS}$ (which is proportional to $V_g-V_t$) will decrease. Thus, a current value depicted in curve 228 will generally follow the set of continuous curves 229 shown in FIG. 2 for a given $V_g$ and varying $V_t$. Unlike other prior art devices, the so-called "peak-to-valley ratio," a key figure of merit in NDR devices, as well as the NDR onset voltage, can also be precisely tuned through suitable combinations of impurity species, doping concentrations, device geometries and applied voltages. Furthermore, an NDR behavior of the present invention can achieve a PVR well in excess of 100, 1000, or even $10^6$ across a wide temperature range (−40° C. to +150° C.), which far exceeds the capabilities of conventional NDR devices.

It will be appreciated by those skilled in the art that the entirety of the preceding description is merely provided by way of background to better illustrate the context of the present inventions, and thus, by necessity, is somewhat abbreviated. It is not intended to be, nor should it be taken, as a complete analysis of the structural, operational or physical of the aforementioned King et al. inventions. Nor should it in any way be construed as limiting in any way of the inventions disclosed therein.

Trap Energy Characteristics

Figure 3A:
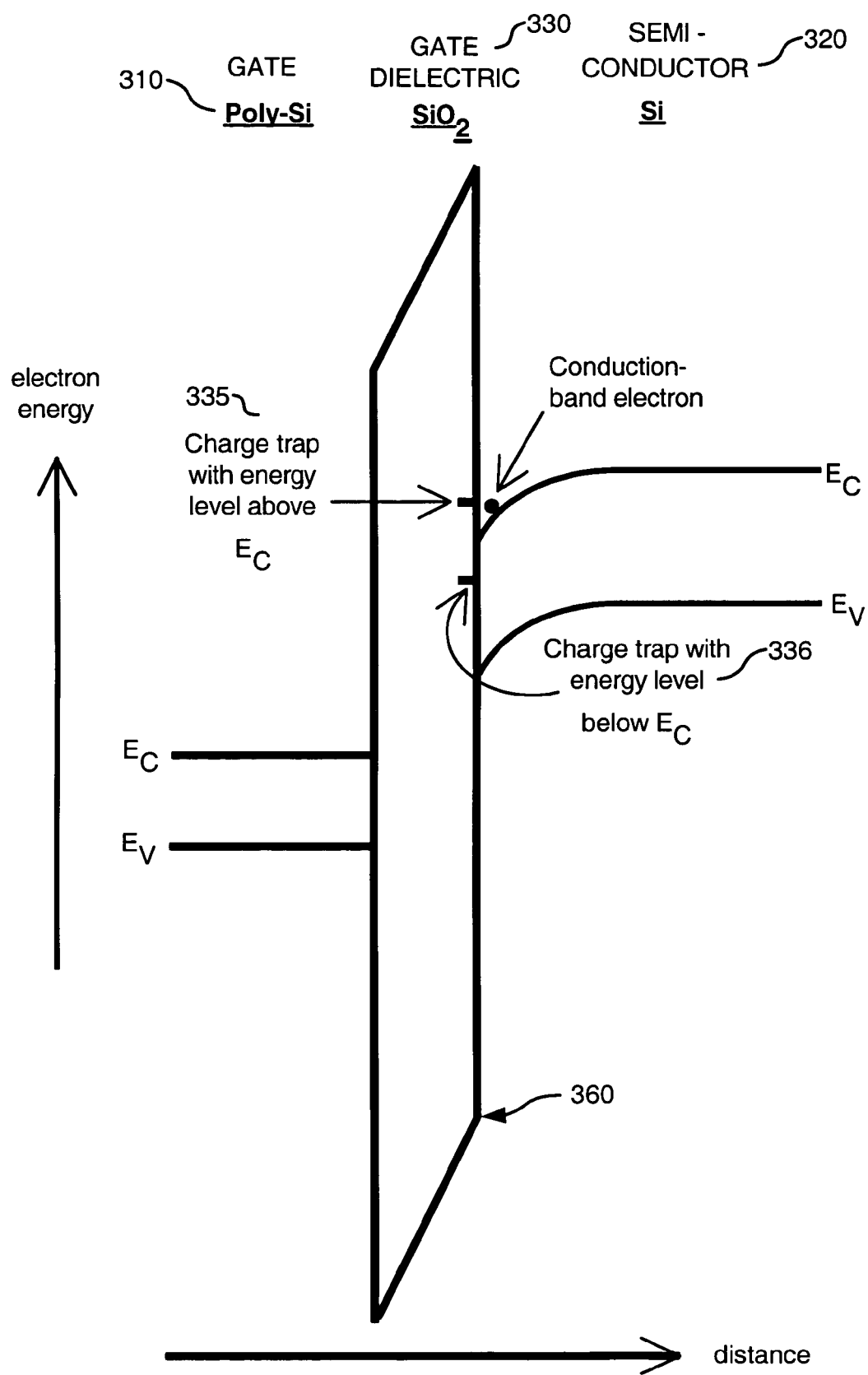
FIG. 3A is a band diagram generally illustrating the energy relationship of conduction bands, valence bands and charge trapping sites of a charge trapping region, including variants which can be used in a preferred embodiment of the present invention.

FIG. 3A illustrates a preferred energy-band diagram (electron energy vs. distance in the direction perpendicular to a semiconductor surface) of device 100 depicted in FIG. 1. When a gate bias is applied, an inversion layer of electrons is formed at the semiconductor surface, i.e. the FET is turned on. A gate 310 is shown to be heavily doped polycrystalline-silicon (poly-Si), a gate dielectric 330 is shown to be $SiO_2$, and a silicon semiconductor substrate 320 is p-type as is the case in modern CMOS technologies. Again, it will be understood that other materials known in the art can be substituted instead.

A lower edge $E_c$ of the conduction band of allowed electron energy states for semiconductor material 320 is shown, as well as an upper edge $E_v$ of a valence band of allowed electron energy states. Conventional device physics theories mandates that there are no allowed electron energy states within a band gap corresponding to a range of energies from $E_v$ to $E_c$. Accordingly, no mobile electron in semiconductor material 320 can have an energy within this range.

As seen in FIG. 3A, a conduction-band electron in a channel region (near an interface of gate dielectric 330 and semiconductor substrate 320 must lose energy (e.g. via a lattice collision) in order to become trapped by a first type of charge trap 336 which has an energy level below $E_c$. Afterwards, it must be supplied with energy (e.g. from lattice vibrations) in order to be detrapped back into the conduction band in silicon semiconductor substrate 320. For reasons, which are apparent from the aforementioned King et al. applications, this type of trap, therefore, is not particularly useful for effectuating an NDR characteristic.

In contrast, a second type of charge trap 335, which has an energy level very near but above $E_c$ can trap a conduction-band electron with total energy equal to its energy level, without requiring a lattice collision. Of course, charge trap 335 has an additional benefit in that it can also trap conduction-band electrons which have energies higher than an energy level of such trap. For these second type of traps, a trapped electron can easily move back into an allowed energy state in the conduction band, and hence it is easily detrapped. These second types of traps are particularly suited for adapting a conventional FET to operate with an NDR characteristic. In will be noted that interface traps which are energetically located well above the semiconductor conduction band edge (not shown) will have no effect on FET performance until a significant percentage of the mobile carriers in the channel have sufficient kinetic energy to become trapped.

Thus, a preferred primary mechanism for achieving NDR behavior in an insulated gate field-effect transistor is to trap energetic ("hot") carriers from a channel with traps that also rapidly de-trap. The traps should be configured preferably so that a trap energy level should be higher than the semiconductor conduction band edge, in order for it to primarily (if not exclusively) trap hot carriers. For example, a trap which is energetically located 0.5 eV above the semiconductor conduction band edge can only trap electrons from the semiconductor which have kinetic energy equal to or greater than 0.5 eV. For high-speed NDR FET operation, it is desirable to have the carrier trapping and de-trapping processes occur as quickly as possible, as this permits a rapid and dynamic change in a threshold voltage for the FET.

Thus, the King et al. NDR device uses tunneling to a charge trap, and not tunneling to a conduction band per se as required in some conventional NDR devices such as tunnel diodes. All that is required is that the carriers be given sufficient energy to become trapped in localized allowed energy states within one or more dielectric layers (including for example a gate insulator layer made up of conventional dielectric materials). It is not necessary to set up a complicated set of precisely tuned layers in a particular fashion to achieve a continuous set of conduction bands as required in conventional NDR devices, and this is another reason why such invention is expected to achieve more widespread use than competing technologies.

Finally, the physical distribution of such traps is also described in the King et al. applications, and an approximate illustration of the same is shown in FIG. 3B. This chart illustrates a general relationship between charge trap concentration and distance. The left side of the graph represents a bulk region of a trapping layer (in this case gate dielectric 330), which as can be seen, preferably has a very low concentration of charge traps (i.e., something less than $10^{16}$ atoms/cm$^3$. The concentration increases rapidly near an interface 360, and the latter contains a maximum concentration of impurities (in this case Boron as noted with circles) useable as charge traps, preferably in excess of $10^{19}$ atoms/cm$^3$, and most preferably in excess of $10^{20}$ atoms/cm$^3$. The concentration of Boron then decreases and is less again on a substrate side 320. The areal concentration of traps should not be excessive, however (i.e., greater than $10^{14}$/cm$^2$), because this can also lead to undesirable electron conduction between the source and drain via trap-to-trap hopping or channel-to-trap-to-channel hopping.

As can be seen in FIG. 3B, a majority of the charge traps should be placed in close proximity to the channel, i.e. within 0.5 nm to 1.5 nm of the gate-dielectric/semiconductor interface, or tight at the interface itself This can be achieved using a low-energy implant of Boron at approximate dose of 2 to $3*10^{14}$ atoms/cm$^2$. It will be understood by those skilled in the art that the above figures are merely representative, and it is expected that such values (distances, concentrations) will vary in accordance with a particular process geometry, device operational requirements, etc. Thus, the present invention is not limited to any particular arrangement of such traps. A triangle symbol designates an overall "net" p-type doping in the channel which, for reasons set forth herein, should not be too highly doped p-type, as this will undesirably increase a threshold voltage.

In operation, a trapping/de-trapping mechanism preferably starts at a drain end of the channel, and proceeds towards a source side of the channel, to rapidly shut off the transistor. This is a result of the fact that the electrons have a maximum kinetic energy by the time they teach the drain side of the channel, and thus are more likely to be trapped first in that region. As the voltage on the drain increases past $V_{NDR}$, the electrons will acquire more and more energy as a result of the increased field, at locations closer to the source. It can be seen from this mechanism as well that the NDR FET has good scaling capabilities, because as a channel length shortens, the trapping/detrapping mechanism can "switch" the transistor off even more rapidly.

This extra degree of freedom—i.e. the ability to independently control a FET channel conductivity through a source/drain bias voltage (in additional to the conventional gate voltage modulation) provides yet another example of the advantages presented by the present invention. Furthermore, this particular channel shut-off mechanism scales as well or better than conventional MOSFET turn-off techniques, which, as is well known, must rely on thinner and thinner oxides (or esoteric materials) to achieve a sufficiently large field to deplete the channel of carriers in the conventional fashion (i.e., through an applied gate voltage).

Overview of Process Flow

A preferred process flow for manufacturing an NDR device that is integrable into a conventional MOS manufacturing process is illustrated in FIG. 4. The advantage of such process, as described in earlier applications assigned to the applicant, is that additional conventional non-NDR circuitry (memory and logic) can thus be manufactured at the same time.

Thus, as shown in FIG. 4, an initial substrate is chosen at step 405, which in a preferred embodiment is silicon, but which could be silicon germanium, silicon on insulator, strained silicon, silicon carbide, or any other desired material. Of course it will be understood that if a non-silicon substrate were selected to implement the present inventions, many of the processing steps below would have to be modified in accordance with well-understood principles known to skilled artisans in this field of art.

At step 410 isolation regions are formed in the substrate, which, in a preferred approach are shallow trench isolation (STI) regions. At step 415, a sacrificial oxide layer is grown. At step 420, P wells and N wells are formed in the substrate as well.

At step 425, impurities are introduced into NDR device regions, designed to facilitate a trapping/de-trapping mechanism noted earlier. Again, a variety of techniques are available for doing this as referenced in the aforementioned King et al. applications, including, for example, a relatively high dose implantation of boron (in excess of $1*10^{14}$ atoms/cm$^2$) into channel regions of NDR FETs.

At step 430, an optional NDR channel counter-doping step (n-type dopant implant) is performed, to counter some of the effects of a NDR trap implant, and thus reduce a net p-type channel doping concentration. This results in lowered voltage thresholds, a steeper subthreshold swing, and correspondingly higher PVR values.

At step 435, an optional thermal anneal is performed, to remove damage to the semiconductor crystal lattice and thereby ensure proper distribution and concentration of the traps within a trapping region step. This is done to ensure that the traps do not migrate too far into the trapping region, causing excessive leakage, slow operation, and poor reliability.

At step 440, the sacrificial oxide layer is optionally selectively removed and a gate insulator is formed which can be used for both an NDR FET and a regular FET. This insulator can be comprised of multiple layers of dielectric materials, and can be of different thickness and composition in an NDR FET region than in a regular FET region.

At step 445, an optional thermal anneal is performed (preferably a rapid thermal anneal, or "RTA"), to increase a density of charge traps at a channel/insulator interface.

At step 450, a gate electrode is formed which, again, can be used for both an NDR FET and a regular FET.

At step 455, an optional post gate-etch re-oxidation anneal is performed to further modify (if needed) a distribution and density of charge traps at a channel/insulator interface and/or to heal the gate insulator in the regions along the edges of the gate electrodes.

At step 460, a "lightly doped drain" (LDD) implant is performed to form shallow source and drain regions (which can be for either/both NDR and non-NDR FETs).

At step 465, an optional anneal is performed to repair any damage to the semiconductor crystal lattice caused by the LDD implant;

At step 470, spacers are formed (which can be for either/both NDR and non-NDR FETs) along the sidewalls of the gate electrodes to offset the deep source/drain contact regions.

At step 471, optional raised source and drain contact regions are formed, preferably by selective epitaxial growth of silicon or a silicon-germanium alloy, which can be for either/both NDR and non-NDR FETs.

At step 475, a high-dose source/drain implant step is performed to form heavily doped source/drain contact regions, which, again, can be for either/both NDR and non-NDR FETs.

At step 480, an anneal is performed to repair any damage caused by the source/drain implant and to activate the implanted dopant atoms.

At step 485, an optional silicidation process module is used to form low resistance contacts as required at gate and/or source/drain regions—again, for either/both NDR and non-NDR FETs.

At step 490, an electrically insulating passivation layer is deposited and holes are formed within this layer to allow electrical contact to regions of either/both NDR and non-NDR FETs.

At step 495, electrical interconnections (which can be made using copper, aluminum, or other low resistivity material) are formed over the NDR and non-NDR FETs to complete wiring of the devices and form an integrated circuit. Such interconnections can be formed with multiple layers of conductive material separated from each other by interposing insulating layers with holes ("vias") to allow for selective electrical connection between layers.

Final passivation layers are then typically added in the back end of the manufacturing process as well.

A further detailed description now follows for those steps above which are more germane to the present invention. As many of these steps are conventional, however, they are not explained herein in detail. Many of the particular structures, and formation steps for these layers and regions will depend on desired performance characteristics and process requirements, and thus a variety of techniques are expected to be suitable. Furthermore, while examples of various techniques are presented herein for a manufacturing process embodying the present invention, it will be understood by those skilled in the art that these are merely exemplary of current state of the art approaches. Thus, the present invention is intended to encompass other yet-to-be developed processes currently unknown to the inventor over time that may replace such techniques and yet still be entirely suitable for use with the present invention.

Details of Process Flow

FIGS. 5 to 16 generally illustrate the detailed operational steps used in a preferred embodiment of an NDR device manufacturing process of the present invention.

In particular, FIG. 5 shows a schematic cross-sectional view of a starting substrate used to manufacture an NDR element (in accordance with step 405 described earlier)—including a preferred NDR FET embodiment of the present invention—as well as other conventional semiconductor elements and devices. As seen in FIG. 5, a preferred substrate 1000 consisting substantially of silicon (Si) is prepared. Because the NDR-FET and IGFET are n-channel devices, the portions of the substrate in which the NDR-FET(s) and IGFET(s) are to be formed are preferably p-type.

In this regard it will be understood that starting substrate 1000 in FIG. 5 could also refer to a p-type well formed in the surface (within the top 1000 nm) of a starting substrate by ion implantation and/or diffusion, either before or after the definition of "active" areas, in any number of known techniques known to those skilled in the art. It should be noted that substrate 1000 could also be silicon-on-insulator (SOI), and may eventually contain one or more additional layers of silicon-germanium alloy material or silicon carbide material (not shown). When selecting these latter substrates, of course, those skilled in the art will appreciate that the later processing steps described below would have to be modified in well-known ways to accommodate such change.

FIG. 6 is a schematic cross-sectional view showing the step of forming electrically isolated active areas in surface regions of the substrate (in accordance with step 410 described earlier) including in a first area 1015 where an NDR element (such as an NDR FET) is to be formed, and a second area 1015' where a non-NDR element (such as a conventional FET) is to be formed. To better emphasize the present teachings, in FIG. 6 (and other figures below) the later processing steps are shown in a "split" view to help explain the different impact and result on NDR regions and non-NDR regions across the substrate 1000 for various operational steps described herein. It will be understood by those skilled in the art that these figures are not intended to be to scale, and that actual substrate profiles will likely deviate (perhaps significantly) in an actual manufacturing embodiment. Nonetheless they are helpful to understand the important aspects of the present invention.

Consequently, in FIG. 6, electrically isolated "field" areas 1010 in a surface of substrate 1000 are formed by any of several current well-established techniques, including local oxidation of silicon (LOCOS) and/or shallow trench isolation (STI). The thickness of an isolation oxide layer 1010 typically falls in a range from 100 nm to 700 nm, while a depth of shallow trench isolation structures typically falls in the range from 100 nm to 1000 nm. Other later developed techniques will be useable with the present invention as well.

Moreover, it should be noted that the precise details of these areas are not critical to the operation of the present invention, but a significant advantage of course lies in the fact that such structures (however formed) can be share by both conventional active devices as well as the NDR devices in accordance with the present teachings. Of course, in some applications it may not be necessary to use such types of isolation regions, and the present invention is by no means limited to embodiments which include the same.

A sacrificial oxide layer 1018 is then grown. It will be understood by skilled artisans that since steps 415 and 420 are conventional and not material to the present teachings, that consequently, they are not explained in detail herein. Additional conventional processing steps (threshold adjusts for example, other insulating layers, or etch stop layers, or plasma/heat treatments) that are incidental to the present teachings are also omitted to better explain the present invention.

Figure 7:
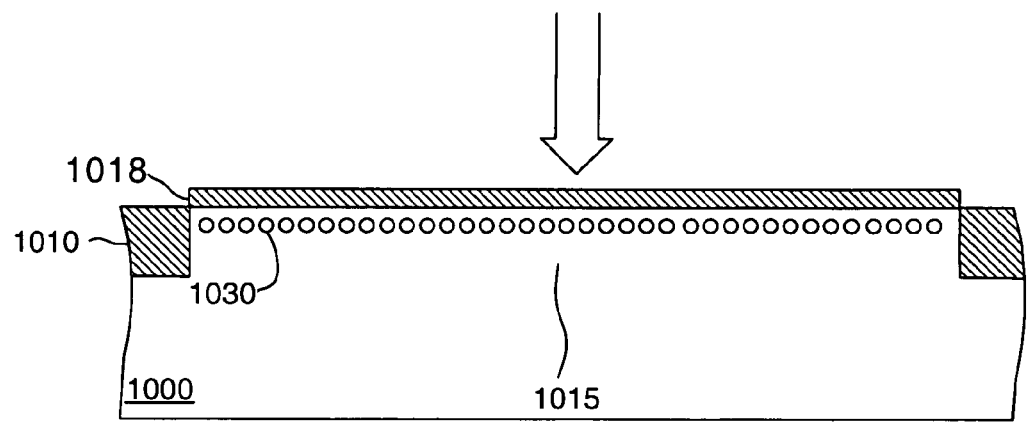

Accordingly, as seen in FIG. 7, an ion implantation step is performed (as part of step 425 noted earlier) of an impurity species (such as Boron) (shown as circles 1030) through sacrificial oxide layer 1018 at a dose of approximately 2 to $3*10^{14}$ atoms/cm$^2$. For reasons set out in the prior King et al. applications, it is preferable to introduce charge traps at or near an interface of substrate 1000, in those areas 1015 where an NDR element is to be formed. This can be accomplished by one of several known approaches, including ion implantation and/or diffusion of an appropriate species, or deposition of a trap-containing dielectric layer.

While Boron introduced by an implant is preferably used herein, other elemental species may be used as charge traps as well, including silicon, indium, arsenic, phosphorus, antimony, fluorine, chlorine, germanium, or a metallic species. In some instances it may be possible form traps using water (from a steam ambient) as well. Other mechanisms for introducing the impurities can also be used, such as deposition of a layer of material containing the charge traps or charge-trapping species. For example, a doped silicon film can be deposited and oxidized to form an oxide film containing a high density of charge traps.

An advantage of the present invention is that the onset of NDR behavior can be controlled through selecting a target trap energy level. In turn, the trap energy level can be engineered through suitable process control parameters such as through selection of a particular impurity species and/or trapping layer dielectric.

A mask can be used to selectively form the charge trapping region in those areas 1015 where an NDR element is to be formed, and in some instances so that it does not extend across an entire region 1015 of substrate 1000, but is instead limited to some smaller area corresponding to a later gate region of an NDR FET, or even a limited portion of such gate region. In some cases, for example, it may be desirable to form a trapping region only near a source region, or only near a drain region, depending on the expected device biasing and operational characteristics. To maximize "source side" trapping, for example, charge traps can be selectively arranged to extend from a source region, and not extend entirely through the channel to a drain side. A variable distribution of traps might be employed along a length of the channel so as to effectuate a trapping rate that varies correspondingly and results in a faster switching speed.

It is expected that routine experimentation will yield a variety of trap distributions for optimizing different characteristics of an NDR FET, such as switching speed, $V_{NDR}$, noise immunity, leakage, subthreshold swing, $V_t$, etc. Thus it will be understood by those skilled in the art that while it is shown as extending throughout all of region 1015, the invention is not limited to such implementations, and in fact a variety of charge trapping structures may be used advantageously for different applications.

Figure 8:
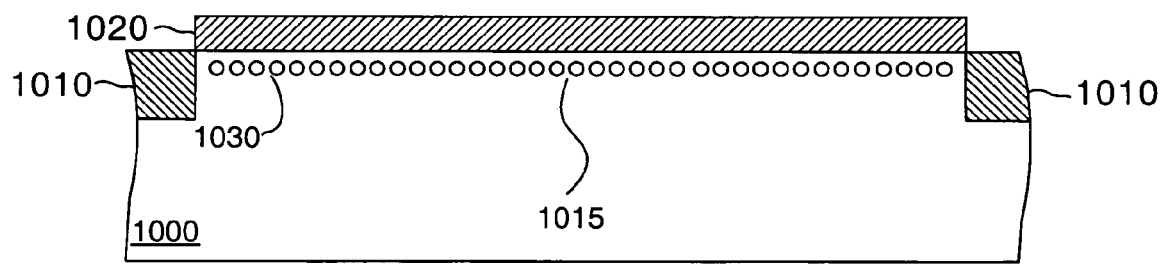

Thus, the present detailed description continues with a discussion of FIG. 8, which is a schematic cross-sectional view showing the step of forming an initial insulating layer (after sacrificial oxide layer 1018 is removed) on the surface of the substrate in a first region 1015 where an NDR FET of a preferred embodiment is to be formed as part of step 425 described above. This initial insulating layer 1020 functions as part of a gate insulator for a to-be-formed NDR FET, and can also serve as a charge trapping region for such NDR FET. It is formed on the surface of substrate 1000 in active areas 1015 by one of several well-known techniques, including thermal oxidation of silicon. Physical vapor deposition and chemical vapor deposition can also be used. This electrically insulating layer 1020 can consist entirely or in part of $SiO_2$, $SiO_xN_y$, $Si_3N_4$, or a high-permittivity dielectric material such as metal oxide or metal silicate or their laminates, or, of course, as a combination of one or more different material layers.

As with other processing steps noted herein, an advantage of the present invention lies in the fact that this layer (as patterned later) can be shared by both conventional and NDR FET devices. Alternatively viewed, from a process integration impact, the existence of such layer in non-NDR regions during these NDR FET formational steps does not negatively impact the structure, performance or reliability of any non-NDR elements. Nonetheless, in some applications it may be desirable to mask and etch layer 1020 in those areas where non-NDR elements are to be formed, so that charge trapping regions are not formed later across all regions of the substrate.

In an alternate embodiment, traps are formed by directly implanting the gate insulator layer 1020 using a combination of energies and species that ensure a high concentration at a channel interface and a low concentration in a bulk region of layer 1020.

In yet other embodiment, multiple charge trap formation steps could be employed, either as part of a standard process for making a single NDR device, part of a fine-tuning process, or even part of a standard process for making different kinds of NDR devices on the same substrate. For example, some traps could be introduced in the channel region before the gate insulator layer 1020, and some could be introduced after to achieve a target trap profile, including trap energy, trap concentration and trap distribution. The two different sets of traps could also be different impurities and/or implant species if it is desired to have multiple trap profiles, such as different trap energies to trap different types of charge carriers, or different trap types which trap/de-trap at different rates. In the case where different NDR devices are being made at the same time on a substrate, appropriate masking steps could be used to ensure that any additional subsequent trap formation operations are only performed for selected NDR devices.

Figure 9:
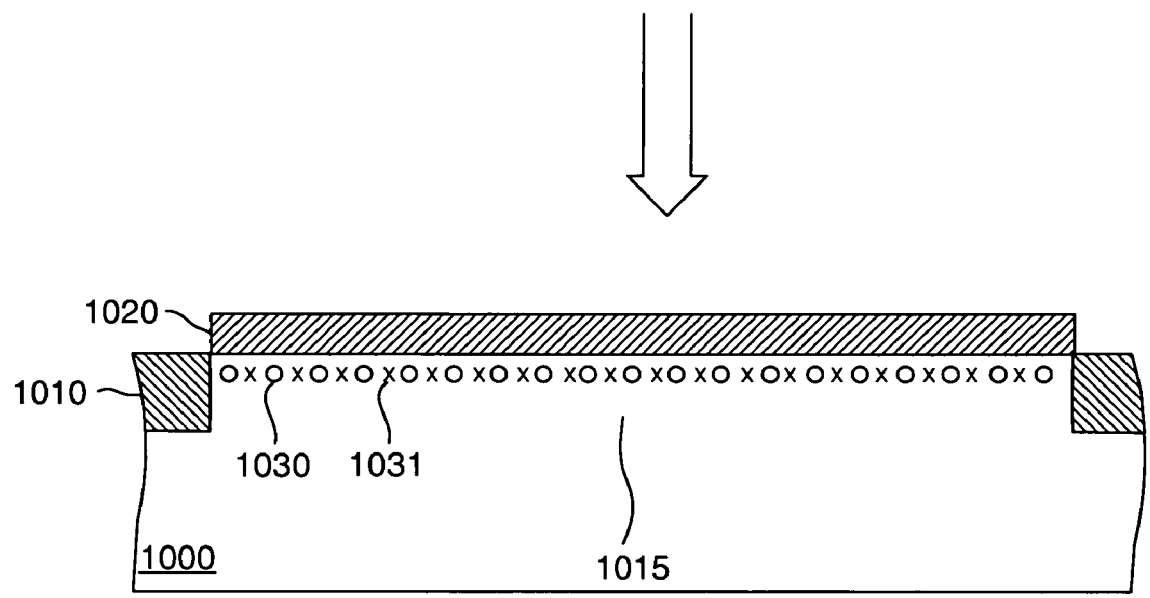

FIG. 9 is a schematic cross-sectional view showing the step of selectively introducing a second type of impurity (at least in regions 1015 where an NDR-FET of a preferred embodiment is to be formed) having an opposite conductivity to Boron as part of a counter-doping step 430 noted above. In a preferred approach, this second type of impurity is Arsenic (shown with an "x" 1031 in FIG. 9) implanted at a concentration of about $1*10^{14}$ atoms/cm$^2$ and at relatively low energy. This step has the effect of lowering a net p-type concentration later in a surface region of the channel of an NDR FET. This leads to improvements in both threshold ($V_t$) and sub-threshold swing (S) characteristics. In particular, a $V_t$ of an NDR FET can be reduced, and a steep subthreshold swing can also be realized, both factors which are critical for ensuring proper scaling performance in subsequent generations of submicron devices. These improvements can also be exploited in the form of lower gate bias voltages and larger PVRs for integrated circuit applications using the present inventions.

After the implantation step(s) (for traps and/or counter-doping) are completed, a thermal annealing step (corresponding to step 435 in FIG. 4) is preferably performed to reduce implantation-induced damage. This can be done In an inert ambient (Ar or $N_2$) or an oxidizing ambient ($O_2$ or $H_2O$) for a predetermined time (e.g., several hours) at a predetermined temperature (e.g., 550° C.). Other techniques (e.g. RTA), temperatures, and times will be apparent to skilled artisans from the present teachings and from routine experimentation for any particular implementation. The purpose of this step is to further ensure that the trap distribution will be concentrated at an interface with the channel, rather than within a bulk region of trapping layer 1020.

In the absence of an anneal step, for example, Boron may undesirably diffuse rapidly with the aid of point defects into a bulk region of the trapping layer, resulting in a high level of gate leakage current. It is preferable to have a high concentration of traps at a channel/gate-insulator interface, and a relatively low concentration in a bulk region of the gate insulator. These concentrations should preferably be at least two or three orders of magnitude in difference measured in terms of atoms per cubic centimeter. By keeping the trapping sites in this region (i.e., within about 0.5 nm of the channel interface) gate leakage current is further minimized. The size of this region will vary, of course, from geometry to geometry for any particular generation of process technologies.

Other generally accepted techniques for reducing such implant damage that are known in the art (at this time or later developed) will also be equally useable with the present invention. Again, it will be understood by those skilled in the art that a trap formation process that does not use an implant, or does not result in excessive trap sites in the bulk of the gate region, will not necessarily require such an annealing step. For example, as discussed herein, if the traps are implanted (placed) directly through the gate layer at a later time, their distribution can be concentrated in a particular region through a suitable selection of energies. Alternatively, a composite gate oxide can be used (i.e., an implant, a thermal oxidation, and then a deposition; or a deposition, an implant, and then a thermal oxidation) to incorporate the traps at an interface using a thermal cycle instead. Further variations will be apparent to those skilled in the art from the present teachings.

In any event, at least in those implementations where trapping layer 1020 is formed over the entire substrate, it is then selectively removed (not shown) from the areas where conventional FETs are to be formed (region 1015'), and from any other areas (including in region 1015) where it is not needed/desired.

Figure 10:
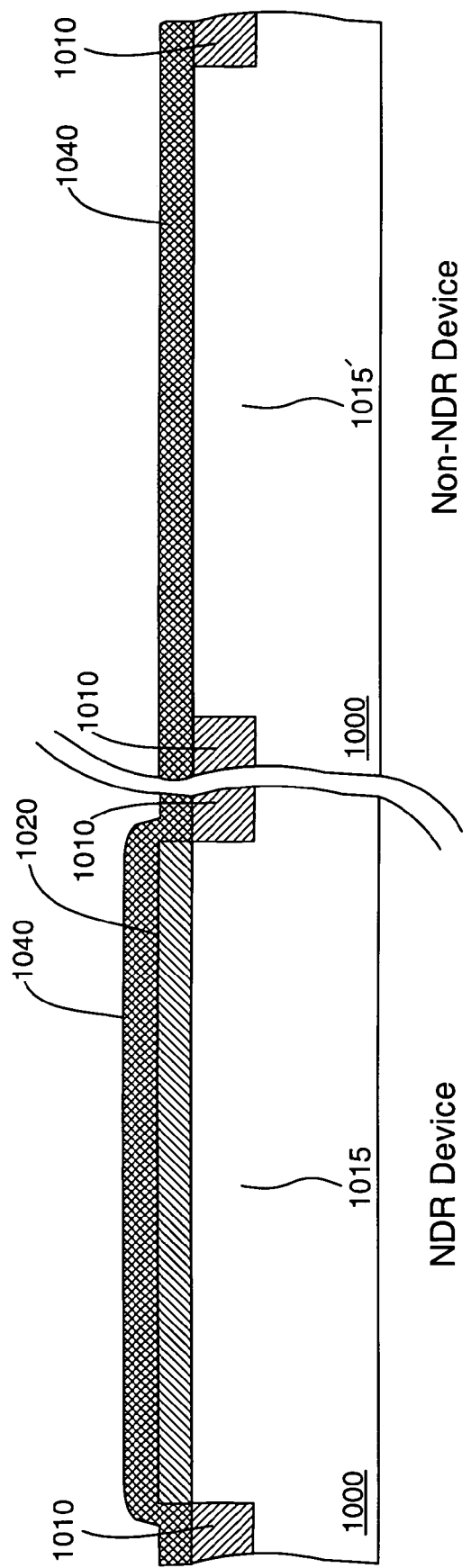

FIG. 10 is a schematic cross-sectional view showing the step of forming an additional insulating layer 1040 on substrate 1000 to serve as a high quality gate insulator for both NDR FET and other conventional FETs (corresponding to step 440 in FIG. 4). Gate insulating film 1040 can be formed by one of several techniques, including physical vapor deposition and chemical vapor deposition. Gate insulating film 1040 can consist entirely or in part of $SiO_2$, $SiO_xN_y$, $Si_3N_4$, combinations of the same, or a high-permittivity dielectric material such as metal oxide or metal silicate or their laminates.

If the gate insulating layer 1040 is formed by thermal oxidation, then it may be located beneath layer 1020, and may be thinner in the areas where NDR FETs are to be formed (region 1015) than in other areas (including in region 1015'). In this case, the layer 1040 will serve as the charge trapping layer rather than as a high-quality gate insulator, with charge traps formed via the incorporation of impurity species during the thermal oxidation process or subsequent process steps.

It should be noted that additional layer 1040 is unnecessary in those cases where conventional FETs are not being made at the same time, because a single oxide layer can be grown with sufficient thickness of course as part of layer 1020. Nonetheless, a composite gate is preferred in mixed embodiments of NDR and non-NDR FET elements to accommodate the need for additional gate insulators in the latter devices.

After the gate insulator is formed, an additional thermal annealing operation (corresponding to step 445 in FIG. 4) is preferably performed to further optimize a distribution of the charge traps — i.e. increase their concentration at a channel/gate-insulator interface. This operation is preferably performed with a rapid thermal anneal (RTA) at 1100° C. for a short time — i.e. between 1 and 10 minutes. Other temperatures and times will be apparent to skilled artisans from the present teachings and from routine experimentation for any particular implementation. The inventor has further determined that an RTA operation is superior to a conventional furnace operation (i.e., 1 hour at 1000° C. in a $N_2$ ambient) in terms of enhancing a distribution of trapping sites near the $Si/SiO_2$ interface.

As the distribution of trapping sites affects the ultimate peak-to-valley ratio (PVR) of the NDR device of the present invention, selection/control of this process step can be exploited to set such PVR to a target value. In other words, different applications requiring different PVRs could be manufactured by simply adjusting a time or temperature of an RTA, or by selecting an RTA operation over a furnace operation to increase a PVR value.

Figure 11:
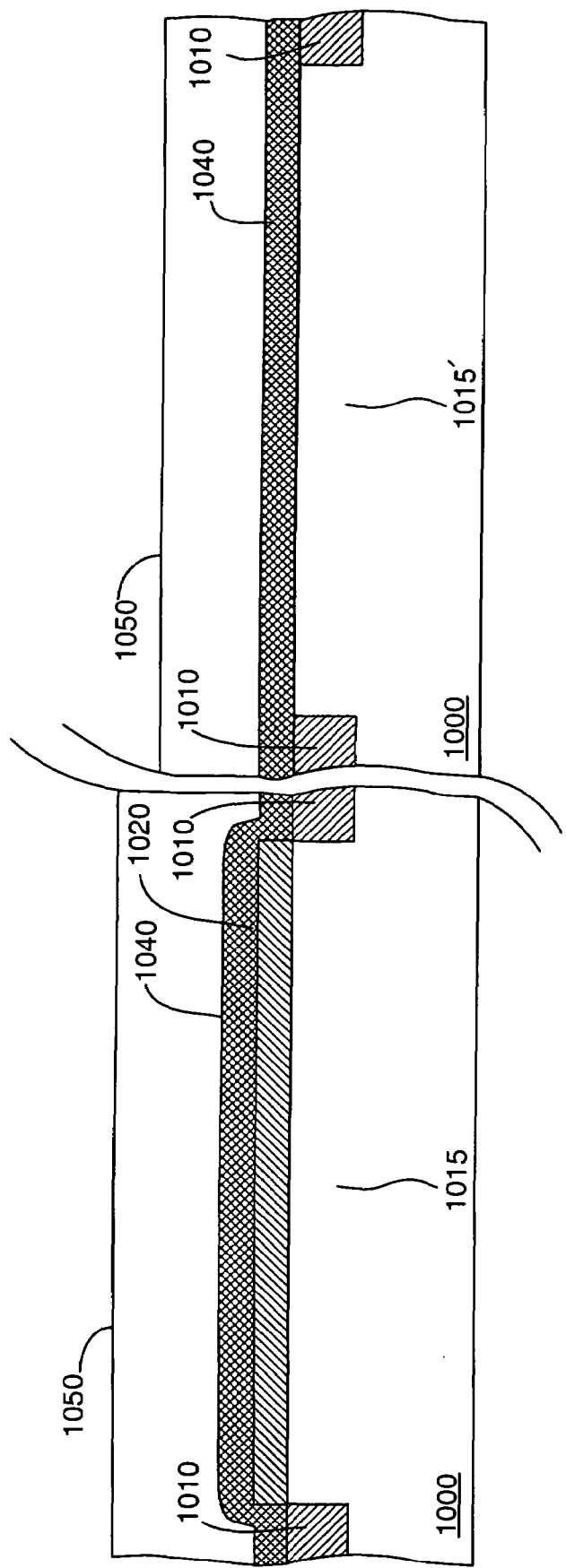
Figure 12:
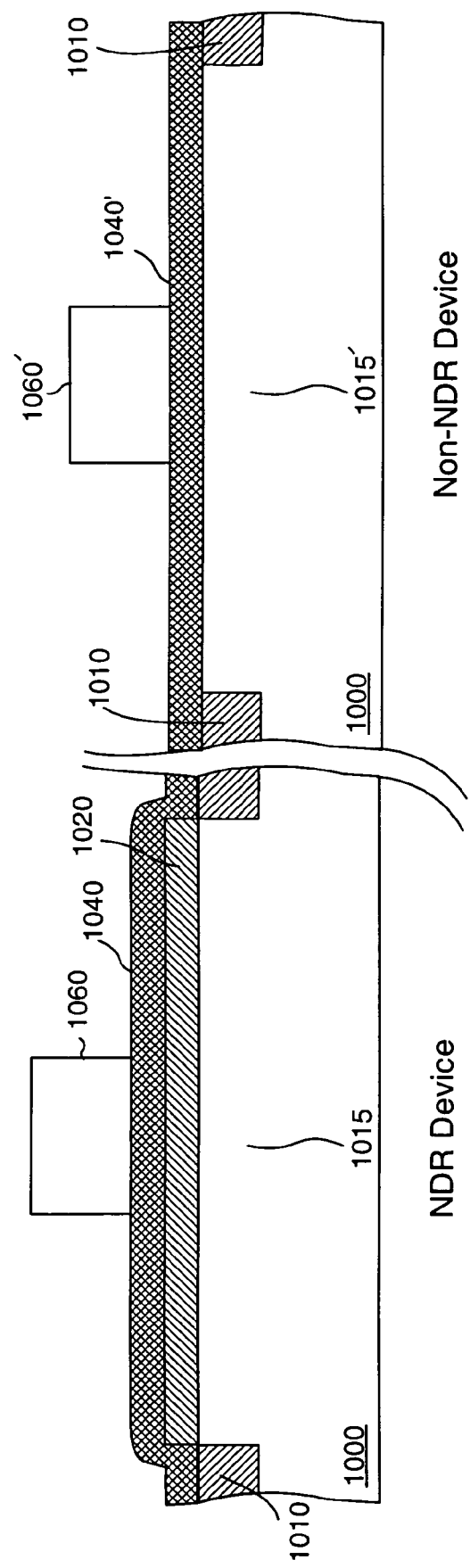

FIG. 11 is a schematic cross-sectional view showing the step of depositing a gate electrode layer 1050 for both NDR FETs and conventional FETs. The gate electrode material 1050 may be polycrystalline silicon (poly-Si) or a silicon-germanium alloy (poly-SiGe), or it may be a metal or metal alloy or conductive metal nitride or conductive metal oxide. An advantage of the present invention, again, is apparent because the gates of both NDR FETs and conventional FETs can be made of the same material, and formed at the same time.

If gate electrode material 1050 is poly-Si or poly-SiGe, it may be doped in-situ during the deposition process or it may be doped ex-situ by ion implantation and/or diffusion, to achieve low resistivity and a proper work function value. The final gate electrode also may consist of a multi-layered stack, with a lowest layer providing a desired gate work function and overlying layer(s) providing sufficient thickness and conductivity.

The gate electrode layer 1050 is then patterned using standard lithography and etching processes to form multi-layer gate electrodes 1060 and 1060' (FIG. 12) which corresponds to step 450 (FIG. 4). At this point, an optional post-gate-etch re-oxidation anneal operation (step 455 in FIG. 4) is performed in some instances to heal any damage to the gate insulator along the edges of the gate electrodes and possibly to further enhance a concentration (or formation) of charge traps.

While a steam anneal can be used (e.g., 10 minutes at 750° C. in steam ambient, followed by 1 minute at 1050° C. in $N_2$) for some embodiments, the beneficial aspects of such approach are not uniform across all implementations. In other words, while some thinner (i.e., 5.5 nm) gate insulator applications may benefit from such operation, other relatively thicker gate (i.e., 7 nm) insulator applications may not. This is because it is believed that while the steam may assist in forming new water based traps near an $Si/SiO_2$ interface, the temperature exposure also serves to counteract this effect by driving some of the trap-associated impurity atoms away from such interface into a bulk region. When the gate is relatively thick, this results in a greater migration/dilution of the trap concentration near the interface, thus resulting in reduced performance. Thus, the inventor believes that a conventional post-gate reoxidation anneal may be more useful for thinner gate oxides. Nonetheless, any comparable annealing mechanism that both creates new traps and yet minimizes diffusion of existing traps could also be employed for either application (thin or thick gate insulators).

Figure 13:
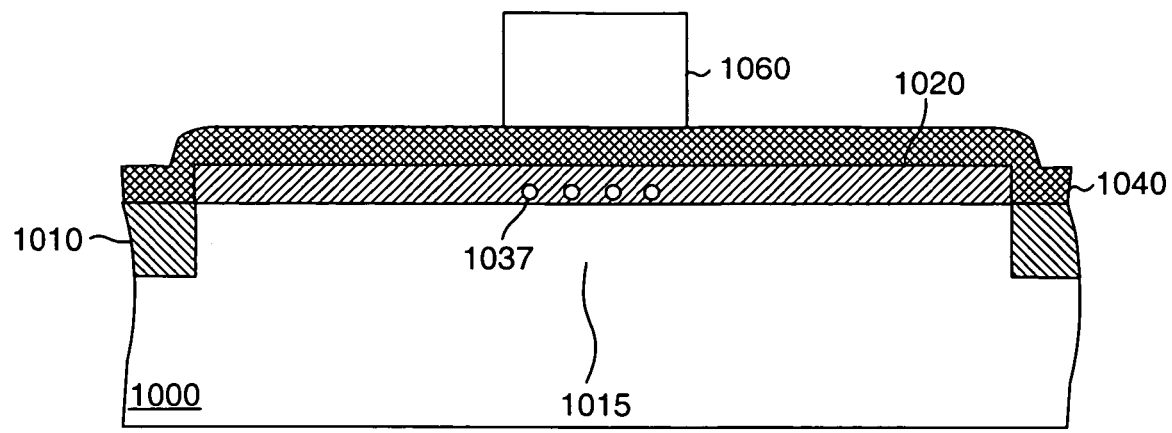

FIG. 13 is a schematic cross-sectional view depicting a simplified explanation of the resulting effects of one or more annealing steps, which, as noted above, are used to increase a density of charge traps 1037 at a channel interface of the NDR FET of a preferred embodiment. It will be understood that this figure, and many elements therein—the traps, the trap location, etc., are not drawn to scale, and that the depiction is merely intended as an instructive tool for comprehending the present teachings.

Figure 14:
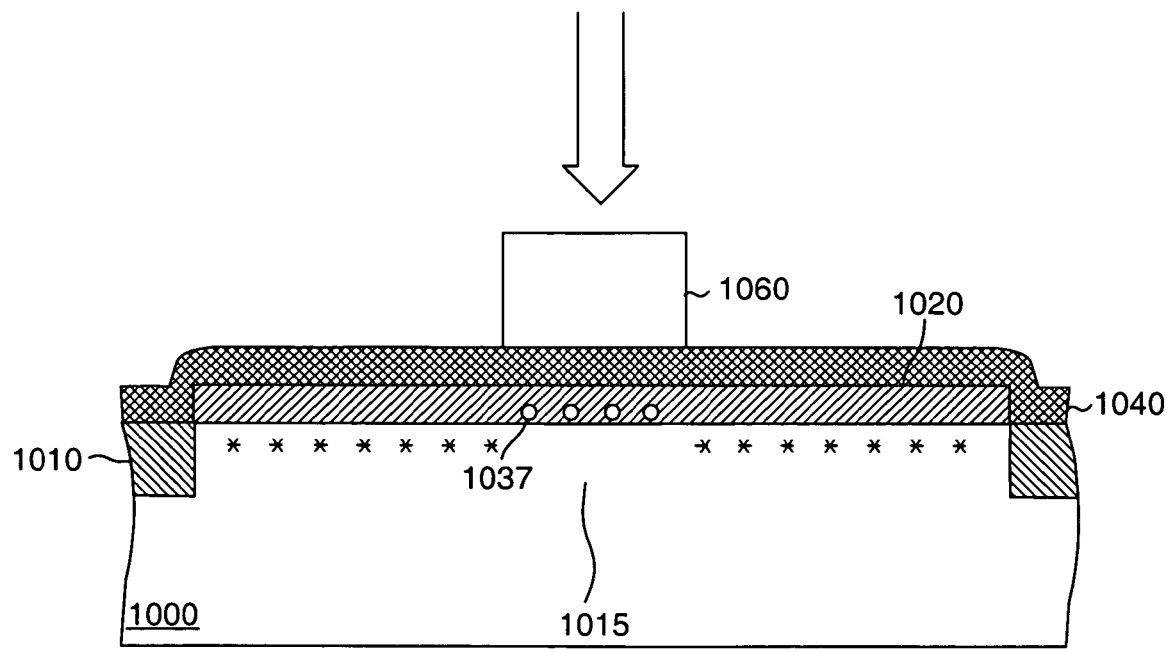

FIG. 14 is a schematic cross-sectional view showing the step of forming lightly doped source/drain regions corresponding to step 460 in FIG. 4. In a preferred embodiment, an n-type dopant such as Arsenic (shown with an * symbol) is implanted with an energy of 10 keV and a dosage of $3*10^{15}$ atoms/$cm^2$. The inventor has determined that Arsenic is superior to Phosphorus in terms of achieving a higher overall PVR for an NDR device of the present invention. While the reasons for this are not entirely clear, it is believed that As diffuses more slowly than P so that a higher doping concentration can be achieved with the former. This in turn results in a higher peak electric field in a drain region of the channel creating more energetic electrons, and thus more charge trapping. A lower $V_{NDR}$ can be achieved for similar reasons.

Accordingly, a desired PVR value can also be controlled to some extent for an NDR device through suitable selection of an LDD dopant species, energy, etc. It should be noted that the shallow source/drain extension regions may be formed in the NDR-FET areas 1015 simultaneously with the shallow source/drain extension regions in the IGFET areas 1015'. The dopant concentration and junction depth of the shallow source/drain extensions for the NDR-FET can be made to be the same, or different from those for the NDR-FET, if necessary, by selective (masked) ion implantation. Furthermore, in some embodiments, it may be desirable to form the shallow source/drain regions after the heavily doped source/drain regions described below.

A conventional anneal operation may be performed after the LDD implant (as noted in step 465) to anneal out any damage, and further control a target PVR.

Figure 15:
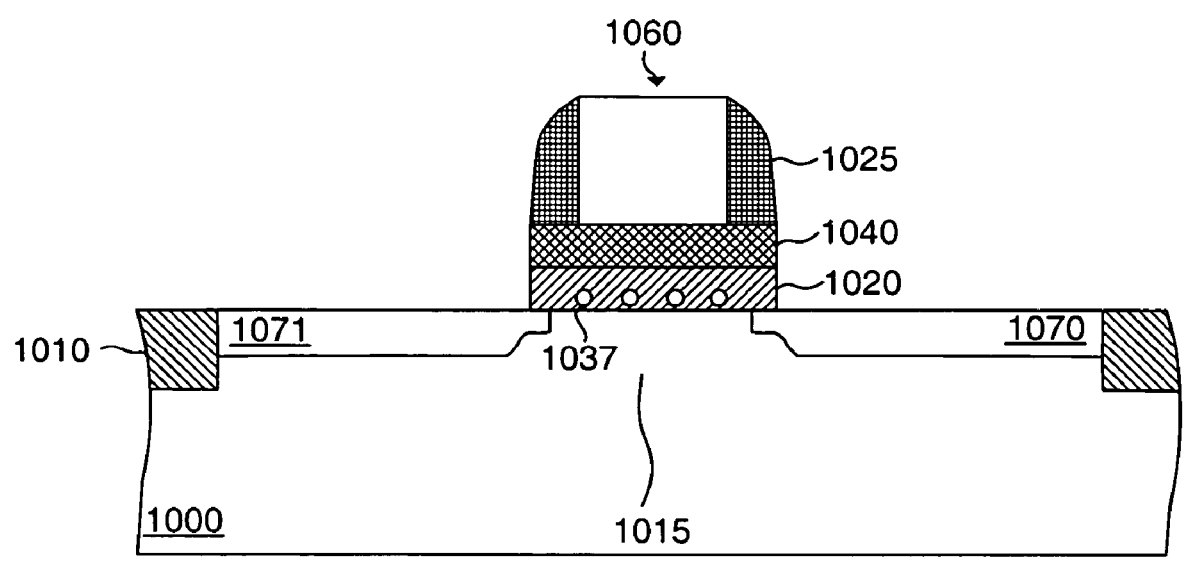

FIG. 15 is a schematic cross-sectional view showing the step of forming more heavily doped drain/source regions 1070 and 1071 for an NDR FET and other conventional FETs (as noted in steps 470-475). In this case, deep source and drain regions are offset from the edges of the gate electrode by spacers 1025 formed along the sidewalls of the gate electrodes. The sidewall spacers are formed by conformal deposition and anisotropic etching of a spacer film in conventional fashion. The thickness of this spacer film determines the width of the sidewall spacers and hence the offset from the gate electrode. A variety of such spacer techniques are known in the art and can be used with the present invention. Again, preferably, sidewall spacers are formed at the same time for both NDR and non-NDR FETs.

Source and drain regions (step 475 in FIG. 4) 1070 and 1071 are formed by ion implantation of n-type dopants such as arsenic and/or phosphorus and subsequent thermal annealing (step 480) using conventional techniques to remove damage and to activate the dopants. In this particular implementation, gate electrodes 1060 are sufficiently thick to prevent implanted ions from entering the surface of substrate 1000 underneath the gate electrodes.

Figure 16:
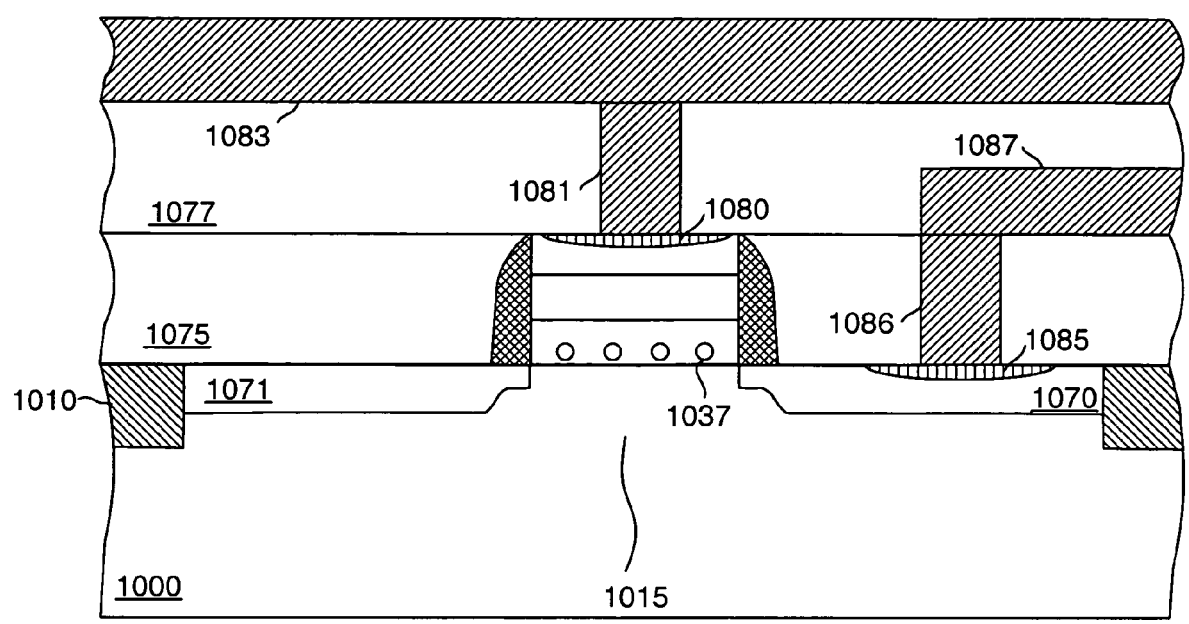

As shown in a simplified perspective in FIG. 16, device fabrication is completed (steps 485, 490 and 495 in FIG. 4) by formation of silicide 1085, 1080 on the surfaces of the source and drain contact regions and possibly the gate electrode to provide low-resistance metal-to-semiconductor contacts, followed by deposition of one or more electrically insulating interlayer films 1075, 1077, formation of contact holes and filling of these holes with metal plugs 1081, 1086, deposition and patterning of one or more metal layers 1083 and 1087 to form interconnections, and a low-temperature (350° C.-450° C.) anneal in a hydrogen-containing or deuterium-containing ambient (forming gas).

Multiple layers of metal wiring, if necessary, may be formed by deposition and patterning of alternate layers of insulating material and metal. It will be understood that the silicide contacts 1080 and 1085 may be formed of low resistivity phases of titanium silicide, molybdenum silicide, cobalt silicide, or nickel silicide compounds, and may be connected to only one of the gate or source/drain regions depending on the particular application. The plugs 1081 and 1086 may be formed of Tungsten, Aluminum, Copper or other metallic materials. Insulating films 1075 and 1077 may be CVD films, spin-on glass, and/or any other accepted insulating material, including air gaps. Metal interconnect layers 1083, 1087 may be Aluminum, Copper, or some other low resistivity metal.

In this manner, a semiconductor device comprising one or more IGFET elements and one or more NDR-FET elements can be manufactured on a common substrate utilizing a fabrication sequence utilizing conventional processing techniques. Those skilled in the art, of course, will appreciate that the aforementioned steps might be useful in other processing environments as well, including for manufacturing other NDR devices such as silicon based resonant tunneling diodes, two-terminal NDR FETs adapted as diodes, thyristors, etc.

While not shown explicitly, an NDR FET and a conventional IGFET have a number of regions that are formed from common layers that are later patterned, including: a common substrate 1000; a gate insulator film 1040 and 1040'; a conductive gate electrode layer 1060 and 1060'; interlayer insulation layers 1075 and 1077; metal plugs/layers 1081, 1083 and 1086 and 1087. Furthermore, they also share certain isolation areas 1010, and have source/drain regions 1070, 1071 and 1070', 1071' formed: at the same time with common implantation/anneal steps.

In some cases, there can be direct sharing of such regions of course, so that the drain of an NDR FET can correspond to a drain/source of an IGFET, or vice versa. Regions can be shared, of course, with two terminal NDR FETs adapted as diodes, as well. It will be understood that other processing steps and/or layers may be performed in addition to those shown above, and these examples are provided merely to illustrate the teachings of the present inventions. For example, additional interconnect and/or insulation layers are typically used in ICs and can also be shared.

Experimental Data Results

Experimental NDR FET devices with drawn gate lengths down to 125 nm were fabricated with the following basic parameters: 7 nm gate oxide thickness; $2 \times 10$ cm$^{-2}$ channel implant dose; 1100° C. post-gate-oxidation RTA anneal; $3 \times 10^{15}$ cm$^{-2}$ arsenic-doped LDD.

It should be noted right away that this prototyping process is not identical to the preferred process described earlier. For example, no thermal anneal was performed before a gate oxide was deposited. Nor was a counter-doping implant performed in the channel (e.g., of As), to lower the $V_t$ and subthreshold swing. A single layer of gate insulating material was used. Thus, this prototyping process was intentionally designed and primarily crafted for purposes of testing/characterizing the expected behavior and performance of NDR devices, and verifying their scalability and suitability for conventional MOS circuit applications. Consequently, the results obtained are not necessarily reflective of the actual results that would be obtained for a commercial production, or for any particular actual implementation of the present invention in a particular channel geometry, within a particular fabrication facility, using a particular set of design rules, or a using a particular set of processing equipment.

Nonetheless the inventor submits that these test results are useful for illustrating a number of basic key features and advantages of the present invention. Furthermore, they serve to further validate the basic operational features of the invention, including a FET with switchable negative differential resistance.

Dependences on Gate Bias and Gate Length

Figure 17A:
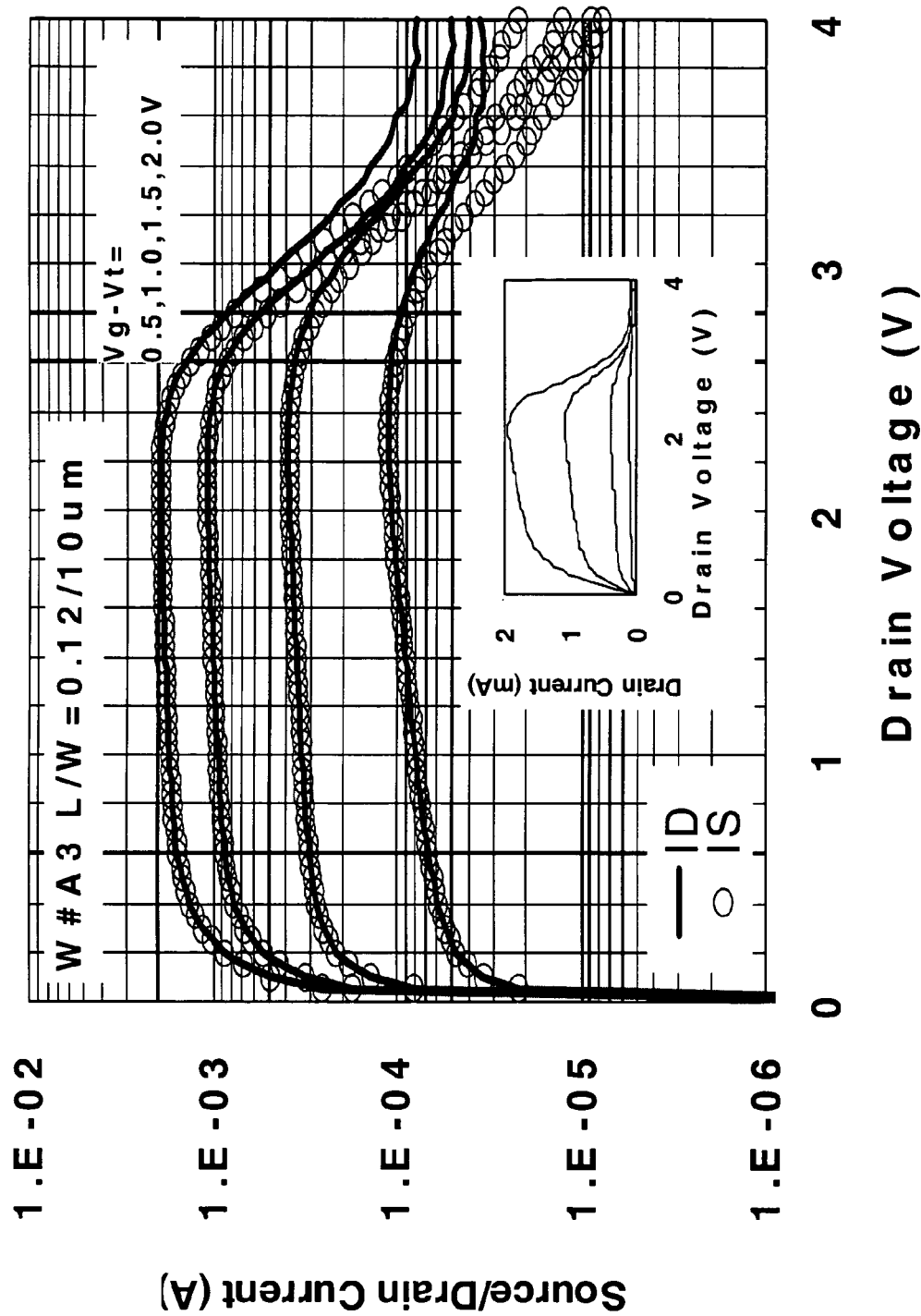

The dependences of NDR FET current-vs.-voltage (I-V) characteristics on gate bias and gate length were measured. FIG. 17A shows how the transistor current varies with gate bias. Fairly typical behavior is observed for drain biases below $V_{NDR}$, with the transistor current increasing~linearly with increasing gate drive $V_{gs}$-$V_t$. For drain biases above $V_{NDR}$, the current decreases exponentially with increasing $V_{NDR}$. The valley current increases with increasing gate drive, but not as rapidly as the peak current.

Figure 17B:
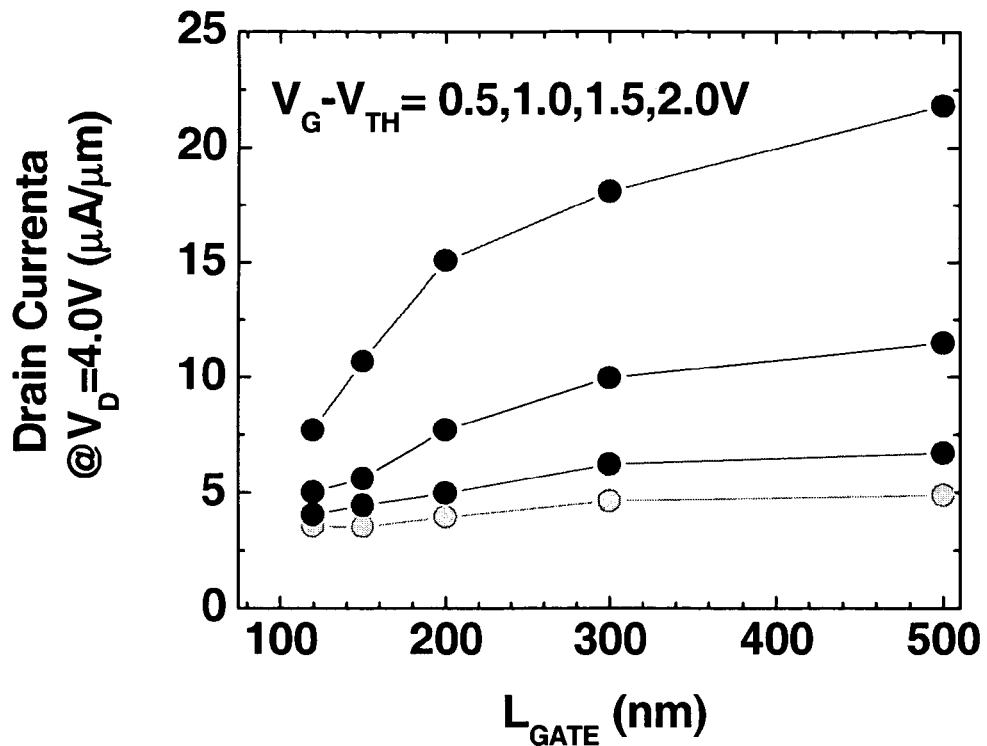
Figure 17C:
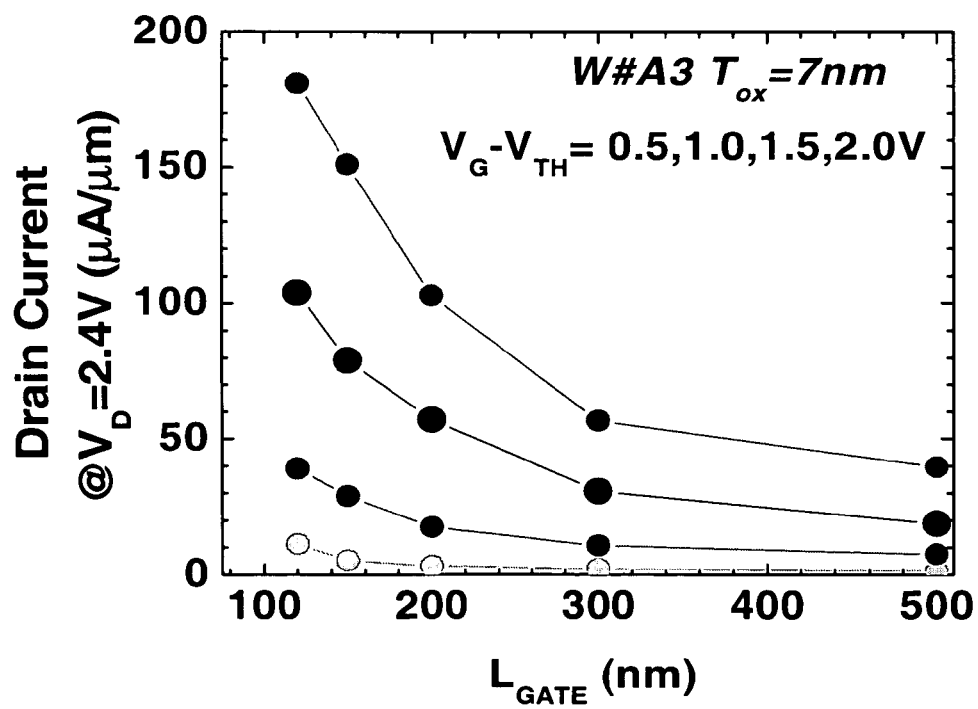

FIGS. 17B and 17C show how the peak current and valley current respectively vary with gate bias and gate length.

In FIG. 17B it can be seen that a peak drain current increases with increasing gate drive and also with decreasing gate length, as expected.

In FIG. 17C it can be seen that a valley drain current also increases with increasing gate drive, which is reasonable. However, the valley drain current decreases with decreasing gate length. This is also reasonable, because energetic carriers (generated at a drain end of the channel) are trapped at high drain biases to effect an increase in $V_t$. As the gate length is decreased, these carriers are trapped closer to the source end of the channel and hence they increase the transistor $V_t$ more effectively.

Figure 17D:
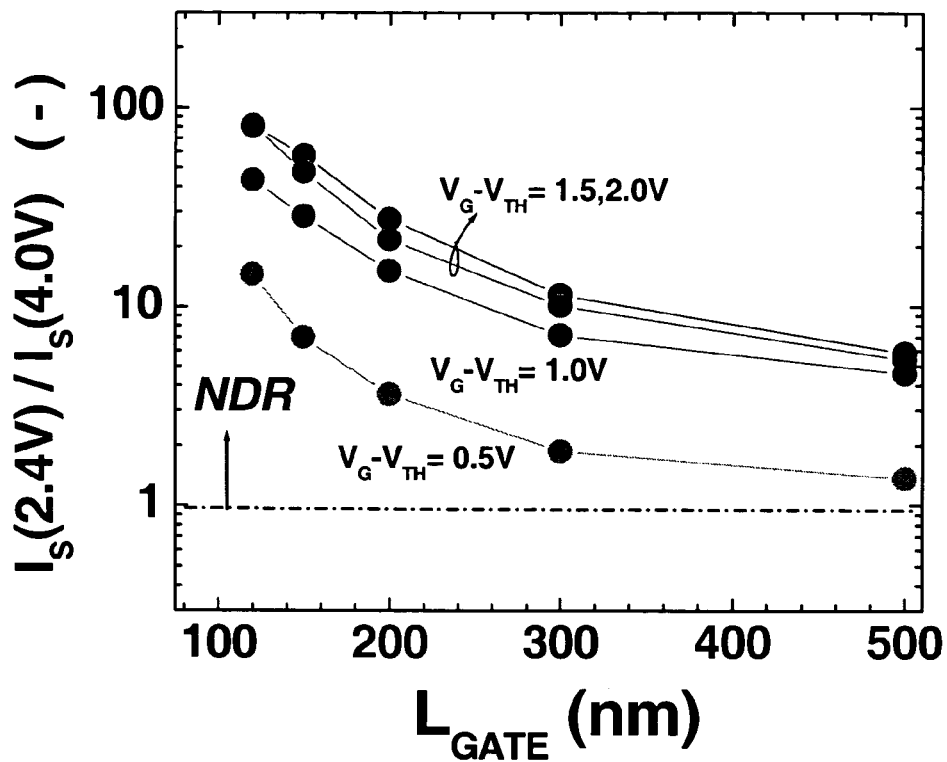
Figure 17E:
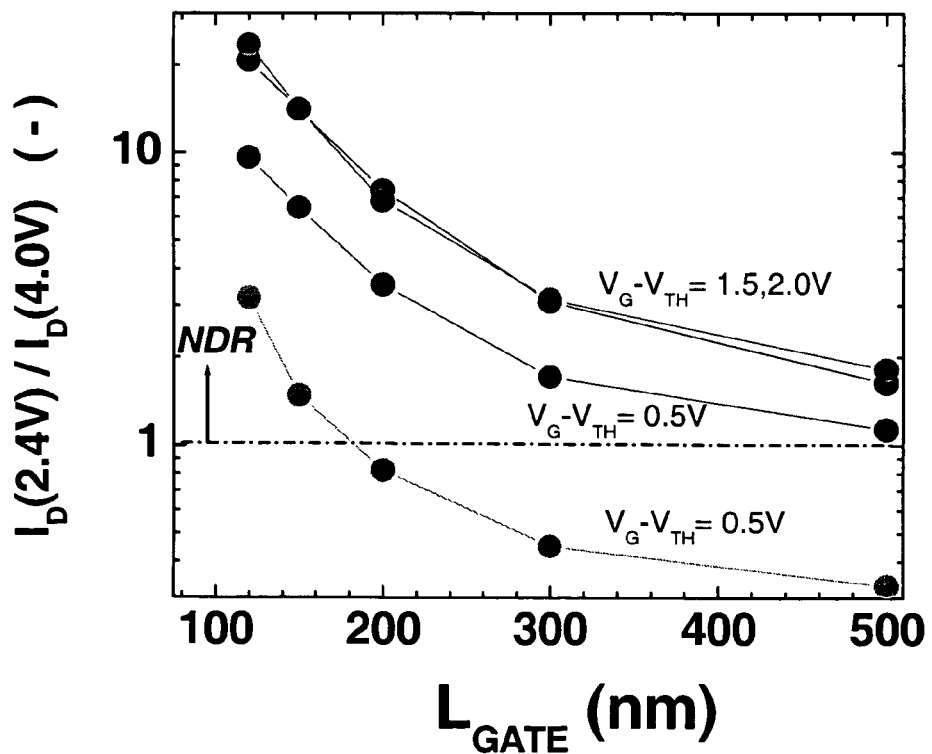

As seen in FIG. 17D, the net effect of a decrease in gate length is a significant increase in the peak-to-valley ratio. It should be noted that at high drain biases, reverse-bias pn-junction breakdown current is a significant component of the drain current because of the relatively high level of doping in the channel. Thus, to see the true valley current of the NDR transistor, the source current must be monitored. The dependence of the PVR for source current is plotted in FIG. 17E. The PVR increases to ~100 as the gate length is scaled down to 125 nm. Consequently, as can be seen in this test data, NDR embodiments of the present invention are extremely scalable, thus ensuring their utility in future deep submicron silicon processing technologies.

Ideally, the valley current of the present NDR device should compare quite favorably with the off-state leakage current of a conventional MOSFET. In the present NDR FET device in fact, the off-current can be controlled quite effectively (and differently than a current state of the art FET) by the areal trap density $N_T$ (number of traps per unit area).

Temperature Dependence Data

The present invention is expected from a theoretical perspective to show temperature performance superior to other NDR alternatives, because, among other things, the average kinetic energy of an electron is higher at elevated temperatures. Thus, the trapping and de-trapping rates can be expected to increase, i.e. the response time of the NDR-FET should improve with increasing temperature. However, since the mean free path of an electron in the channel will decrease, it is conceivable that higher electric fields may be needed to generate electrons which are energetic enough to cause the NDR behavior. The latter can be achieved, of course, in any number of ways previously described.

Figure 17F:
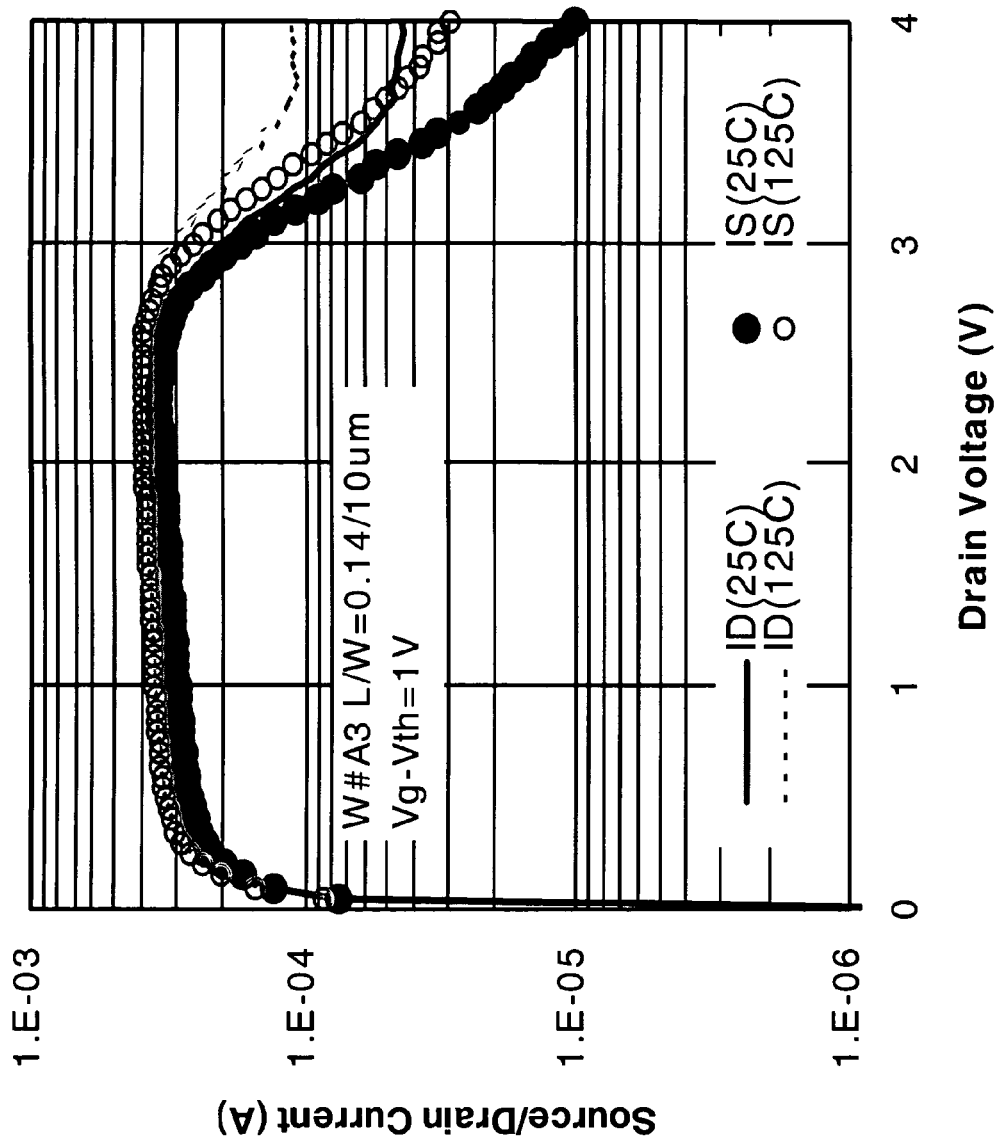

Additional temperature dependence data for one embodiment of an NDR device is thus illustrated in FIG. 17F. Again, while this device was constructed as a test vehicle, it demonstrates certain operational behaviors of various embodiments of the present invention, including the fact that an overall PVR value is substantially constant over a wide temperature range of 25° C. to 125° C. This is because, as can be seen in the figures, while a peak current increases with temperature, a valley current also increases. Accordingly, some embodiments of the present invention can be tailored to operate with relative temperature independence over a reasonably wide temperature range.

As can be seen in the graphs of FIG. 17F both the peak current and valley current increase slightly as the temperature increases to 125° C. The annotations on this graph include lines corresponding to a drain current $I_d$, and symbols corresponding to a source current $I_s$. The solid symbols and line are for 25° C. measurement; open symbols and dashed line are for 125° C. measurement.

The peak current increases by about 20%, while the valley current increases by a factor of ~3 over the entire temperature range; this is relatively small compared to a conventional MOSFET, in which the leakage current increases exponentially with temperature. Overall, however, the NDR-FET peak-to-valley current ratio (the key performance metric for a NDR device) remains fairly constant over a wide range of temperatures.

Hence, the NDR FET of the present invention can clearly meet the operating temperature specifications for commercial IC products. In fact, it is expected that optimized embodiments of the present invention using the aforementioned preferred processes described above can achieve a PVR in excess of $10^6$ across a very wide temperature range, making them particularly suitable for military, aerospace, automotive, and similar temperature demanding environments. This feature, in addition to its compatibility with a conventional CMOS process, makes the NDR-FET stands out among all known NDR devices in its promise for high density IC applications.

It should be noted that prior-art NDR devices such as the tunnel diode, resonant tunneling diode, thyristor, real-space transfer transistors, etc. show significantly degraded performance at elevated temperatures. For instance, a thyristor-based memory must operate with a relatively high (>1 nA) holding current in order to guarantee stable operation at 75° C. A so-called single transistor (DRAM-based) SRAM will have significant power consumption at elevated operating temperatures because higher refresh rates must be used to compensate for higher pass-transistor leakage.

PVR & $V_{NDR}$ Control Through Various Process Parameters

Figure 17G:
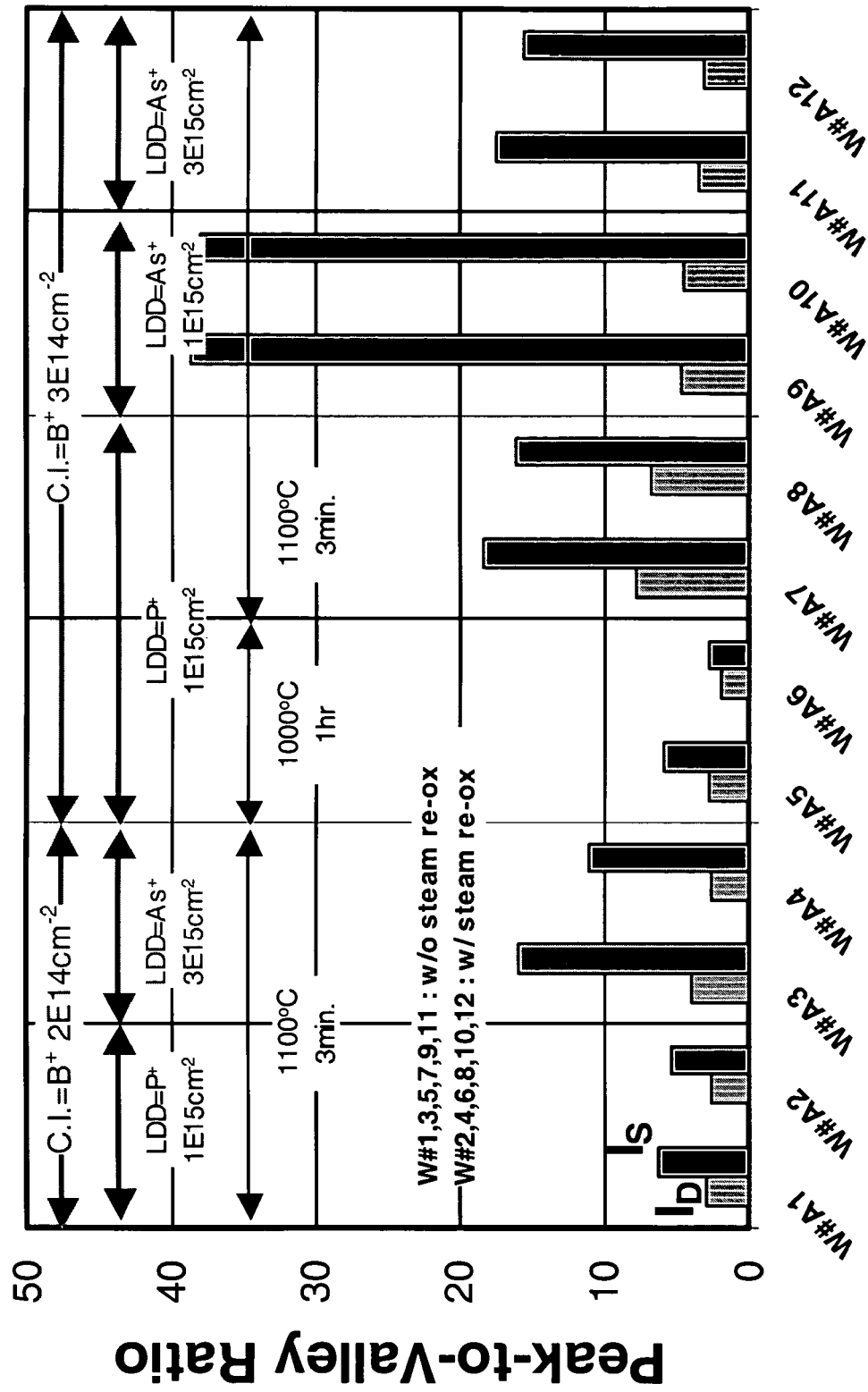

The effects of various process parameters on PVR and $V_{NDR}$ characteristics were also examined. This was done by examining PVR and $V_{NDR}$ values for various experimental splits which yielded working devices. Thus, as seen in FIG. 17G, the 7 nm gate oxide NDR test device wafer which yielded the results of FIGS. 17A to 17F is designated as W#A3, corresponding to Wafer A3. Additional wafer prototypes were also tested with various processing variations, including:

(1) different channel implant dosages for forming the traps (i.e., Boron at $2*10^{14}$ or $3*10^{14}$ atoms/cm$^2$);

(2) different lightly doped drain species (P$^+$ or As$^+$) and dosages;

(3) different post-gate-oxidation annealing conditions (RTA or furnace)

Figure 17H:
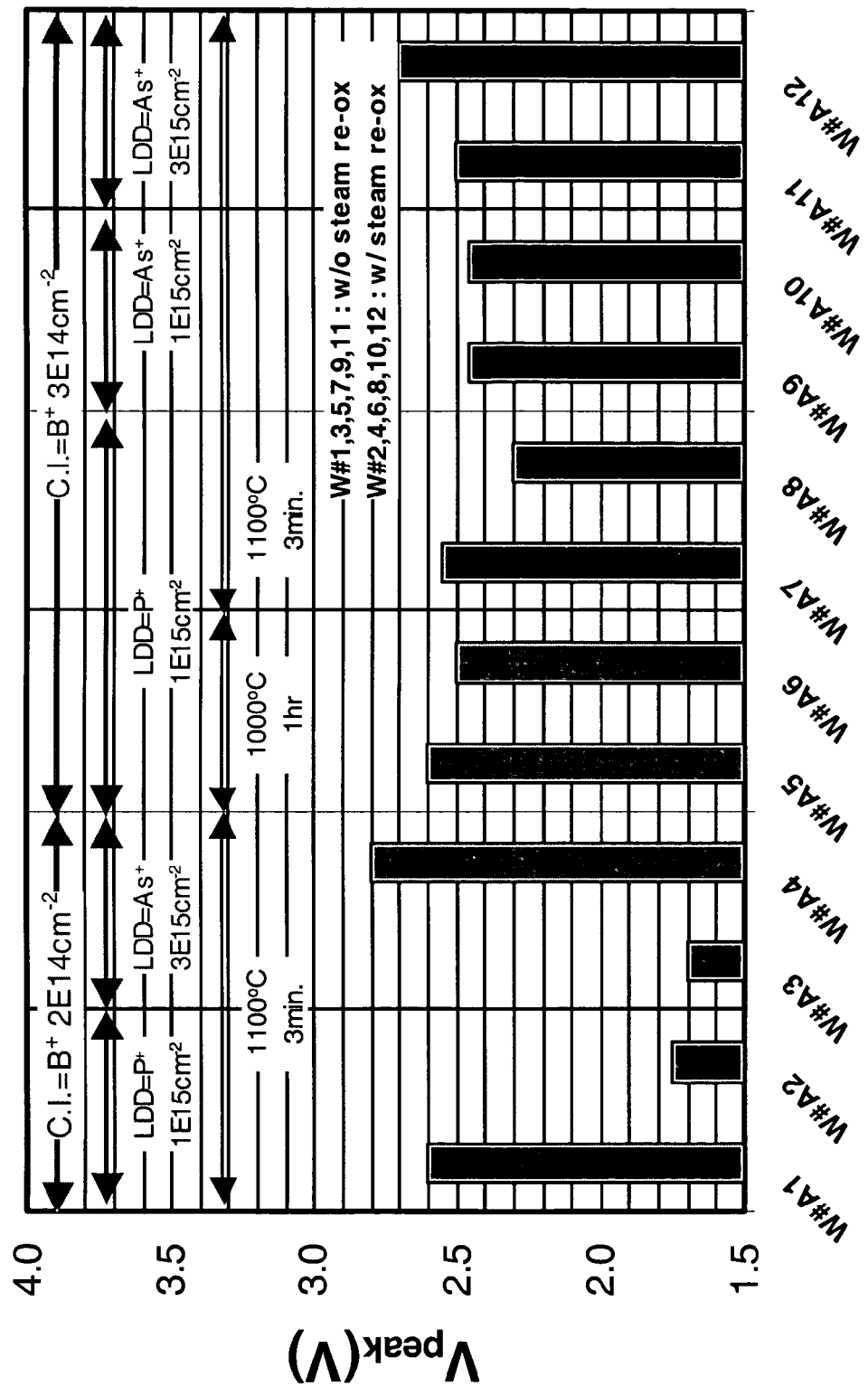

(4) different steam re-oxidation conditions (5) different gate insulator thicknesses PVR and $V_{NDR}$ values are summarized in FIG. 17G and FIG. 17H, respectively, for NDR FETs with drawn gate length 180 nm; drain current values are noted with hashed bars, while source current values are shown with solid bars. Several key observations can be made from this test data, which is extremely useful from the perspective of effectuating precise PVR and/or $V_{NDR}$ control for a particular embodiment of an NDR device. In particular, it can be seen that a desired target PVR/$V_{NDR}$ value can be obtained by fine tuning one or more standard process operations during a manufacturing process. This allows for a wide variety of PVR and/or $V_{NDR}$ values, and further ensures that predictable, reliable yields and results can be obtained for an NDR process.

In a preferred embodiment, $V_{NDR}$ is set to be slightly lower than one-half the power-supply voltage $V_{dd}$, i.e. $V_{NDR} \leq V_{dd}/2$. Nonetheless, different $V_{NDR}$s can be achieved at different areas of a semiconductor substrate through appropriate process controls as disclosed herein.

Thus, as the test data shows, as a result of the unique structure and operational features of the present invention, a desired PVR and/or $V_{NDR}$ characteristic is easily set and controlled within a conventional MOS manufacturing facility using one or more conventional processing operations. This ease of manufacturability ensures that appropriate target values for PVR and $V_{NDR}$ can be achieved for a wide variety of target applications. While the present disclosure provides a number of examples of process variations which can be used to control a PVR and $V_{NDR}$ behavior, other examples will be apparent to skilled artisans from the present teachings. Thus, the present invention is by no means limited to any single variant, or combinations of variants of such PVR and/or $V_{NDR}$ process control techniques.

PVR and $V_{NDR}$ Control Through Channel Implant Dose Control

FIG. 17G shows that higher PVR values are achieved with higher boron implant dose. This is expected because the density of traps is correlated with the concentration of boron incorporated into the oxide near the Si/SiO$_2$ interface. As noted earlier, however, the concentration of traps should not be made too high, in order to avoid trap-to-trap conduction.

FIG. 17H shows that $V_{NDR}$ is slightly lower for higher boron implant dose because of the higher average vertical electric field in the inversion channel. (Larger values of $V_g$ are required to achieve 1 V gate drive, because $V_t$ is larger.) For a larger vertical electric field, the lateral electric field (hence $V_d$) does not need to be as high in order to create the hot electrons which can be trapped.

Accordingly, a desired or target PVR/$V_{NDR}$ value can also be effectuated by controlling the type of implant/dosage used in any particular manufacturing environment.

PVR and $V_{NDR}$ Control Through Post-Gate-Oxidation Anneal

As seen in FIG. 17G, significantly higher PVR values are achieved with an 1100° C. RTA as compared with the 1000° C. furnace anneal. This indicates that a higher density of traps at the Si/SiO$_2$ interface is achieved with an 1100° C. RTA. Thus a desired PVR value can also be effectuated by controlling the type of thermal annealing step performed in any particular manufacturing environment.

At this time, the experimental data (as seen in FIG. 17H) does not show that $V_{NDR}$ has a strong dependence on post-gate-oxidation annealing conditions.

PVR and $V_{NDR}$ Control Through LDD Implant Dose

Significantly higher PVR values are obtained with As-doped LDD as compared with P-doped LDD as seen in FIG. 17G. The inventor believes this is the case because As diffuses more slowly than P so that a higher LDD doping concentration is achieved with As. This in turn provides a higher peak electric field in the drain region of the channel, hence hotter electrons and more charge trapping. Apparently, in the experimental wafers, the LDD ion implantation damage was not completely annealed out for the higher dose ($3\times10^{15}$ cm$^{-2}$) As implant, which resulted in lower peak current and higher valley current and hence degraded PVR. Again this can be corrected using known annealing techniques.

In FIG. 17H, it can be seen that $V_{NDR}$ is lower for As-doped LDD as compared with P-doped LDD. This is because the drain bias required to achieve the critical peak electric field in the drain region of the channel is lower (due to the higher LDD doping concentration).

Consequently, an LDD operation provides yet another mechanism for setting or fine-tuning a desired PVR/$V_{NDR}$ value using conventional MOS process operations.

PVR and $V_{NDR}$ Control Through Gate-Oxide Thickness

Figure 17J:
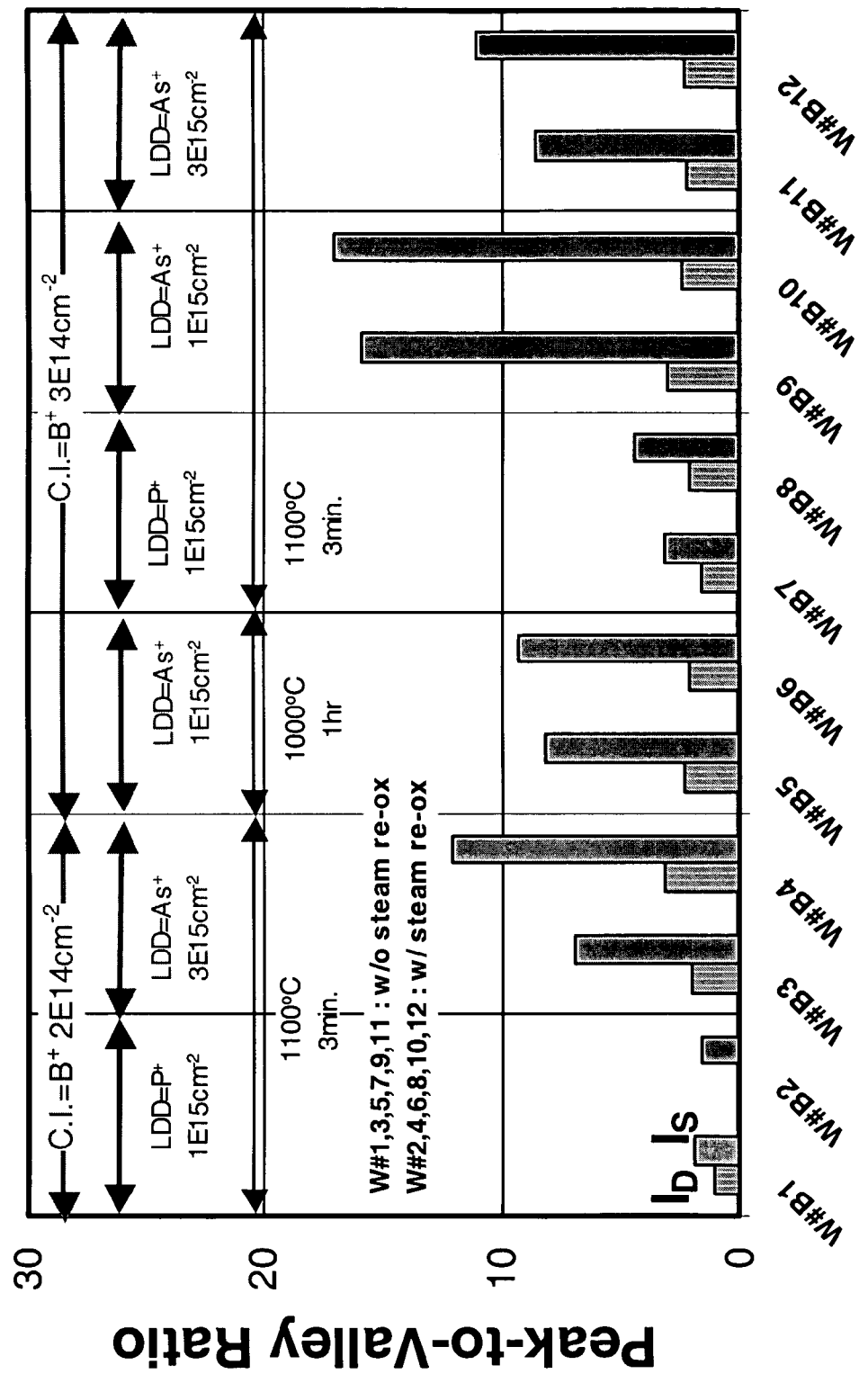
Figure 17K:
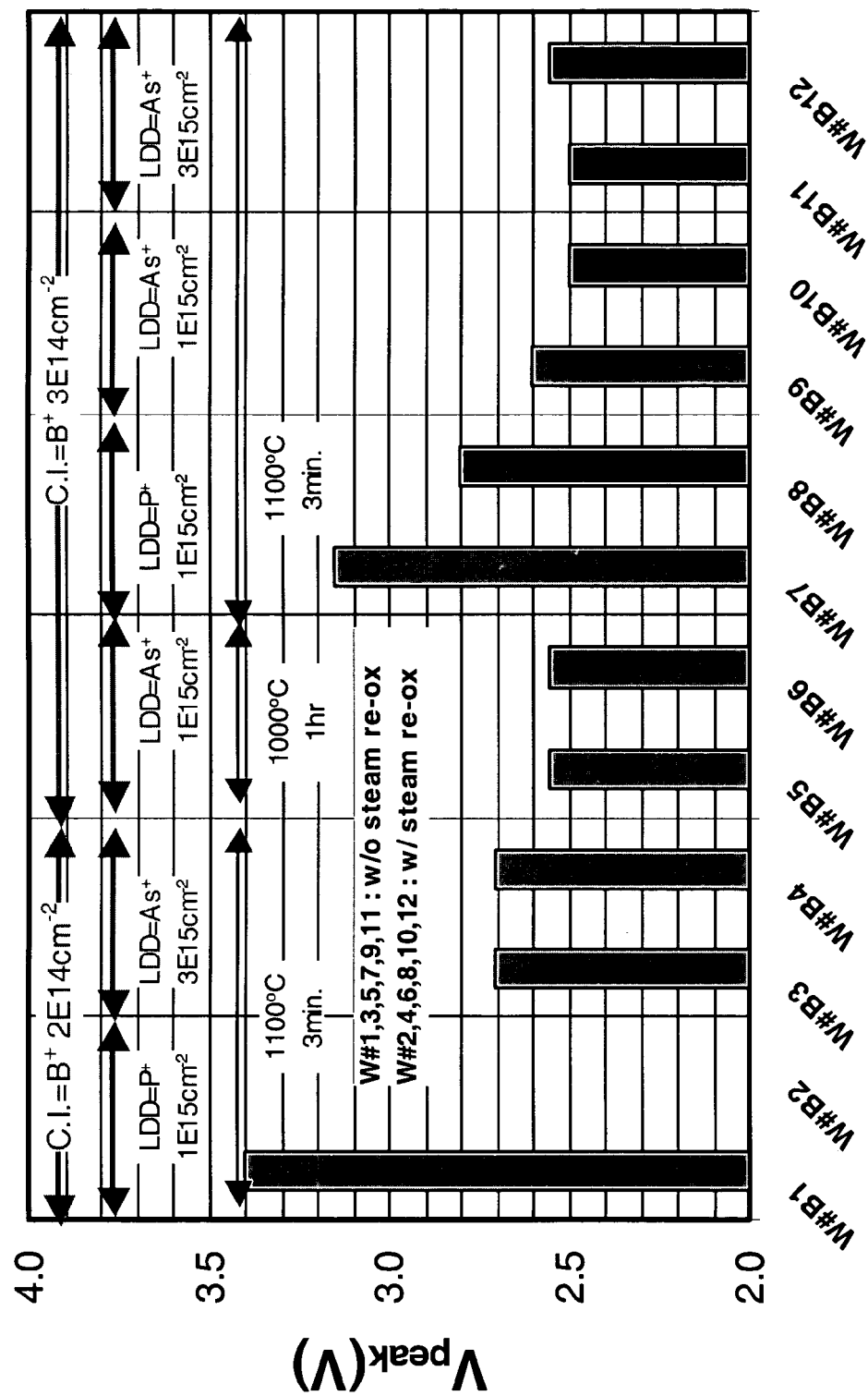

FIG. 17J and FIG. 17K show similar test data for PVR and $V_{NDR}$, respectively, except for a slightly thinner gate oxide (5.5 nm). This data is also useful because it illustrates yet another tool available for process designers to effectuate a variable PVR value. Namely, as seen in this figure, for all other parameters being equal, an overall PVR value is lower than for comparable NDR devices having a 7 nm gate oxide.

Accordingly, higher PVR values are also achieved with thicker gate oxide. This is expected because a given density of charge traps ($N_T$) will effect a larger increase in $V_t$ for a thicker gate dielectric:

$$\Delta V_t \approx q^* N_T / C_{ox}$$

As an example, for $N_T = 5 \times 10^{12}/cm^2$ and 7 nm $SiO_2$ gate dielectric, $V_t \approx 1.6$ V, so that a "peak to valley ratio" (PVR) close to $10^6$ should be attainable (assuming $V_{gs}-V_t=1V$ and S is about 100 mV/dec). The effective PVR also can be enhanced (by up to 100×) by dynamically varying the gate bias to either enhance the peak current and/or to lower the valley current. This type of in-circuit PVR adjustment, during operation of an NDR device, is another benefit of the present inventions that can be used in some embodiments.

In FIG. 17K, it can be seen that $V_{NDR}$ is slightly lower for a thicker gate oxide because of the higher average vertical electric field in the inversion channel. (Larger values of $V_g$ are required to achieve 1 V gate drive, because $V_t$ is larger.) For a larger vertical electric field, the lateral electric field (hence $V_d$) does not need to be as high in order to create the energetic electrons which can be trapped.

For these reasons, a desired PVR/$V_{NDR}$ value can also be effectuated by controlling the type and thickness of a gate insulator used in any particular manufacturing environment.

PVR and $V_{NDR}$ Control Through Steam Anneal

The effect of the steam anneal cannot be clearly ascertained from the experimental results. As seen in FIG. 17J, for a relatively thin gate oxide (5.5 nm), the PVR is consistently higher if a steam anneal was employed. As seen in FIG. 17G, however, for thick gate oxide, however, the PVR is marginally (but consistently) lower if a steam anneal was employed.

$V_{NDR}$ is generally lower in all cases if a steam anneal was employed.

These results suggest that, as noted earlier, a steam anneal is helpful for forming additional charge traps near the Si/$SiO_2$ interface. However, in some cases it also enhances boron diffusion away from the interface (and thereby lowers the trap-state density at the interface) if the gate oxide is thick.

Accordingly, it appears that for some geometries, a desired PVR/$V_{NDR}$ value can also be effectuated by using a steam anneal process to manufacture an NDR device.

NDR FET Reliability

In the NDR FET, carriers tunnel through an ultra-thin interfacial oxide into and out of traps when $V_{ds} > V_{NDR}$. The vast majority of these carriers will not have sufficient kinetic energy to cause new traps to be formed in the "tunnel oxide". Even if new traps were to be formed in the "tunnel oxide" (e.g. by high-energy electrons in the tail region of the electron energy distribution), they would likely serve to enhance the speed of the NDR FET, because these new traps would be formed closer to the Si/$SiO_2$ interface than the original traps.

Although reliability issues for the NDR FET were not tested explicitly, the inventor believes that the existing body of knowledge on $SiO_2$ points to the fact that such devices should be as good or better than conventional MOSFETs. Based on the trend of increasing charge-to-breakdown $Q_{BD}$ (to infinity as oxide thickness decreases to zero) with decreasing oxide thickness, it is reasonable to expect that the "cycle-ability" of the NDR FET will be very high (e.g. $>>10^{12}$ cycles between high-$V_t$ and low-$V_t$ states).

It is known that conventional hot carriers in the channel (i.e., >3.1 eV) are responsible for degradation in MOSFET performance, because of the damage which they cause to the oxide interface as well as in the bulk of the oxide. The NDR FET in fact should provide superior results, because in such device, the amount of hot carriers is limited because only energetic carriers are generated (i.e. about 0.5 eV) and the transistor turns itself off at high $V_{ds}$. The energetic electrons which tunnel into the traps embedded within the oxide are generally not "hot" enough to cause damage. Thus, the inventor expects the NDR FET to have reasonably good reliability in commercial applications.

NDR Testing/Stressing/Trap Enhancement

Figure 18:
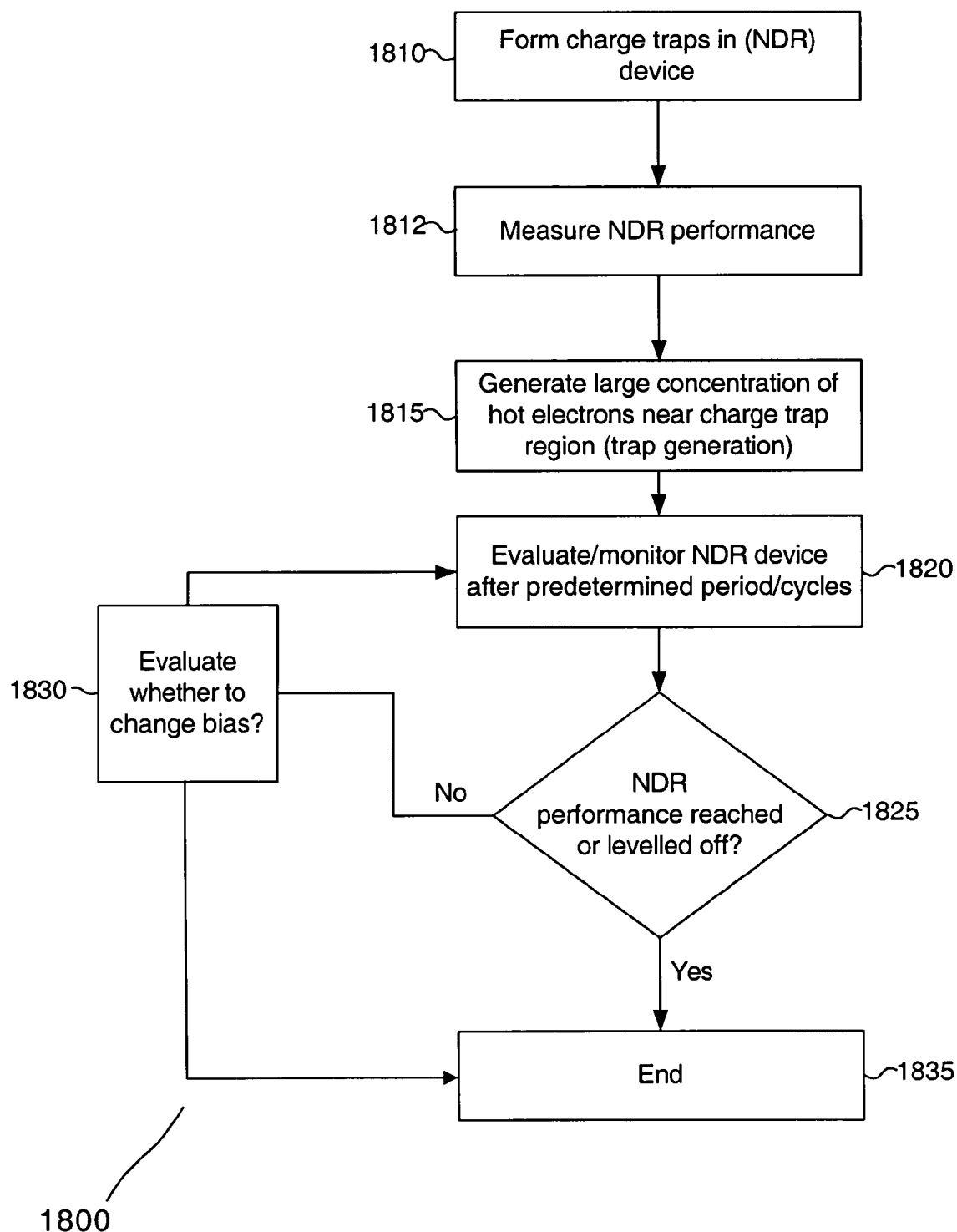
FIG. 18 is a flowchart of a testing/stressing process that can be used in some embodiments to enhance/verify operation of NDR devices and trapping based devices.

FIG. 18 illustrates a basic process 1800 that can be used to test NDR devices, and/or to enhance a trap distribution during a manufacturing process. Due to the nature of the mechanism used in an NDR device of the present invention, it is possible to intentionally alter either a total concentration, and/or a distribution of traps within a trapping layer either during or after a regular manufacturing operation. In other instances it may be desirable to "fix" a particular trap distribution during a testing/burn in operation to ensure predictable and stable performance in the field.

Accordingly, as seen in FIG. 18, a first step 1810 is associated with forming charge traps, using any one of the many techniques discussed herein or in the prior King et al. applications. NDR performance characteristics are then measured at step 1812, either on an actual device or a test structure.

At a later time, a "stress" step 1815 is then employed (either during manufacture, or during a test/burn-in stage) to generate additional traps near the interface, and/or to alter a distribution of existing traps within the device. The parameters of these tests (i.e., time, intensity, etc.) are constructed with the goal of subjecting the device to more stress than that which would be encountered in the field. The details of this, of course, will vary from application to application, and can be determined with routine skill and experimentation. In this fashion, it is expected that any new traps that could possibly be formed, and/or possible alterations of the trap distribution, can be engineered during a manufacturing/test process to fix the devices' characteristics before it is released for use in the field. In other words, the wafers containing such device are pre-stressed to make sure that the NDR characteristics do not "drift' or change with time later on in an actual application.

To achieve such stress, a preferred approach is to bias the gate, body, source and drain regions of an NDR device (or a test structure) so as to generate a large number of energetic electrons which tunnel through the gate insulating layer, and for a predetermined period of time, or for a predetermined number of cycles as shown in step 1820. For example, by applying a suitably high gate to body bias, it is possible to force electrons to flow from the channel through the gate insulator (through Fowler-Nordheim tunneling). This type of stressing can cause the formation of traps in the insulator as well. Alternatively, if the testing is done during manufacture of the NDR device, an additional heat treatment could be used to alter a distribution of the traps as noted above. Other techniques, of course, could be used to create hot carriers and/or alter a distribution of traps, including optical radiation.

At step 1825, a second measurement is made of the NDR performance of the NDR device (or the test structure), such as switching speed, PVR, $V_{NDR}$, etc., to see if such performance has reached a target threshold, or if it has leveled off. In the latter case, the stress testing can be done iteratively, and if the performance does not improve from one iteration to the next, the testing can be discontinued.

If additional stress testing/biasing is deemed appropriate at step 1830, the stress cycle is applied again for the predetermined period of time or cycles. In some instances it may be desirable to increase a bias intensity from iteration to iteration, to increase an overall stressing of the device, up to some maximum level.

The testing is completed at step 1835 if the NDR characteristics have leveled off, or if a performance target is achieved.

A benefit of process 1800 is the fact that the stressing steps noted have the side effect of creating additional permanent traps in a trapping region. Such additional traps, if they are near the interface, serve to further increase an NDR switching speed. Thus, contrary to conventional MOS FET manufacturing, the addition of trapping sites can be beneficially exploited in some cases.

Furthermore, it will be apparent to those skilled in the art that embodiments of the present invention can see operational improvements over time in the field as well, due in part to a naturally occurring "new trap" formation process which results from normal operation of the device. Thus, it is possible that embodiments of the present invention will actually see increased operating speeds over time when they are used in a commercial IC.

It should be noted that the above process might only be run in its entirety for a single test/calibration wafer in any particular facility for a particular application, so that the stressing process can be calibrated for later wafer processings without requiring additional individual measurements. In other words, the stress testing process itself may be designed and optimized based on results obtained from one or more standard wafers that are expected to be representative of any other wafers that are run in a particular facility. Thereafter, the stress testing would occur for individual wafers automatically without the need to check or re-verify an NDR performance.

Alternatively, the stressing/test process 1800 could be run at any time after critical NDR operations in a manufacturing facility (such as on a test structure) to monitor an NDR behavior and determine if target performances have been met. The results gleaned at step 1825 could be used to ensure that later downstream processing steps are modified to correct for any discrepancies.

Again, for purposes of illuminating the salient points of the present invention, many implementation-related details are omitted. The specifics of the monitoring, stress, and control programs will be determinable in most cases with routine skill for any particular application, so they are not presented here. Furthermore, while the above embodiments are described with reference to a preferred NDR FET device and/or a trapping based device, it will be apparent to those skilled in the art that the principles and teachings are broader than this, and will be useful in any applications where it is desirable to monitor and evaluate NDR/trapping behavior. Accordingly, the present invention is not limited in this fashion.

NDR Dynamic PVR Adjust

Another aspect of the present invention concerns the fact that, even after an NDR device is completed during a manufacturing process, a PVR value for a particular NDR circuit can be adjusted at a later time using what is generally referred to herein as a dynamic PVR adjustment process. This permits a type of "adaptive" NDR device unlike anything in the prior art.

In other words, some embodiments of the present invention may be utilized in environments where it is desirable to change a PVR characteristic during normal circuit operation, i.e. to have an adaptive behavior. In this fashion a circuit may be operated at one time with a first PVR value, and at a later time be adapted to have a second PVR value. The PVR values could be changed on the fly, for instance, in response to a change in a desired operating voltage, power or clock speed, etc. Thus, as an example, a circuit containing NDR (or a charge trap device) can be powered down to achieve a smaller leakage current during a quiescent mode. Other examples will be apparent from the present teachings.

Figure 19A:
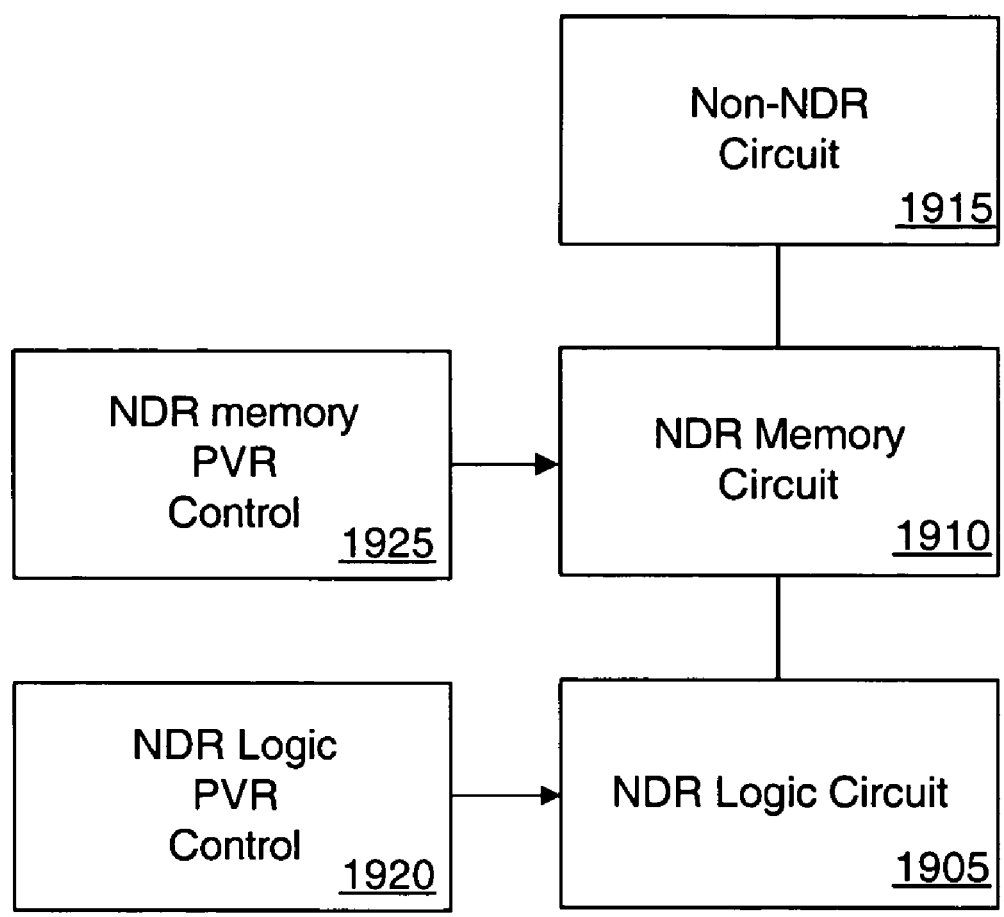
FIG. 19A depicts an embodiment of an integrated circuit that includes a PVR controller for adjusting a PVR ratio of an NDR element.

As seen in FIG. 19A therefore, an integrated circuit 1900 contains either/both an NDR based logic circuit 1905, an NDR based memory circuit 1910, and some additional non-NDR circuitry 1915. Again, since embodiments of the present invention can be made using compatible operations to conventional MOS transistors, it is expected that they will be integrated together in many applications. An NDR Logic PVR control circuit 1920 and NDR Memory PVR control circuit 1925 selectively control PVR characteristics of NDR based logic circuit 1905 and NDR based memory circuit 1910 respectively as explained below. Those skilled in the art will appreciate of course that this is a simplified depiction, and that not all integrated circuits 1900 will utilize or require both logic and memory for an application.

Notably, an NDR based memory circuit 1910 may consist of one or more memory arrays, latches, registers, etc., which include a first type of NDR element requiring a first particular PVR value. An NDR based logic circuit may consist of standard logic gates configured for performing arithmetic operations, logical operations, etc., and includes a second type of NDR element requiring a second particular PVR value. The two types of NDR elements are preferably both NDR FETs, but other combinations of NDR FETs and other NDR elements (diodes, thyristors) could be used, so long as the latter include some form of modifiable PVR characteristic.

For many applications, a first type of NDR element used in a memory circuit 1910 will have different operating requirements than a second type of NDR element in a logic circuit 1905, and thus, may also require different NDR characteristics as well. Thus, it is expected that some "mixed" types of systems employing the present inventions will utilize different types of NDR elements having different NDR characteristics such as different PVRs, different VNDRs, different gate biasings, different source/drain biasings, etc.

Figure 19B:
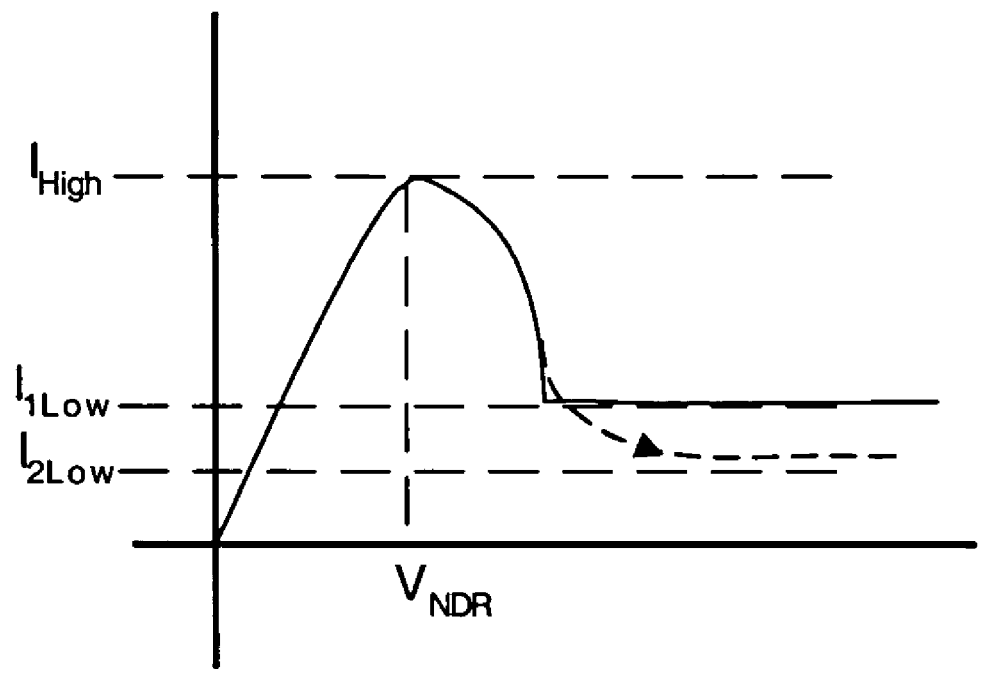
FIGS. 19B-19C depict an operation of an adaptive NDR device embodiment.

Moreover, in some instances, different types of NDR elements may use different biasings at different operating periods, as shown in FIG. 19B. The advantage of such type of operation is quite notable. Namely, an NDR device can operate with a peak current $I_{HIGH}$ and a valley current $I1_{LOW}$ during a first time period, based on a first PVR characteristic.

At a later time, a valley current of the NDR device can be reduced, simply by reducing a gate bias signal applied to the NDR FET. This results in a valley current $I2_{LOW}$, and a different overall PVR for the NDR device, because the ratio $I_{HIGH}/I2_{LOW}$ is significantly greater than the ratio of $I_{HIGH}/I1_{LOW}$. This in turn means that a quiescent or static power dissipation of an NDR FET can be changed during operation to further improve a power consumption characteristic. This is further apparent from a review of FIG. 17A, where it can be seen that for an increasing gate voltage $V_G$, an increasing source/drain current is also obtained. Similarly, reducing a gate voltage results in a smaller source/drain current. Accordingly, some preferred embodiments of the invention can be configured to operate with an adaptive NDR behavior.

Looking at FIG. 19B again, a transition from $I1_{LOW}$ to $I2_{LOW}$ is made under control of NDR Memory PVR Control circuit 1925 or NDR Logic PVR Control circuit 1920 (as the case may be) in response to a change in a desired operating characteristic of NDR Memory Circuit 1910 or NDR Logic Circuit 1905 respectively. In this instance, as shown in FIG. 19B, a transition is made first from a high current state to a low current state, and them from such low current state to a lower current state to reduce power. To restore the NDR device to its normal PVR value, the normal gate bias signal is reapplied, resulting in the device switching back to a somewhat higher valley current ($I1_{LOW}$). Thereafter of course, if the source/drain voltage changes to a non-NDR mode, the current in the channel will reach $I_{HIGH}$ again at a particular voltage $V_{NDR}$.

Again, in certain low power modes, it is desirable to reduce all unnecessary power dissipations, and the present invention affords another instance of a technique for doing such. Furthermore, for both memory and logic applications it is desirable to reduce leakage current, so this technique can be used for both types of circuits. In the case of a memory circuit, for example, a certain amount of drive current is required during normal access (read/write) operations, so it is desirable to have a relatively large $I_{HIGH}$. When storing data, however, it is desirable to use as little power as practical, so it is preferable in such states to transition the valley current from $I1_{LOW}$ to $I2_{LOW}$ if possible. As an example, in an SRAM cell application, although a high PVR is not necessary for latching data, a high PVR is desirable for low standby power. Similarly, for high-speed digital logic applications of NDR devices, a high PVR is not needed (~10 is adequate for most circuits) in order to have the circuits to operate properly, although a high PVR is desirable for low-power operation. In fact, if a PVR is too high, a circuit might actually operate more slowly since it will take longer for an NDR device to go from a "valley" current state to a "peak" current state.

Thus, one useful application of the present teachings is for an adaptive NDR device, whereby a PVR is set high for high-activity (usually high-speed) applications; and a PVR is set low for low-activity applications (e.g. SRAM, typically less than 1 percent activity rate) for low power. In this manner, therefore, the overall PVR for a particular application can be dynamically changed to accommodate a particular desired mode of operation. The determination of whether to adjust a PVR value can be made in response to control signals generated by power regulator circuits of an integrated circuit/computing system in a conventional fashion.

Figure 19C:
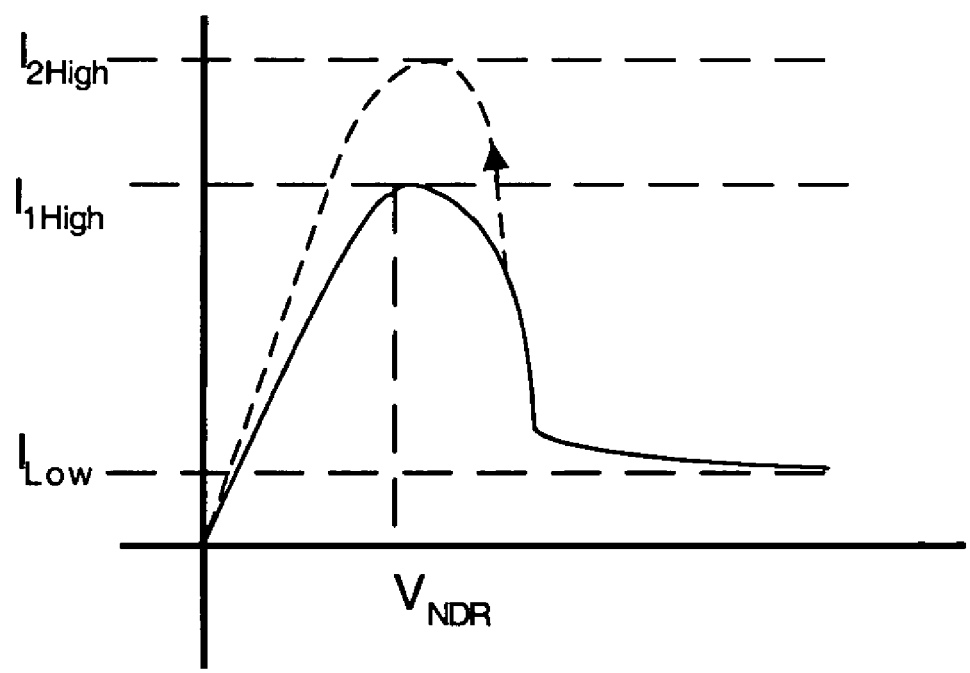

Conversely, as shown in FIG. 19C, assuming an NDR device is already in a particular low current state (or even the lowest possible current state), it is possible to make the device transition to a somewhat higher than normal high current $I2_{HIGH}$ when it is switched on, based on a somewhat higher applied gate bias voltage. While this may be less commonly used, it does afford another opportunity for increasing a particular PVR value during normal operation of an NDR device.

In a similar fashion, a PVR value for an NDR device could also be reduced from one mode to the next, if desired, by simply altering a gate bias voltage so that a transition is made from a relatively high valley current (i.e. from $I1_{LOW}$) to a relatively low peak current (i.e., to $I1_{HIGH}$). This would have an advantage of speed in some cases, and in some logic applications where a PVR value is not as critical, this may be an advantageous characteristic.

Yet another technique for changing a PVR value for an NDR device is by altering an operating speed by which the device is switched in and out of an NDR mode. In other words, with reference to FIG. 19B, if a source/drain bias is switched on or off at a first rate during a first time period at the point $I_{HIGH}$, a first number of carriers can be trapped. These trapped carriers serve to deplete the channel, and cause an NDR effect to shut off the channel (or reduce it to a level $I2_{LOW}$). If the switching rate is increased (i.e., the time period is shortened) during a different mode of operation initiating at $I_{HIGH}$, then fewer carriers can be trapped, resulting in a smaller overall PVR value because the current can only be reduced to a level $I1_{LOW}$ by operation of these trapped carriers. Conversely, if the switching rate is reduced, an overall PVR can be increased correspondingly. As a practical matter, therefore, the same NDR structure can have a differing NDR behavior depending on a switching rate employed for a source/drain bias. In logic applications where a PVR value does not need to exceed some target value (say 10) it may be more entirely acceptable (or desirable) to increase a switching rate and thus operate with a narrower range of $I_{HIGH}$ and $I_{LOW}$ values.

Another characteristic of the present invention that can exploited is the fact that in a NDR FET, there will naturally be some distribution of traps in the gate insulator near the channel interface. The traps at or next to the interface trap/de-trap electrons very quickly, whereas the traps located further away from the interface trap/de-trap electrons more slowly. Thus, a PVR of an NDR FET can be made to vary with time, starting out initially (within 1 ps) at a low value (~10) and settling toward a higher value (e.g. after 1 nanosecond). This naturally provides a high PVR for circuits which switch infrequently (e.g. memory) and low PVR for circuits switching frequently (e.g. logic), i.e. a natural form of dynamic PVR.

Figure 19D:
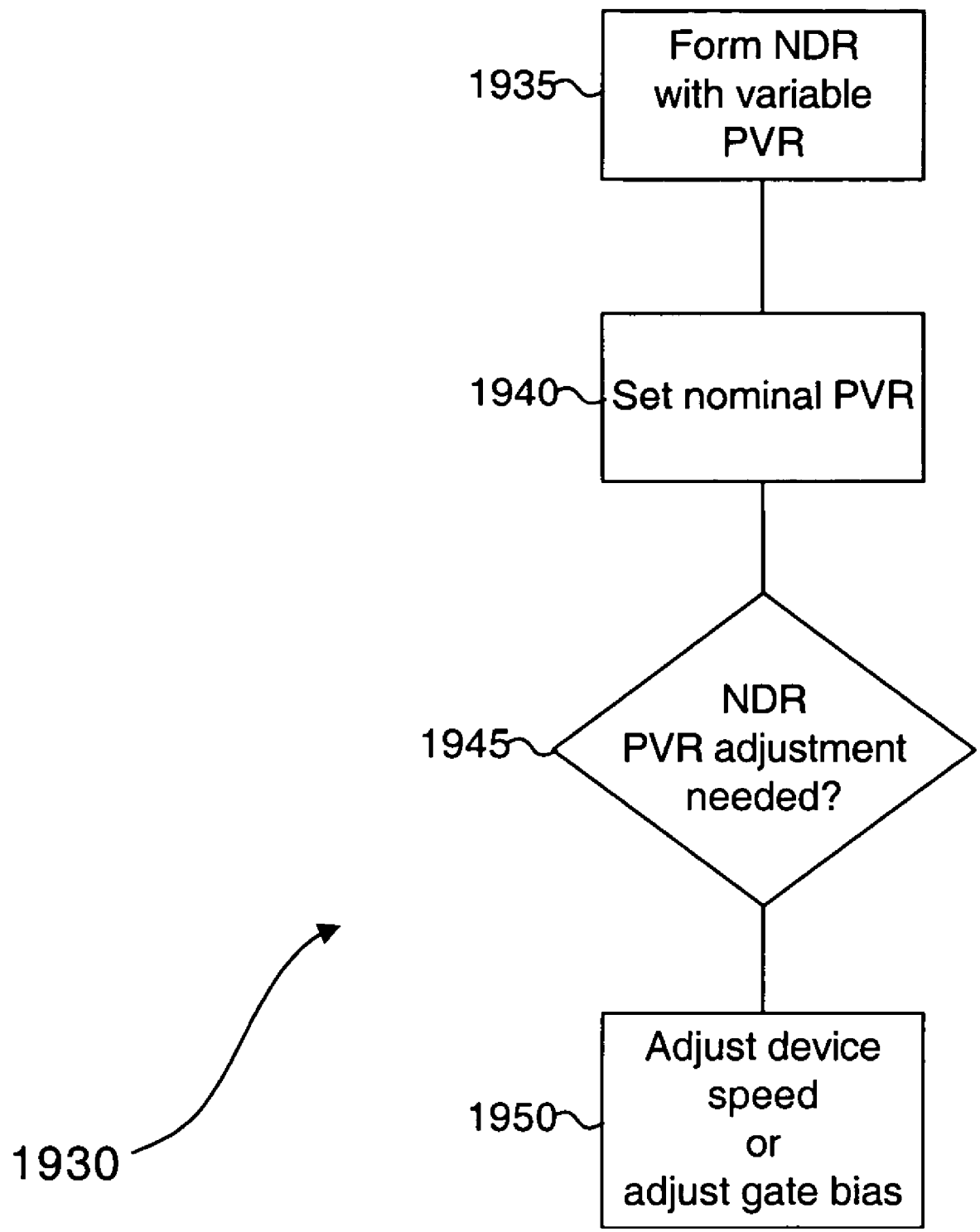
FIG. 19D depicts a PVR adjustment process that can be used in certain embodiments of the present invention.

An overall process flow 1930 for a dynamic PVR procedure is shown in FIG. 19D. An NDR (or some other trapping device) with variable PVR is formed within an integrated circuit at step 1935. A nominal PVR value is also set at a step 1940 (i.e., through one or more manufacturing operations as noted earlier). At a later time, such as during operation of the device in the field, a determination is made at step 1945 to see if a PVR adjustment is needed. Depending on the requirements of the particular application, a PVR value for one or more NDR circuits (logic and/or memory) are adjusted at step 1950, either by adjusting a switching speed, and/or gate bias modulation. While these are but examples, other techniques for achieving a dynamic PVR will be apparent to those skilled in the art.

Furthermore, while the inventive process is presented in the context of an NDR FET embodiment, it will be understood that the use of a dynamic PVR, or an adaptive NDR device, may be beneficially employed in a number of environments outside of such realms, including other NDR elements such as diodes, thyristors, etc. that may include a variable PVR behavior.

Varying PVR And $V_{NDR}$ Value NDR Circuits, Including On Common Substrates

Further embodiments of the present inventions are now described with reference to FIGS. 20A-20B. These embodiments build on the fact that the process for making NDR devices of the present invention is extremely flexible, and permits a wide variety of NDR devices with different behaviors.

Figure 20A:
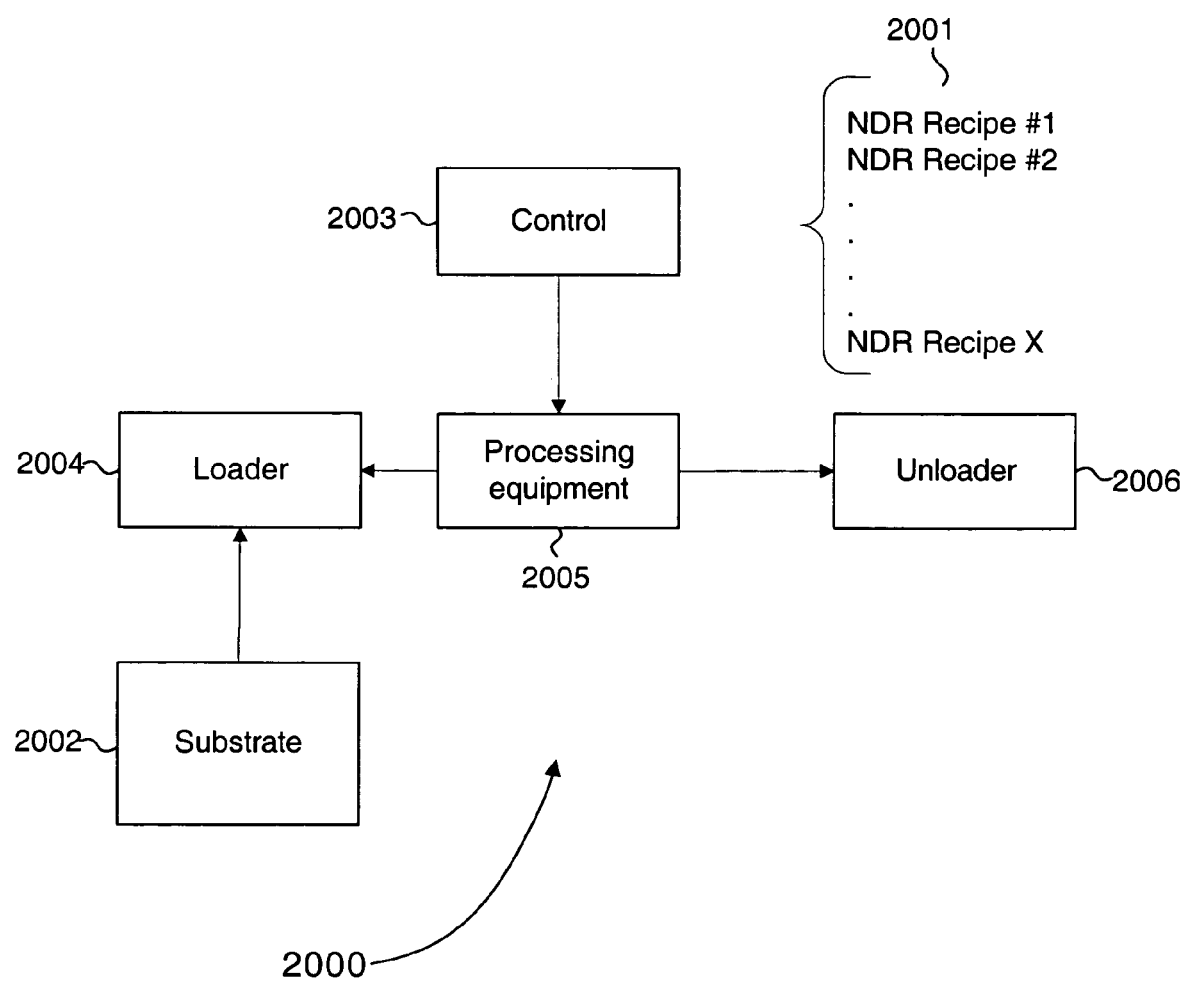
FIG. 20A is a simplified diagram of a semiconductor processing equipment facility adapted for performing multiple different NDR process recipes in a conventional fab.

In one of the simplest embodiments shown in FIG. 20A, a particular piece of semiconductor processing equipment 2000 (i.e., an implanter, a furnace, a thin film deposition reactor, etc.) within a manufacturing line ("fab") can be programmed in accordance with a predefined "recipe" 2001 to achieve a desired target setting for a particular NDR characteristic on a substrate (such as silicon wafer), including for example a PVR value. For example, for a first type of NDR device on a first type of substrate, an implanter can be programmed with an impurity type (Boron) at a predetermined energy and dosage (i.e., $2*10^{14}$ atoms/cm$^2$). For a second type of NDR device on a second type of substrate, the same implanter may be programmed with a higher dosage (i.e., $3*10^{14}$ atoms/cm$^2$).

The information specifying which implant is to be used is coded on a so-called "run card" which indicates to a fab operator which recipe is to be used for a particular wafer 2002, or batch of wafers typically. The operator then enters the code to a control module 2003, so a substrate 2002 passing from a loader 2004 has the particular recipe then performed on it by processing equipment 2005 before being sent to an unloader 2006. Similar programmings would be made for other equipment in a manufacturing facility, so that appropriate NDR characteristics would be effectuated automatically during manufacturing for different types of applications on different substrates/wafers/circuits.

For example, a deposition machine can be programmed to deposit two separate types of gate insulator materials in a sequence of steps, to form gate insulators for both NDR and non-NDR devices at the same time, or different thicknesses of gate insulators for different types of NDR devices. Thus, the manufacturing of a variety of NDR devices can be achieved in many cases in a seamless manner that integrates readily with preexisting equipment located in a conventional fab.

Figure 20B:
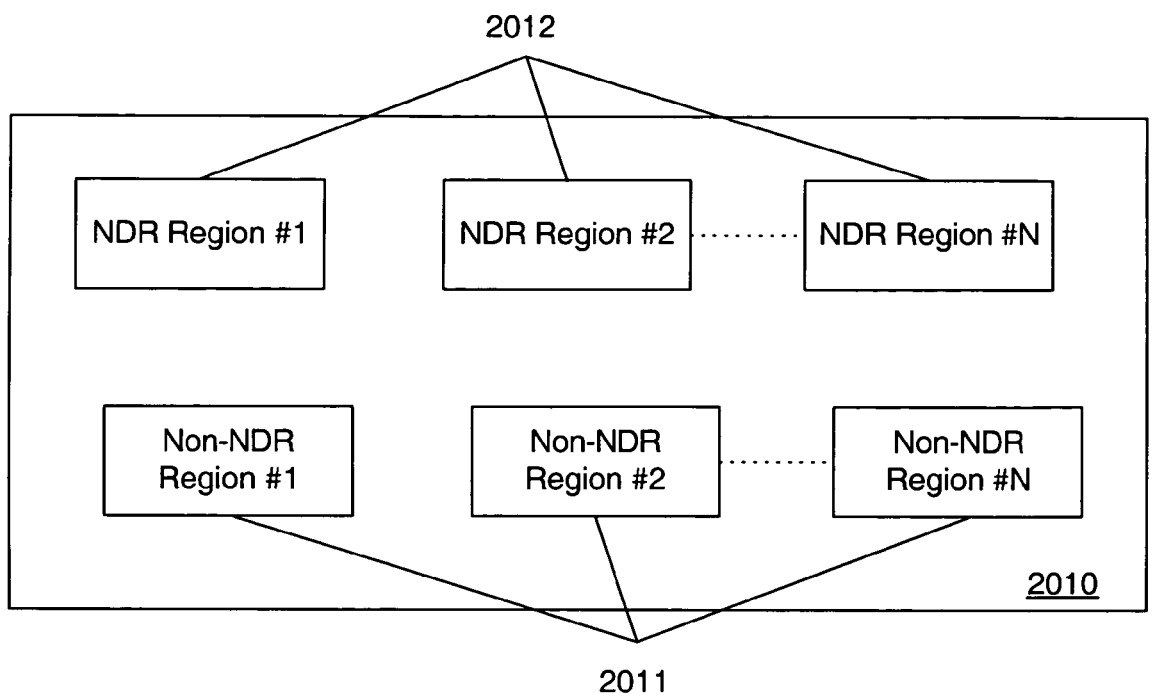
FIG. 20B is a simplified perspective of a n integrated circuit that includes different types of NDR elements in different regions of a substrate thereof.

In other instances it is likely that in some applications circuit designers will wish to incorporate different types of NDR devices having disparate characteristics within a single substrate 2010, as shown generally in FIG. 20B. This may be useful, for example in mixed environments, such as system on chip applications where a first type of NDR device is to be used in a memory circuit, while a second type of NDR device is to be used in a logic circuit. As noted earlier, for an NDR-based SRAM cell, a relatively high PVR value is critical for some low power embodiments. For an NDR based logic gate, however, a PVR value can be relatively low (i.e., on the order of 10). Hence, in those cases where it is desirable to make both NDR logic and NDR memory in a common substrate, it is possible in many instances again to share operational steps to improve throughput and integration, while still allowing for individual optimization of different kinds of NDR devices.

Alternatively, two different types of memory devices, or two different types of logic devices may employ different types of NDR characteristics. Traditional methods of making NDR devices do not allow for easy or adequate differentiation of NDR characteristics during a common manufacturing process. In some embodiments of the present invention, however, a single substrate 2010 can have multiple separate NDR regions 2012, designated as NDR Region #1, NDR Region #2, NDR Region #N, and multiple non-NDR regions 2011s designated as non-NDR Region #1, non-NDR Region #2, non-NDR Region #N.

One simple method for forming different NDR regions is by selective maskings, so that different regions are exposed to different processing conditions during manufacture of a wafer. Selective masking is a well-known technique in the semiconductor arts, and any number of known variations can be used with the present invention. For example, during a first implant operation, substrate 2010 could be masked so that only NDR Region #1 receives a particular first implant species, dosage and distribution. As noted earlier, the particular species, dosage and energy of an NDR implant for making traps can be used to define and set a target PVR and/or $V_{NDR}$ value for an NDR device. During a second implant operation, substrate 2010 is then masked so that only NDR Region #2 receives a particular second implant species, dosage and distribution. This is but one example, of course, and other variants will be apparent to those skilled in the art from the present teachings.

In another alternative, a gate length in a first NDR region may be different than a gate length in a second NDR region. Again, as noted earlier, since the invention scales with channel size, it is possible to achieve two different NDR characteristics by using two different gate lengths. Thus, in some instances, two different types of NDR devices can be manufactured with exactly the same process conditions, and simply by virtue of their different gate length they will have well-known, predictable PVR, $V_{NDR}$ values and behavior. Since different design rules (including channel length) are often employed between logic and memory, this again affords another method for achieving different NDR behavior for different kinds of circuits.

Furthermore, the clocking frequency, voltage supplies and/or power consumptions used in logic and memory are often different, and so NDR structures in such disparate regions would be different as well in many cases to accommodate the difference in these operating characteristics as well. For example, a $V_{NDR}$ of a memory cell might be set substantially higher than a $V_{NDR}$ of a logic gate in the same substrate, because the former may use a higher voltage supply. Other similar examples will be apparent to skilled artisans, and therefore the present invention is not limited to the present examples.

In another alternative, different gate thicknesses, or different gate materials could be used in the different NDR regions. As noted earlier, a PVR (and $V_{NDR}$) value can be set using such parameters as well, and it is a simple matter to tailor such features using conventional techniques for a silicon substrate. For instance, a gate insulator may be grown at a first thickness in all the NDR regions, and then an etching operation could remove it selectively in one or more regions to reduce a thickness in such regions. Alternatively the gate insulators could be grown differently from the start to a desired target thickness. The options for this are extensive and the invention is by no means limited to any particular variant.

In yet another instance, different trapping regions could be formed in two separate sequences to effectuate different NDR behaviors. Thus, two different implants could be used, followed by separate anneals, or even a common annealing operation to distribute the traps appropriately. The two different sets of traps could also be different impurities and/or implant species if it is desired to have multiple trap profiles, such as different trap energies to trap different types of charge carriers, or different trap types which trap/de-trap at different rates. In the case where different NDR devices are being made at the same time on a substrate, appropriate masking steps could be used to ensure that any additional subsequent trap formation operations are only performed for selected NDR devices.

It will be understood, of course, that FIG. 20B is a simplification, and that there may be mixed NDR types even within a single region, as can be accomplished quite easily with conventional masking techniques.

From the data presented above, it is abundantly clear that different types of NDR devices can be formed (and thus reside and operate) in a single substrate with significantly disparate capabilities (i.e., PVR values that differ by 10 or more) and yet using almost entirely common processing operations. In most instances, in fact, the differences in manufacturing are only slight, and involve only a few additional processing steps specific to each type. The latter can be used, of course, to separately optimize the behavior of two different types of NDR devices.

Furthermore, while the examples given are directed to varying NDR behavior by reference to a PVR value and/or a $V_{NDR}$ value, it is apparent that these techniques can easily extended to modify other characteristics of an NDR device. For instance, switching speeds of different NDR device can altered by distributing traps differently in a channel, or by using different gate insulators, different impurities, different channel lengths, etc. Temperature behavior can also be altered accordingly, so that some NDR devices exhibit a very constant PVR characteristic, while others exhibit a varied PVR characteristic. Thus, the temperature characteristics of a trapping/de-trapping operation could be exploited to detect and respond to specific temperatures, temperature variations, etc. Again, there are a myriad of options that can be tuned in this regard to differentiate NDR devices, and the invention is not limited to any particular characteristic.

Finally, it will be understood by those skilled in the art that the present invention could be applied to other silicon based NDR (and/or trapping devices), such as tunnel diodes, thyristors, etc., or combinations of such devices with NDR FETs as described herein. Again, by using primarily conventional MOS processing operations, the present invention can accommodate and allow for a wide variety of NDR types within a single substrate, which, as noted earlier, is not limited pure silicon, but could be SOI or SiC for example.

While the inventions have been described with reference to illustrative embodiments, this description is not intended to be construed in a limiting sense. It will be clearly understood by those skilled in the art that foregoing description is merely by way of example and is not a limitation on the scope of the invention, which may be utilized in many types of integrated circuits made with conventional processing technologies. Various modifications and combinations of the illustrative embodiments, as well as other embodiments of the invention, will be apparent to persons skilled in the art upon reference to the description. Such modifications and combinations, of course, may use other features that are already known in lieu of or in addition to what is disclosed herein. It is expected, given the unique characteristics of the inventive device and methods (which permit a variety of manifestations), and the rapid progress in the arts of this field, that additional embodiments utilizing different yet-to-be developed materials, structures and processes will most certainly be developed based on the present teachings.

It is therefore intended that the appended claims encompass any such modifications, improvements and future embodiments. While such claims have been formulated based on the particular embodiments described herein, it should be apparent the scope of the disclosure herein also applies to any novel and non-obvious feature (or combination thereof) disclosed explicitly or implicitly to one of skill in the art, regardless of whether such relates to the claims as provided below, and whether or not it solves and/or mitigates all of the same technical problems described above. Finally, the applicants further reserve the right to pursue new and/or additional claims directed to any such novel and non-obvious features during the prosecution of the present application (and/or any related applications).

What is claimed is:

1. A method of making a semiconductor circuit comprising the steps of:
   forming a silicon-based adaptive NDR device which can operate with a first current-voltage relationship during a first time period and a second current-voltage relationship during a second time period, wherein said first current-voltage relationship and said second current-voltage relationship are sufficiently different so as to permit said silicon based adaptive NDR device to have two distinct operational modes, including a first operational mode and a second operational mode respectively; and
   forming a control circuit for switching said silicon-based adaptive NDR device between said first operational mode and said second operational mode.

2. The method of claim 1, further including a step of forming a power regulator circuit which regulates power consumption of an integrated circuit in which said semiconductor circuit is formed, and coupling said control circuit to said power regulator circuit.

3. The method of claim 1, wherein a nominal peak-to-valley current ratio (PVR) is set in said silicon-based adaptive NDR device during a manufacturing procedure, and said nominal PVR can be adjusted by said control circuit.

4. The method of claim 1, further including a step of forming a second silicon-based NDR device in a common substrate with said silicon-based adaptive NDR device, such that said silicon-based adaptive NDR device has a first peak-to-valley current ratio (PVR) that is substantially different from a second PVR of said second silicon-based NDR device.

5. The method of claim 4, wherein said second silicon-based NDR device is also adaptive and operates with different current-voltage relationships in response to control signals from said control circuit.

6. A semiconductor circuit comprising:
   an adaptive silicon-based NDR device which is adapted to operate with a first current-voltage relationship during a first time period and a second current-voltage relationship during a second time period, wherein said first current-voltage relationship and said second current-voltage relationship NDR characteristic are sufficiently different so as to permit said adaptive silicon based NDR device to have two distinct operational modes, including a first operational mode and a second operational mode respectively; and
   a control circuit for switching said adaptive silicon-based NDR device between said first operational mode and said second operational mode.

7. The semiconductor circuit of claim 6, wherein said control circuit controls a peak-to-valley current ratio (PVR) of said adaptive silicon-based NDR device.

8. The semiconductor circuit of claim 6, wherein said adaptive silicon-based NDR device is configured as part of a memory cell.

9. The semiconductor circuit of claim 6, wherein said adaptive silicon-based NDR device is configured as part of a logic gate.

10. The semiconductor circuit of claim 6, further including a second control circuit, and wherein said control circuit controls a peak-to-valley current ratio (PVR) of a plurality of a first type of said adaptive silicon-based NDR device used in a memory circuit, and said second control circuit controls a peak-to-valley current ratio (PVR) of a plurality of a second type of said adaptive silicon-based NDR device used in a logic circuit.

11. In a silicon-based negative differential resistance (NDR) device, the improvement comprising:

the NDR device being configured to be self-adaptive such that a valley current decreases during a first time period to cause a corresponding increase in a peak-to-valley current ratio (PVR) during said first time period, wherein an external control signal is not required to modify said PVR for the NDR device, and wherein said PVR for the device is adjusted by controlling a switching speed for the device, such that a slower switching speed can be used to increase said PVR for the device.

12. In a silicon-based negative differential resistance (NDR) device, the improvement comprising:

the NDR device being configured to be self-adaptive such that a valley current decreases during a first time period to cause a corresponding increase in a peak-to-valley current ratio (PVR) during said first time period;

wherein an external control signal is not required to modify said PVR for the NDR device, and wherein said PVR for the device exceeds ten (10) during at least part of said first time period.

* * * * *